(12) United States Patent
Iwata

(10) Patent No.: US 6,727,831 B2
(45) Date of Patent: Apr. 27, 2004

(54) SEMICONDUCTOR INTEGRATED CIRCUIT DEVICE AND DATA TRANSMISSION SYSTEM

(75) Inventor: Yoshihisa Iwata, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/377,821

(22) Filed: Mar. 4, 2003

(65) Prior Publication Data

US 2003/0174075 A1 Sep. 18, 2003

Related U.S. Application Data

(62) Division of application No. 09/662,654, filed on Sep. 14, 2000, now Pat. No. 6,567,023.

(30) Foreign Application Priority Data

Sep. 17, 1999 (JP) .......................... 11-263668

(51) Int. Cl.[7] .................. H03M 1/00; H03K 19/00
(52) U.S. Cl. ........................ 341/126; 326/93
(58) Field of Search .................. 341/126; 365/200, 365/222, 45; 326/93, 30, 126; 710/11; 327/219; 398/137

(56) References Cited

U.S. PATENT DOCUMENTS

| | | | |
|---|---|---|---|
| 4,005,315 A | | 1/1977 | Blauschild |
| 4,319,227 A | | 3/1982 | Malinowski et al. |
| 4,378,595 A | * | 3/1983 | Current .................... 365/45 |
| 4,737,663 A | * | 4/1988 | Varadarajan ............... 326/126 |
| 4,972,106 A | | 11/1990 | Ruijs |
| 5,214,344 A | | 5/1993 | Kogelschatz |
| 5,463,341 A | * | 10/1995 | Karasawa .................... 327/219 |
| 5,479,170 A | | 12/1995 | Cauwenberghs et al. |
| 5,621,580 A | | 4/1997 | Cruz et al. |
| 5,714,892 A | | 2/1998 | Bowers et al. |
| 5,811,984 A | * | 9/1998 | Long et al. ................... 326/30 |
| 5,831,922 A | * | 11/1998 | Choi ........................ 365/222 |
| 5,859,809 A | * | 1/1999 | Kim ......................... 365/222 |
| 6,025,945 A | * | 2/2000 | Nyu et al. .................. 398/137 |
| 6,154,157 A | | 11/2000 | Wong |
| 6,285,582 B1 | | 9/2001 | Lin |
| 6,567,023 B1 | * | 5/2003 | Iwata ........................ 341/126 |

FOREIGN PATENT DOCUMENTS

| | | |
|---|---|---|
| EP | 0517929 A1 | 12/1992 |
| JP | 10-241633 | 9/1998 |

OTHER PUBLICATIONS

"Analysis and Design of Analog Integrated Circuits", (2nd Ed.) P.R. Grey and R.G. Meyer, published by John Wiley & Sons, Inc. 1990 (partial translation).

(List continued on next page.)

*Primary Examiner*—Patrick Wamsley
(74) *Attorney, Agent, or Firm*—Banner & Witcoff, Ltd.

(57) ABSTRACT

A data transmission system is provided including a clock source, semiconductor integrated circuit devices, a controller configured to control the semiconductor integrated circuit devices, and a clock signal pass connected to the clock source, the controller and the semiconductor integrated circuit devices. The data transmission system may include a daisy chain data pass connected to the controller and the semiconductor integrated circuit devices, and a two-way data strobe signal pass connected to the controller and the semiconductor integrated circuit devices. The clock source, the semiconductor integrated circuit devices and the controller transmit and receive therebetween a clock signal via the clock signal pass. The semiconductor integrated circuit devices and the controller transmit and receive therebetween multi-valued current data via the daisy chain data pass, and a data strobe signal in the form of a binary voltage signal via the two-way data strobe signal pass.

15 Claims, 51 Drawing Sheets

OTHER PUBLICATIONS

"A 0.4–*– m CMOS 10–GB/s 4–PAM Pre–emphasis Serial Link Transmitter", Ramin Farjad–Rad, Chih–Kohn Ken Yang, Mark A. Horowitz, and Thomas H. Lee, IEEE Journal of Solid–State Circuits, vol. 34, No. 5, May 1999, pp. 58–584.

"Direct Rambus Technology: The Nw MainMemory Standard", Richard Crisp, IEEE Micro, Nov./Dec. 1997, pp. 18–27.

"Signaling In High–Performance Memory Systems", John Poulton, ISSCC 1999, pp. 1–59.

A 1–Gb/s Bidirectional I/O Buffer Using the Current–Mode Scheme, Jae–Yoon Sim, Young–Soo Sohn, Seung–Chan Heo, Hong–June Park, and So–In, IEEE Journal of Solid–State Circuits, vol. 34, No. 4, Apr. 1999, pp. 529–535.

J. Zhang et al., "Low Power Current Mode Multi–valued Logic Interconnect for High Speed Interchip Communications," GaAs IC Symposium, IEEE 1995, pp. 327–330.

S. Long et al., "Low Power GaAs Current–Mode 1.2 Gb/s Interchip Interconnections," IEEE J. Solid–State Circuits, vol. 32, No. 6. Jun. 1997, pp. 890–897.

M. Kameyama et al., "A Multiplier Chip with Multiple–Valued Bidirectional Current–Mode Logic Circuits," IEEE Computer, Apr. 1988, pp. 43–56.

* cited by examiner

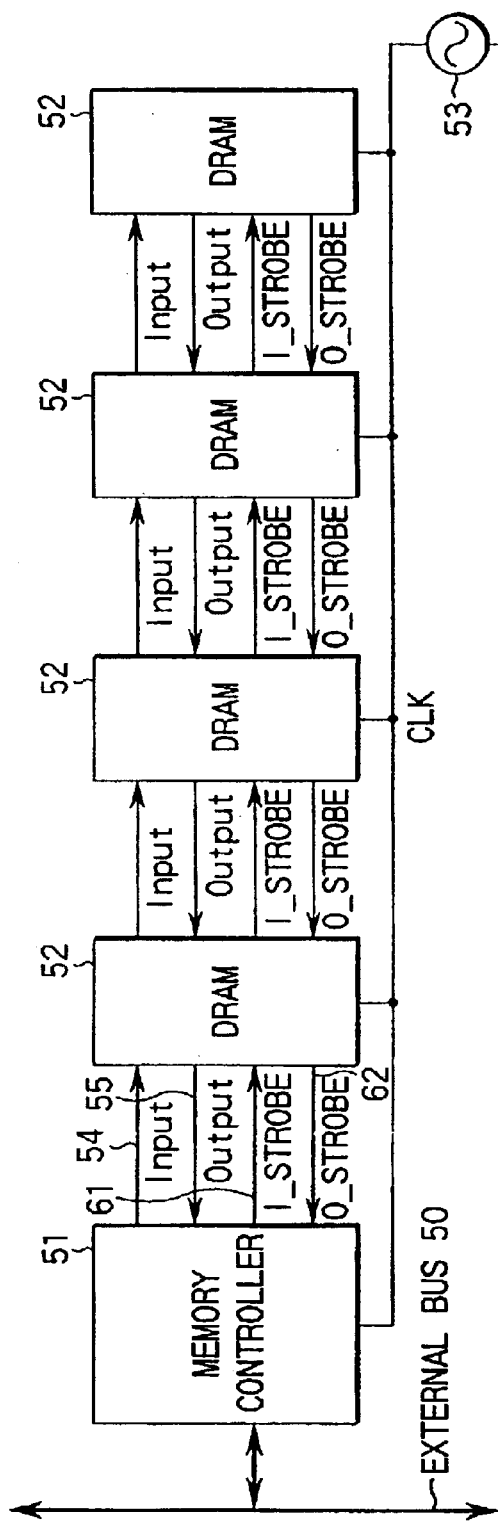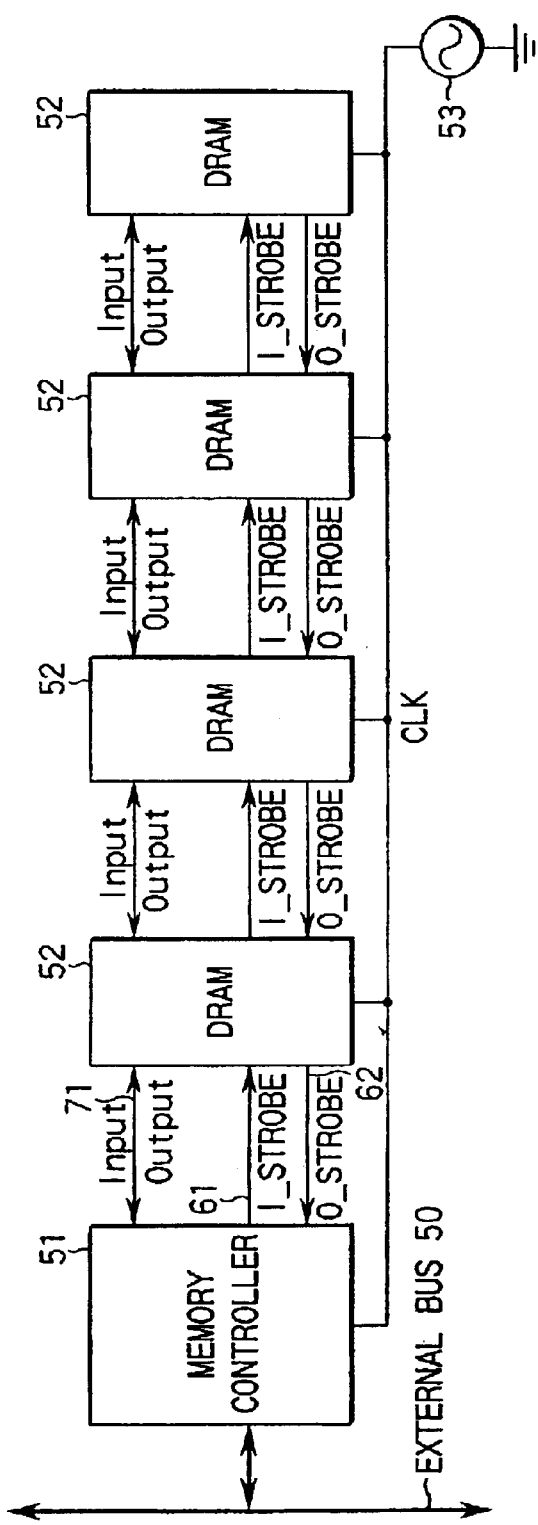
FIG. 7
FIG. 8

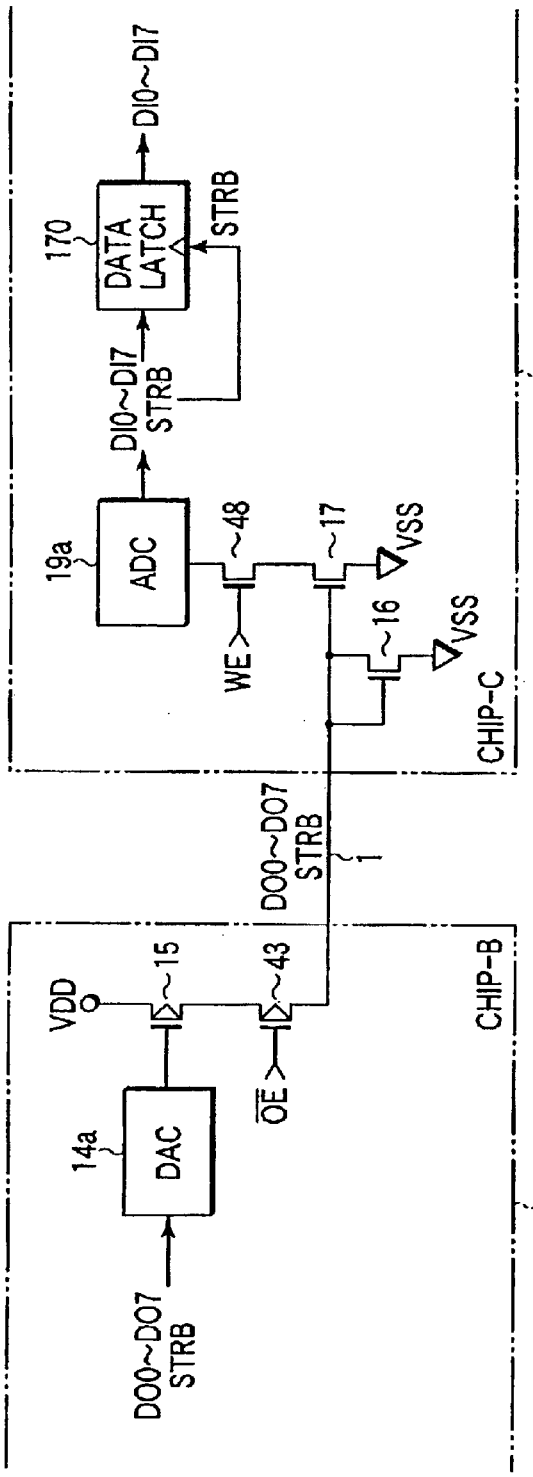
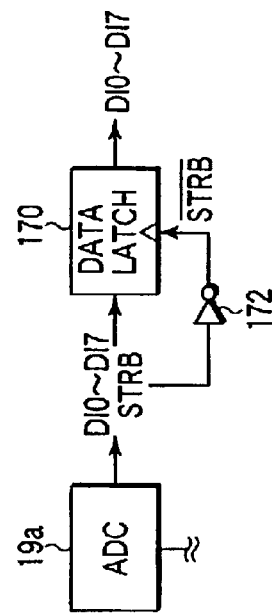
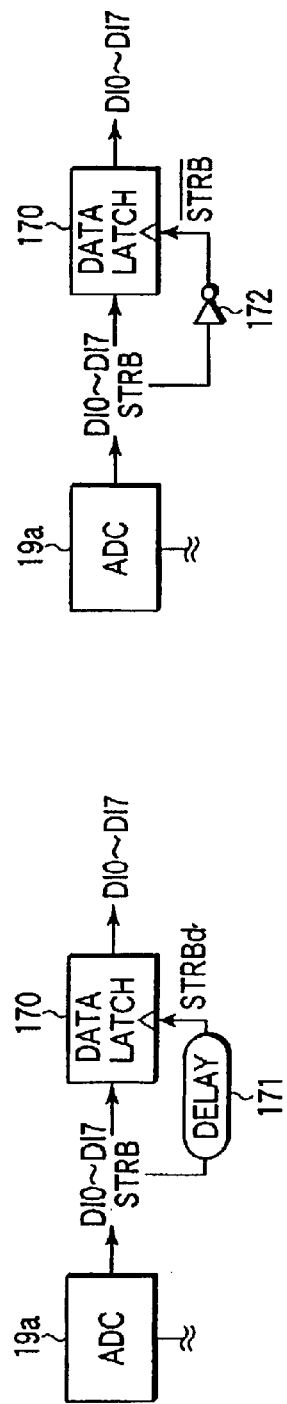
F I G. 19A
F I G. 19C
F I G. 19B

SEMICONDUCTOR INTEGRATED CIRCUIT DEVICE AND DATA TRANSMISSION SYSTEM

CROSS-REFERENCE TO RELATED APPLICATIONS

This application is a divisional of prior U.S. patent application Ser. No. 09/662,654, filed Sep. 14, 2000, now U.S. Pat. No. 6,567,023 which is based upon and claims the benefit of priority from the prior Japanese Patent Application No. 11-263668, filed Sep. 17, 1999, the entire contents of which are incorporated herein by reference.

BACKGROUND OF THE INVENTION

The present invention relates to a semiconductor integrated circuit device and a data/signal transmission system, and in particular to a device and a system where data or signals which are transmitted/received among a plurality of semiconductor integrated circuits are handled as current amounts, and which are used, for example, in a transmission system connected with a semiconductor memory and a controller therefor.

A conventional transmission system which connects a plurality of LSIs handles voltage potentials as data. For example, a conventional transmission system which is connected with a semiconductor memory and a controller therefor is configured as shown in FIG. 56 or FIG. 57.

The conventional data transmission system generally illustrated in FIG. 56 comprises a plurality of synchronous dynamic memories (SDRAM) 421 arranged in a two-dimensional array, and a common memory controller 420. The illustrated data transmission system also comprises a clock/address bus 422 which connects the common memory controller 420 to each of the SDRAMs 421 for supplying a clock signal Clock and an address signal Address from the memory controller 420 to the SDRAM 421; a data bus 423 which connects the memory controller 420 to the respective rows of the SDRAMS 421 for transmitting data DATA to corresponding SDRAMS in the respective rows; and a control signal bus 424 which connects the common memory controller 420 to the respective columns of the SDRAMs 421 for supplying corresponding DRAMs 421 in the respective columns with control signals (RAS#1, CAS#1, WE#1, CS#1)–(RAS#4, CAS#4, WE#4, CS#).

A memory module comprised of the plurality of SDRAMs 421 arranged in a two-dimensional array on a printed circuit board can save the bus width of data and accordingly transmit a large amount of data on a relatively low speed bus.

However, the data transmission system illustrated in FIG. 56 has a problem of a large number of wires required for the bus, and a problem of reflection noise being readily introduced into the bus due to the unterminated bus leading to the inability of accomplishing faster data reading. In addition, since the control signal bus, the address bus and the data bus are inconsistent in load, the timing of setup/hold time varies among respective signals in each SDRAM depending on the distance from the memory control to each SDRAM.

Since this results in failure in reducing a timing margin in each SDRAM, each SDRAM cannot operate at a higher rate. Therefore, an attempt of increasing the data transfer rate must rely on an increase in bus width, causing difficulties in the layout of the memory module and in ensuring the consistency in load among respective signals.

A conventional data transmission system illustrated in FIG. 57, on the other hand, interconnects a plurality of Rambus type DRAMs (RDRAMs) 331 through a Rambus channel (proposed by Rambus Co.) which is a one-dimensional data transmission path, and connects a memory controller 330 between the Rambus channel and an external bus, such that a reference potential Vref and a synchronization clock CTM from a clock signal source 332 are supplied to the respective DRAMs 331 through the Rambus channel. Incidentally, the above Rambus channel is terminated through a terminal resistance 333 so as not to generate reflection noises, and loads of respective buses are made uniform in order to suppress occurrence of a skew between transmission signals of a bus.

A memory module comprised of the plurality of DRAM 331 arranged in a one-dimensional array on a printed circuit board as mentioned can simplify the bus configuration, and provides a faster synchronization clock to transmit/receive a large amount of data.

The data transmission system illustrated in FIG. 57, however, speeds up the transmission/reception of data at the sacrifice of an increase in the bus width, so that the data transmission system requires tight specifications for the skew between the buses in the overall memory module and limited jitter for a clock driver. To meet the requirements, it is necessary to precisely control the resistance, inductance, and inter-wire mutual inductance of wires on the printed circuit board of the memory module, resulting in a higher cost.

In addition, the miniaturization of elements in LSI inevitably requires a lower power supply voltage for outputting (ex. FIG. 56) and a lower terminal voltage VTERM of the bus (ex. FIG. 57) in consideration of the breakdown of transistors within LSIs in a memory module. This results in a reduced voltage amplitude of the data, causing a higher susceptibility to erroneous reading of data.

As described above, the conventional data transmission system which handles a large amount of data with a relatively low speed bus suffers from a large number of bus wires and the inability of speeding up the data read.

On the other hand, the conventional data transmission system which simplifies the bus configuration and speeds up the synchronization clock to transmit/receive a large amount of data requires tight specifications for the skew between the buses in the overall memory module and limited jitter for a clock driver, and accordingly entails a higher cost for meeting the requirements. The susceptibility to erroneously read data due to a reduced amplitude of the data can occur because of lowering the power supply voltage for output (ex. FIG. 56) and the terminal voltage (ex. FIG. 57) in consideration of the breakdown of transistors within LSIs in a memory module.

BRIEF SUMMARY OF THE INVENTION

The present invention has been made to solve the problems mentioned above, and it is an object of the present invention to provide a data transmission system which is capable of avoiding the problem which may arise when a voltage potential is handled as transmission data by handling current amounts as transmission data, and a semiconductor integrated circuit device which is adapted to this data transmission system.

It is another object of the present invention to provide a semiconductor integrated circuit device which is capable of transmitting multi-value data without entailing an increase in transmission data width by representing current data in multi-value form, providing a wider voltage noise margin, readily accommodating a reduction in a power supply voltage and an amplitude voltage on an external signal line resulting from the miniaturization of LSI devices, and transmitting/receiving a large amount of data even when a low speed synchronization clock is transmitted, and a data transmission system using the semiconductor integrated circuit device.

According to an aspect of the present invention, a data transmission system is provided including a clock source, a plurality of semiconductor integrated circuit devices, a controller configured to control the plurality of semiconductor integrated circuit devices, and a clock signal pass connected to the clock source, the controller and the plurality of semiconductor integrated circuit devices.

In one further aspect, the data transmission system may further include a daisy chain data pass connected to the controller and the plurality of semiconductor integrated circuit devices, and a two-way data strobe signal pass connected to the controller and the plurality of semiconductor integrated circuit devices. According to this aspect, the clock source, the plurality of semiconductor integrated circuit devices and the controller transmit and receive therebetween a clock signal via the clock signal pass, the plurality of semiconductor integrated circuit devices and the controller transmit and receive therebetween multi-valued current data via the daisy chain data pass, and the plurality of semiconductor integrated circuit devices and the controller transmit and receive therebetween a data strobe signal in the form of a binary voltage signal via the two-way data strobe signal pass.

In another further aspect, the data transmission system may further include a daisy chain data pass connected to the controller and the plurality of semiconductor integrated circuit devices, and a daisy chain data strobe signal pass connected to the controller and the plurality of semiconductor integrated circuit devices. According to this aspect, the clock source, the plurality of semiconductor integrated circuit devices and the controller transmit and receive therebetween a clock signal via the clock signal pass, the plurality of semiconductor integrated circuit devices and the controller transmit and receive therebetween multi-valued current data via the daisy chain data pass, and the plurality of semiconductor integrated circuit devices and the controller transmit and receive therebetween a data strobe signal in the form of a binary voltage signal via the data strobe signal pass.

In still another further aspect, the data transmission system may further include a two-way data pass connected to the controller and the plurality of semiconductor integrated circuit devices, and a daisy chain data strobe signal pass connected to the controller and the plurality of semiconductor integrated circuit devices. According to this aspect, the clock source, the plurality of semiconductor integrated circuit devices and the controller transmit and receive therebetween a clock signal via the clock signal pass, the plurality of semiconductor integrated circuit devices and the controller transmit and receive therebetween multi-valued current data via the two-way data pass, and the plurality of semiconductor integrated circuit devices and the controller transmit and receive therebetween a data strobe signal in the form of a binary voltage signal via the data strobe signal pass.

Also, a data transmission system according to the present invention comprises a plurality of semiconductor integrated circuit devices, and a controlling semiconductor integrated circuit device for controlling the plurality of semiconductor integrated circuit devices, wherein the plurality of semiconductor integrated circuit devices and the controlling semiconductor integrated circuit device transmit data therebetween in the form of multi-valued current data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a block diagram illustrating a data transmission system according to a sixth embodiment of the present invention;

FIG. 8 is a block diagram illustrating a data transmission system according to a seventh embodiment of the present invention;

FIG. 19A is a circuit diagram schematically illustrating a transmission path of a strobe signal current in a transmission system of a daisy chain according to a twelfth embodiment;

FIG. 19B is a circuit diagram illustrating a modified embodiment of the transmission path shown in FIG. 19A;

FIG. 19C is a circuit diagram illustrating another modified embodiment of the transmission path shown in FIG. 19A).

DETAILED DESCRIPTION OF THE INVENTION

To begin with, the present invention will be outlined.

A data transmission system according to the present invention and a LSI suitable therefor are characterized in that transmission of data or signals is performed between semiconductor integrated circuit devices by current data or signals which are represented in multiple-value form. In a case that current transmission of data is performed, it is desired that one-to-one correspondence is formed between the transmission side and the reception side. Accordingly, when a large amount of data/signals is transmitted/received in a simple manner, the number of data lines/signal lines must be increased.

To avoid the increased bus width, data (current) is represented in multiple-value form, taking advantage of the fact that the current has an additive nature. The multi-value representation of current provides a wider noise margin as compared with a multi-value representation of voltage. Also, the multi-value representation of data (current) enables transmission/reception of a large amount of data even with a transmission means driven by a low speed synchronization clock.

In the following, various embodiments of the present invention will be described with reference to the accompanying drawings.

<First Embodiment>

Figure 1:
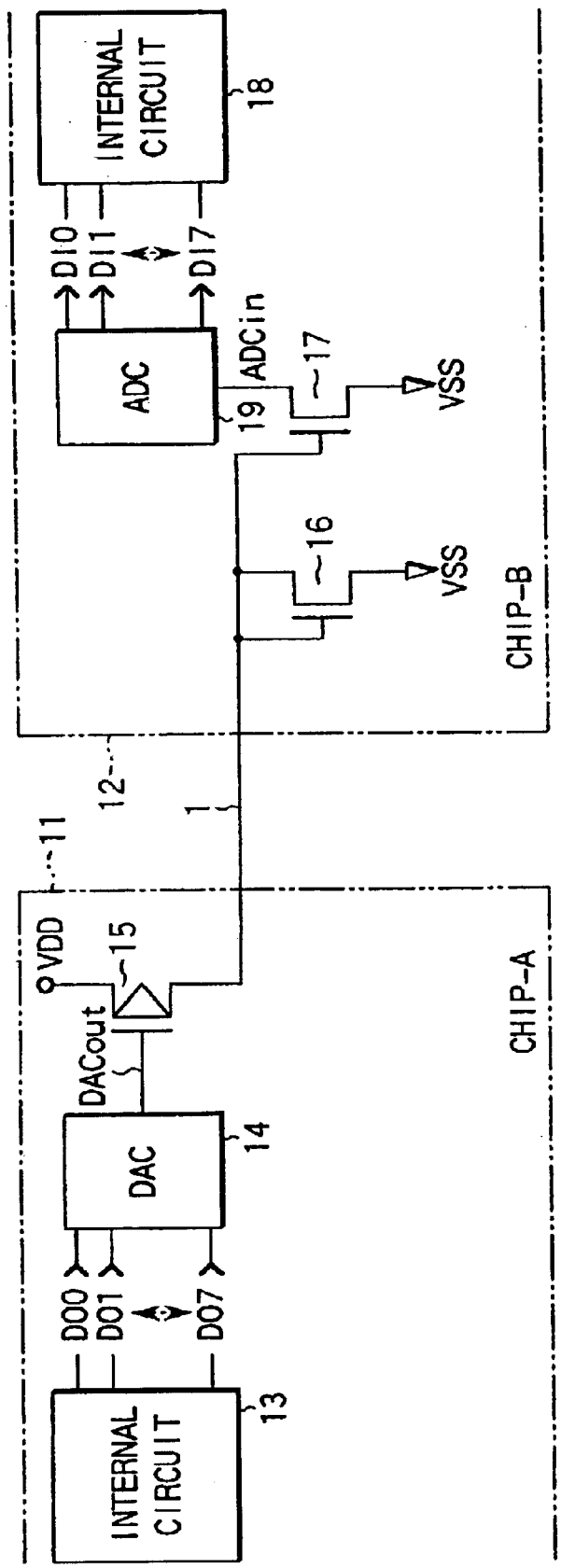
FIG. 1 is a block diagram illustrating a portion of LSIs according to a first embodiment.

FIG. 1 is a block diagram illustrating a portion of LSIs according to a first embodiment. Specifically, FIG. 1 schematically illustrates the configuration of system in which a data output circuit portion of a first LSI (CHIP-A) 11 outputs a current, and a data input circuit portion of a second LSI (CHIP-B) 12 receives the current.

That is, the data output circuit portion of the first LSI 11 comprises a digital-to-analog converter (DAC) 14 for converting binary voltage data output from an internal circuit 13 to multi-value data; and an output buffer PMOS transistor 15 for outputting an output DACout of the DAC 14 to an external data line 1 as a multi-value current.

The data input circuit portion of the second LSI 12 which receives the multi-value current from the external data line 1 comprises an input buffer NMOS transistor 16 for receiving the incoming current from the external data line 1; an NMOS transistor 17 connected to the transistor 16 in current mirror configuration; and an analog-to-digital converter (ADC) 19 for converting a current ADCin flowing into the transistor 17 to binary voltage data and supplying the converted binary voltage data to an internal circuit 18.

According to the configuration described above, the first LSI 11 can output multi-valued current data converted from binary voltage data to the external data line 1, while the second LSI 12 can convert the multi-valued current data incoming from the external data line 1 to binary voltage data and fetch the thus converted binary voltage data. It is therefore possible to realize a data transmission system which is capable of transmitting the multi-valued current data between a plurality of LSIs through the external data line 1.

<Second Embodiment>

Figure 2:
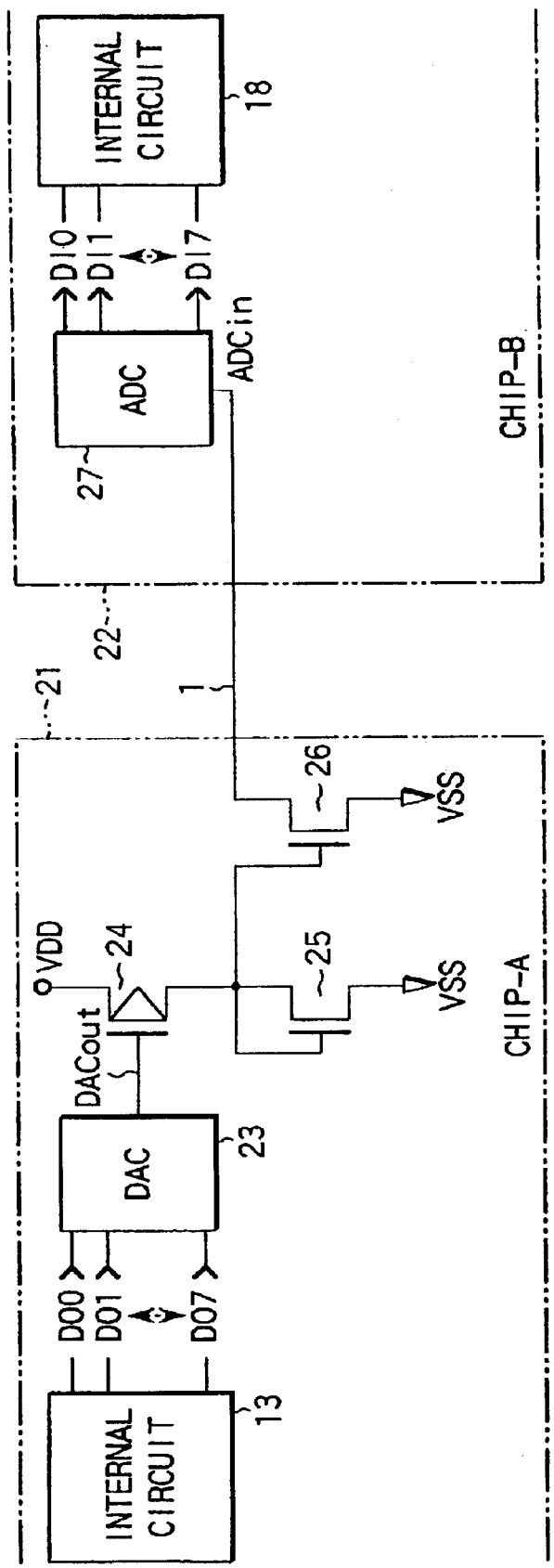
FIG. 2 is a block diagram illustrating a portion of LSIs according to a second embodiment.

FIG. 2 is a block diagram illustrating a portion of LSIs according to a second embodiment. FIG. 2 schematically illustrates the configuration of system in which a data output circuit portion of a first LSI (CHIP-A) 21 receives a current, and a data input circuit portion of a second LSI (CHIP-B) 22 outputs a current.

In particular, the data output circuit portion of the first LSI 21 comprises a DAC 23 for converting binary voltage data output from an internal circuit 13 to multi-value data; and a PMOS transistor 24 for converting the output of the DAC 23 to a multi-value current; an NMOS transistor 25 for receiving the multi-value current from the transistor 24; and an output buffer NMOS transistor 26 connected to the transistor 25 in current mirror configuration for sinking the multi-value current data from an external data line 1.

The data input circuit portion of the second LSI 22 is provided with an ADC 27 connected to the external data line 1 for discharging multi-value current data, converting the multi-value current data to binary voltage data according to the multi-value current data and supplying the binary voltage data to the internal circuit 18.

According to the configuration described above, similarly to the aforementioned first embodiment, the first LSI 21 can output multi-valued current data converted from binary voltage data to the external data line 1, while the second LSI 22 can convert the multi-valued current data incoming from the external data line 1 to binary voltage data and fetch the thus converted binary voltage data. It is therefore possible to realize a data transmission system which is capable of transmitting the multi-valued current data between a plurality of LSIs through the external data line 1.

<Third Embodiment>

Figure 3:
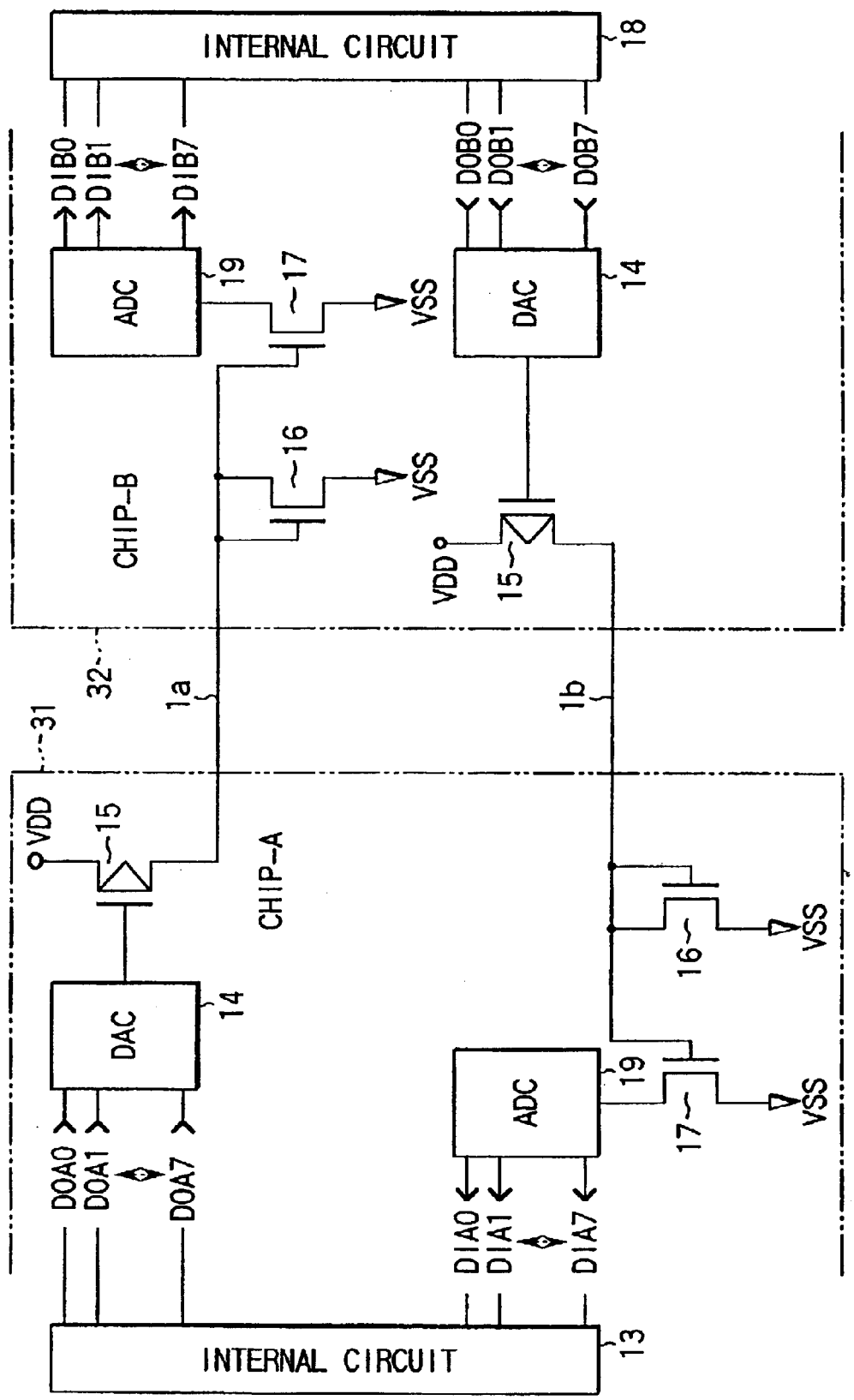
FIG. 3 is a block diagram illustrating a portion of LSIs according to a third embodiment.

FIG. 3 illustrates a portion of LSIs according to a third embodiment. FIG. 3 illustrates the configuration of a system in which a first LSI (CHIP-A) 31 and a second LSI (CHIP-B) 32 each have a double configuration comprised of a data input circuit portion and a data output circuit portion, and are interconnected through two uni-directional external data lines 1a, 1b on which data is transmitted in a single direction.

In each LSI 31, 32, a node at which the data input circuit is connected to the external data line is separated from a node at which the data output circuit is connected to the external data line.

In particular, the data output circuit portion of the first LSI 31 comprises a DAC 14 for converting binary voltage value output from an internal circuit 13 to multi-value data; and an output buffer transistor 15 for converting the output of the DAC 14 to a multi-value current and outputting the converted multi-value current to the external data line 1a, similarly to the data output circuit portion of the first LSI 11 in FIG. 1.

The data input circuit portion of the first LSI 31 in turn comprises input buffer transistors 16, 17 connected to the external data line 1b so that a current corresponding to a multi-value current input flows therethrough, similarly to the data input circuit portion of the second LSI 12 in FIG. 1; and an ADC 19 for converting the multi-value current to binary voltage data and supplying the converted binary voltage data to the internal circuit 13.

On the other hand, the data input circuit portion of the second LSI 32 comprises input buffer transistors 16, 17 connected to the external data line 1a so that a current corresponding to a multi-value current input flows therethrough, similarly to the data input circuit portion of the second LSI 31; and an ADC 19 for converting the multi-value current to binary voltage data and supplying the converted binary voltage data to an internal circuit 18.

The data output circuit portion of the second LSI 32 comprises a DAC 14 for converting binary voltage data output from the internal circuit 18 to multi-value data; and an output buffer transistor 15 for converting the output of the DAC 14 to a multi-value current and outputting the converted multi-value current to the external data line 1b, similarly to the data output circuit portion of the first LSI 31.

According to the configuration described above, it is possible to realize a data transmission system which can bidirectionally transmit multi-valued current data by separately using the two external data lines 1a, 1b between a plurality of LSIs.

<Fourth Embodiment>

Figure 4:
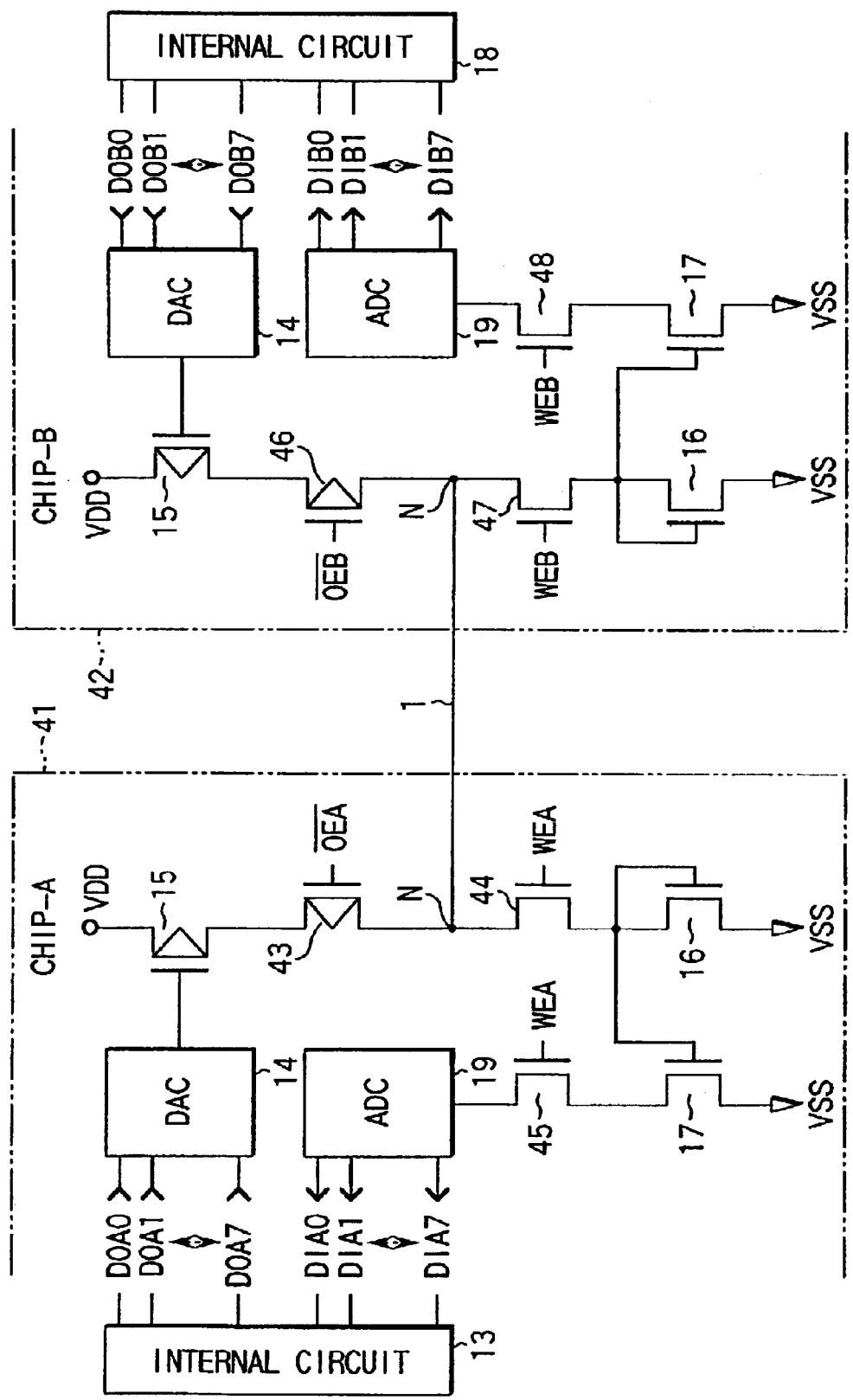
FIG. 4 is a block diagram illustrating a portion of LSIs according to a fourth embodiment.

FIG. 4 is a block diagram illustrating a portion of LSIs according to a fourth embodiment. FIG. 4 illustrates the configuration of a system in which a first LSI (CHIP-A) 41 and a second LSI (CHIP-B) 42 each have a double configuration comprised of a data input circuit portion and a data output circuit portion, and are interconnected through a bidirectional external data line 1 on which data is bidirectionally transmitted.

Here, the data input circuit portion and the data output circuit portion of the first LSI 41 are controlled to be active/inactive by an input enable signal WEA and an inverted version of an output enable signal/OEA, respectively. The data input circuit portion and the data output circuit portion of the second LSI 42 are controlled to be active/inactive by an input enable signal WEB and an inverted version of an output enable signal/OEB, respectively.

Then, in each of the LSIs 41, 42, the data input circuit and the data output circuit are connected in common to an external data line connecting node N through associated input switching transistors 44, 47 and output switching transistors 43, 46, respectively.

More specifically, the data output circuit portion of the first LSI 41, which has a similar configuration to the data output circuit portion of the first LSI 31 in FIG. 3, is connected to the external data line 1 through the output switching PMOS transistor 43 which is controlled to be active/inactive by the inverted version of the output enable signal/OEA.

The data input circuit portion of the first LSI 41, which has a similar configuration to the data input circuit portion of the first LSI 31 in FIG. 3, is connected to the external data line 1 through the input switching NMOS transistor 44 which is controlled to be active/inactive by the input enable signal WEA. A switching NMOS transistor 45 is additionally inserted between the transistor 17 and the APC 19, and is controlled to be active/inactive by the input enable signal WEA.

Although the data output circuit portion of the second LSI 42 has a similar configuration to the data output circuit portion of the first LSI 41, the output switching PMOS transistor 46 connected to the external data line 1 is controlled to be active/inactive by the inverted version of the output enable signal/OEB.

Also, although the data input circuit portion of the second LSI 42 has a similar configuration to the data input circuit portion of the first LSI 41, the input switching NMOS transistor 47 connected to the external data line 1 is controlled to be active/inactive by the input enable signal WEB. The input switching NMOS transistor 48 inserted between the transistor 17 and the ADC 19 is also controlled to be active/inactive by the input enable signal WEB.

It should be noted that each of the LSIs 41, 42 is configured to receive a control signal and an address signal from an LSI (not shown) on the controller side by a circuit as illustrated in FIG. 1, and decode the received signals to generate the control signals (WEA,/OEA), (WEB,/OEB).

According to the configuration described above, it is possible to realize a data transmission system which can bidirectionally transmit multi-valued current data between a plurality of LSIs using the single external data line 1 in common.

<Fifth Embodiment>

Figure 5:
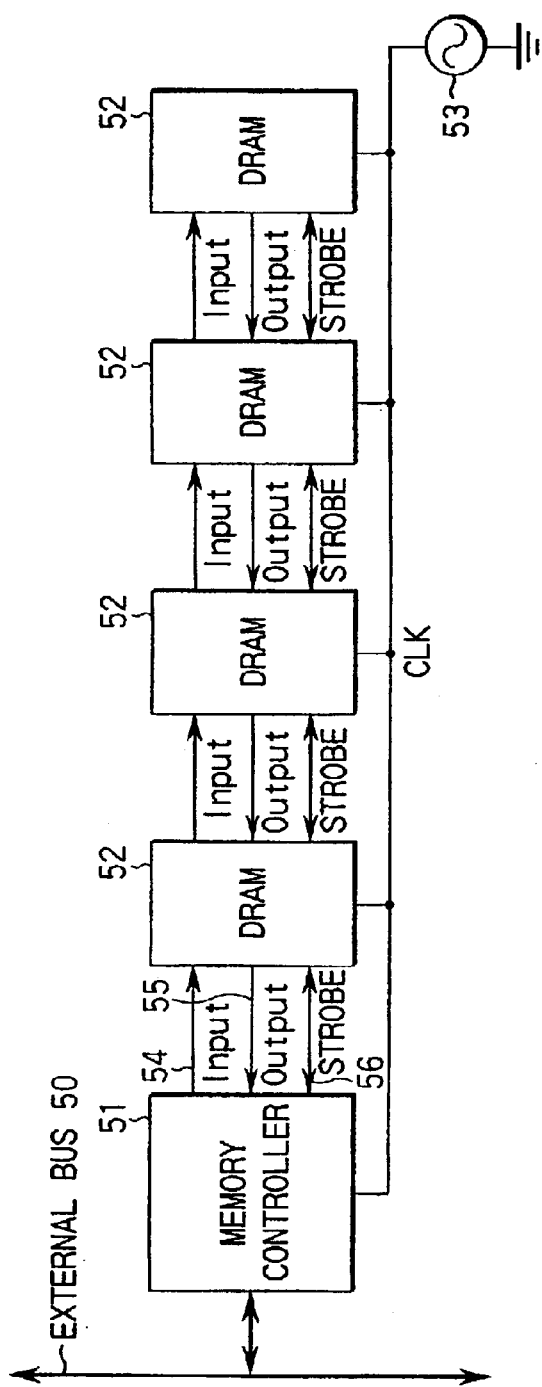
FIG. 5 is a block diagram illustrating a data transmission system according to a fifth embodiment of the present invention.

FIG. 5 is a block diagram illustrating a data transmission system according to a fifth embodiment.

FIG. 5 illustrates the configuration of a system in which a plurality of DRAMs 52 are daisy chain connected to a single memory controller 51 which in turn is connected to an external bus 50.

The daisy chain connection employs a Source Synchronous Strobe scheme. Specifically, a basic clock CLK and a strobe signal STROBE for use in data transmission/reception (output to the reception side in response to transmission of data from the transmission side) are used as clock signals. In the fifth embodiment, a clock signal source 53 supplies the basic clock signal CLK to the controller 51 and the DRAMs 52.

As illustrated, the data transmission system of the fifth embodiment uses two uni-directional data lines (an input data line 54 and an output data line 55) on which data is transmitted in a single direction; and a bidirectional strobe signal line 56 on which data is bidirectionally transmitted, such that data is bidirectionally transmitted between the memory controller 51 and the DRAMs 52. A portion of the DRAM 52, for example, input/output circuit portions have similar configurations to the circuits illustrated in any of FIGS. 1 to 3.

Figure 6:
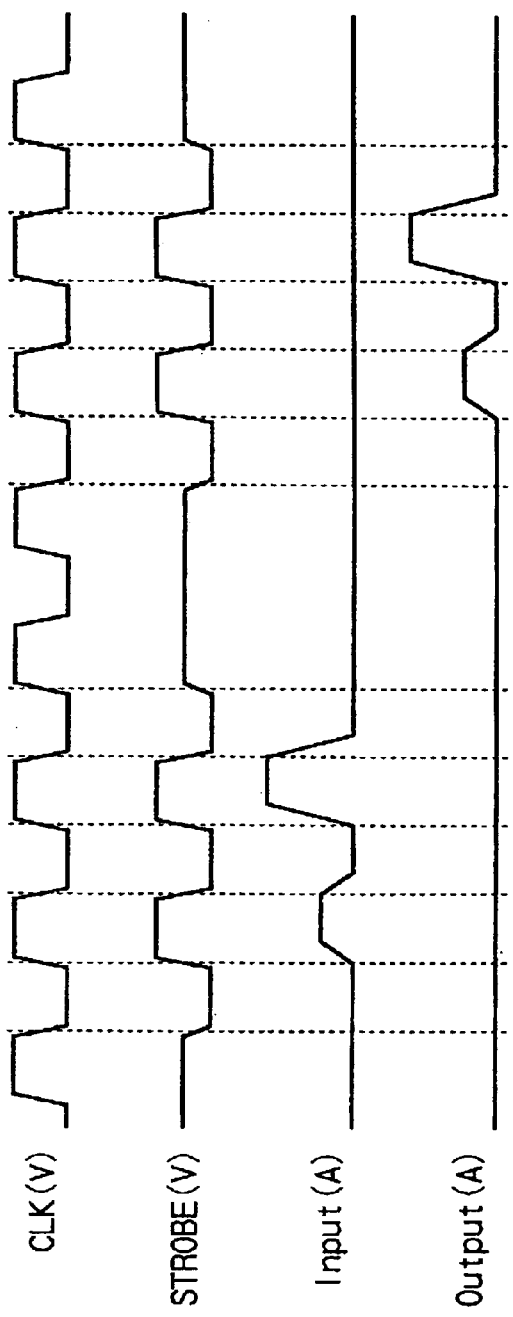
FIG. 6 is a waveform chart showing an exemplary operation of the data transmission system illustrated in FIG. 5.

FIG. 6 is a waveform chart showing an exemplary operation of the data transmission system illustrated in FIG. 5.

Multi-valued input current data Input(A) is input from the input data line 54, while multi-valued output current data Output(A) is output to the output data line 55 by controlling the transmission/reception using a strobe signal voltage STROBE(V) synchronized to a clock signal voltage CLK (V).

<Sixth Embodiment>

FIG. 7 is a block diagram illustrating a data transmission system according to a sixth embodiment.

This data transmission system differs from the data transmission system according to the fifth embodiment illustrated in FIG. 5 in that two uni-directional strobe signal lines 61, 62 are used as strobe signal lines. The rest of the configuration in the data transmission system is identical.

<Seventh Embodiment>

FIG. 8 is a block diagram illustrating a data transmission system according to a seventh embodiment.

This data transmission system differs from the data transmission system according to the sixth embodiment illustrated in FIG. 7 in that a bidirectional data line 71 is used as a data line, and that a portion of each DRAM 52, for example, its input/output circuit portions have similar configurations to the circuit illustrated in FIG. 4. The rest of the configuration is identical to the sixth embodiment.

Figure 9:
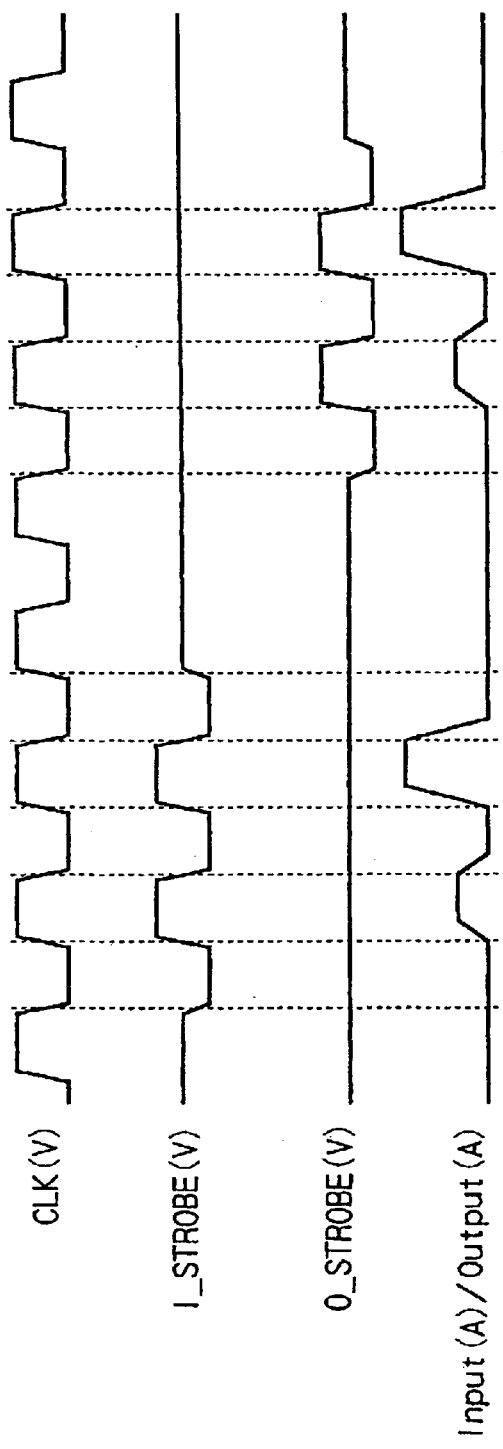
FIG. 9 is a waveform chart showing an exemplary operation of the data transmission system illustrated in FIG. 8.

FIG. 9 is a waveform chart showing an exemplary operation of the data transmission system illustrated in FIG. 8.

Multi-valued input data Input(A) is input from the bidirectional data line 71 by an input controlling strobe signal voltage I-STROBE(V) synchronized to a clock signal voltage CLK(V), and a multi-valued output current data Output (A) is output to the bidirectional data line 71 by an output controlling strobe signal voltage O-STROBE (V).

<Eighth Embodiment>

Figure 10:
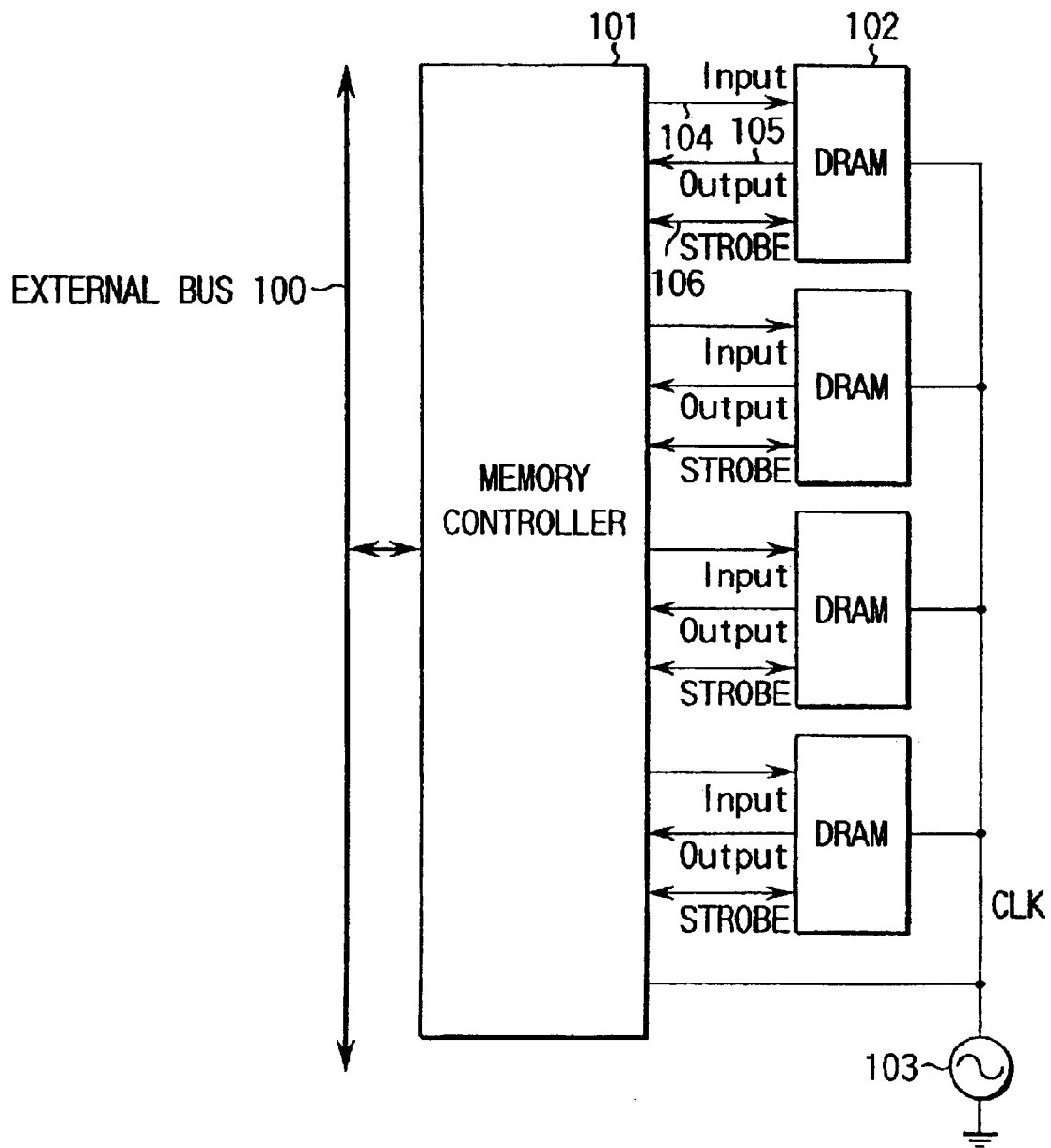
FIG. 10 is a block diagram illustrating a data transmission system according to an eighth embodiment of the present invention.

FIG. 10 is a block diagram illustrating a data transmission system according to an eighth embodiment.

FIG. 10 illustrates the configuration of a data transmission system in which a plurality of DRAMs 102 are star connected to a single memory controller 101 which in turn is connected to an external bus 100.

The star connection employs a Source Synchronous Strobe scheme. Specifically, the master (memory controller 101) is connected to each of the plurality of DRAMS 102 through a bus in a one-to-one correspondence, and a basic clock signal and a strobe signal STROBE for use in transmission/reception of data are used as clock signals. In the eighth embodiment, a clock signal source 103 supplies a clock signal voltage to the memory controller 101 and the DRAMS 102. Also, as illustrated, the controller 101 and the DRAMs 102 are interconnected through two unidirectional data lines 104, 105 and a bidirectional strobe signal line 106. A portion of the DRAM 102, for example, its input/output circuit portions have similar configurations to the circuits illustrated in any of FIGS. 1 to 3.

While the data transmission systems in the foregoing fifth to eighth embodiments have shown examples in which the clock signal as well as the strobe signal are voltage driven, the clock signal and the strobe signal may be modified to be current driven.

<Ninth Embodiment>

A ninth embodiment relates to the DAC disposed in the data output circuit portion of the LSI which is adapted to the data transmission system according to the present invention.

Figure 11:
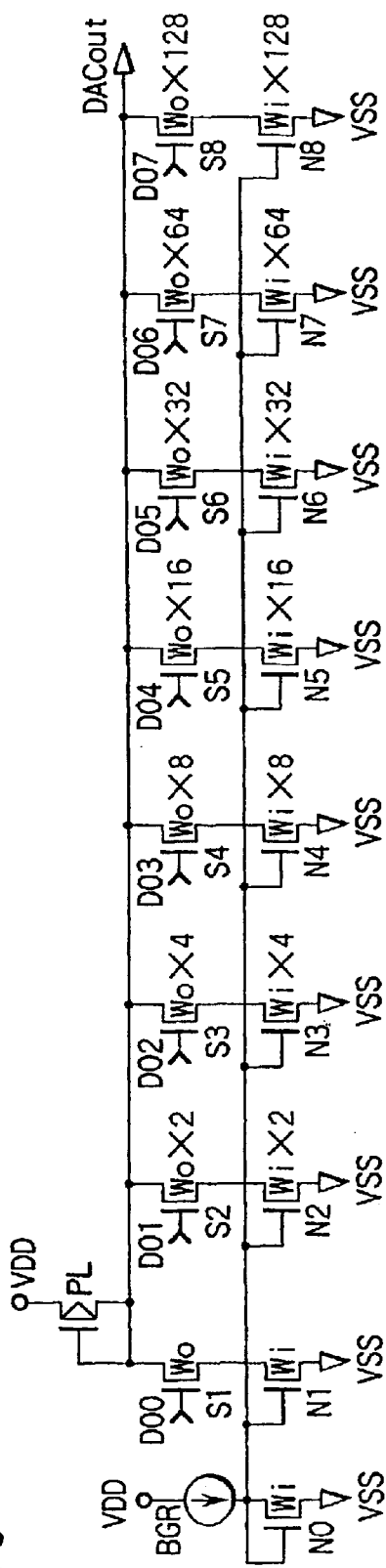
FIG. 11 is a circuit diagram illustrating an exemplary circuit of a DAC according to a ninth embodiment of the present invention.

FIG. 11 is a circuit diagram illustrating an exemplary DAC according to the ninth embodiment. Specifically, FIG. 11 illustrates an exemplary DAC for converting, for example, 8-bit binary voltage data DO7–DO0 to denary current data DACout.

As illustrated in FIG. 11, eight weight current source NMOS transistors N1–N8 are connected to a reference current source NMOS transistor N0 in current mirror configuration. The weight current source NMOS transistors N1–N8 are sized (having the sizes Wi, . . . , Wix128) to have current values which are one-time, two-time, four-time, . . . , 64-time, 128-time as high as a current value of the reference current source NMQS transistor N0, respectively.

Switching NMOS transistors S1–S8 each have one end connected to a corresponding one of the NMOS transistors N1–N8, the other ends of which are collectively connected to a power supply node through a load PMOS transistor PL. The NMOS transistors S1–S8 are sized (having the sizes Wo, . . . , Wox128) to have current values which are one-time, two-time, four-time, . . . , 64-time, 128-time as high as the current value of the NMOS transistor N0.

The NMOS transistors S1–S8 receive at their respective gates the least significant bit DO0 to the most significant bit DO7 of 8-bit binary voltage data. In this way, the DAC illustrated in FIG. 11 operates to draw a DA converted output current DACout flowing into the node to which the NMOS transistors S1–S8 are collectively connected.

More specifically, the DAC illustrated in FIG. 11 is characterized by comprising the reference current source transistor (N0); first to n-th weight current source transistors (N1–N8) respectively connected to the reference current source transistor (N0) in current mirror configuration, and sized to have current value weighted by a factor of $2^{n-1}$ with respect to a current value of the reference current source transistor (N0); and first to n-th switching transistors (S1–S8) each having one end connected to a corresponding one of the first to n-th weight current source transistors and the other end collectively connected to an output node, sized to have current values weighted by a factor of $2^{n-1}$, and receiving the least significant bit DO0 to the most significant bit DOn of n-bit binary voltage data corresponding to respective gates.

Generally, the value of the reference current must be previously matched on the input side and on the output side of the data transmission system, however, no problem will arise provided that a conversion amount is known even if the value of the reference current is not matched. In the ninth embodiment, however, it is assumed that the same reference current is used on the input side and on the output side of the data transmission system.

<Tenth Embodiment>

A tenth embodiment relates to the ADC disposed in the data input circuit portion of the LSI which is adapted to the data transmission system according to the present invention.

Figure 12:
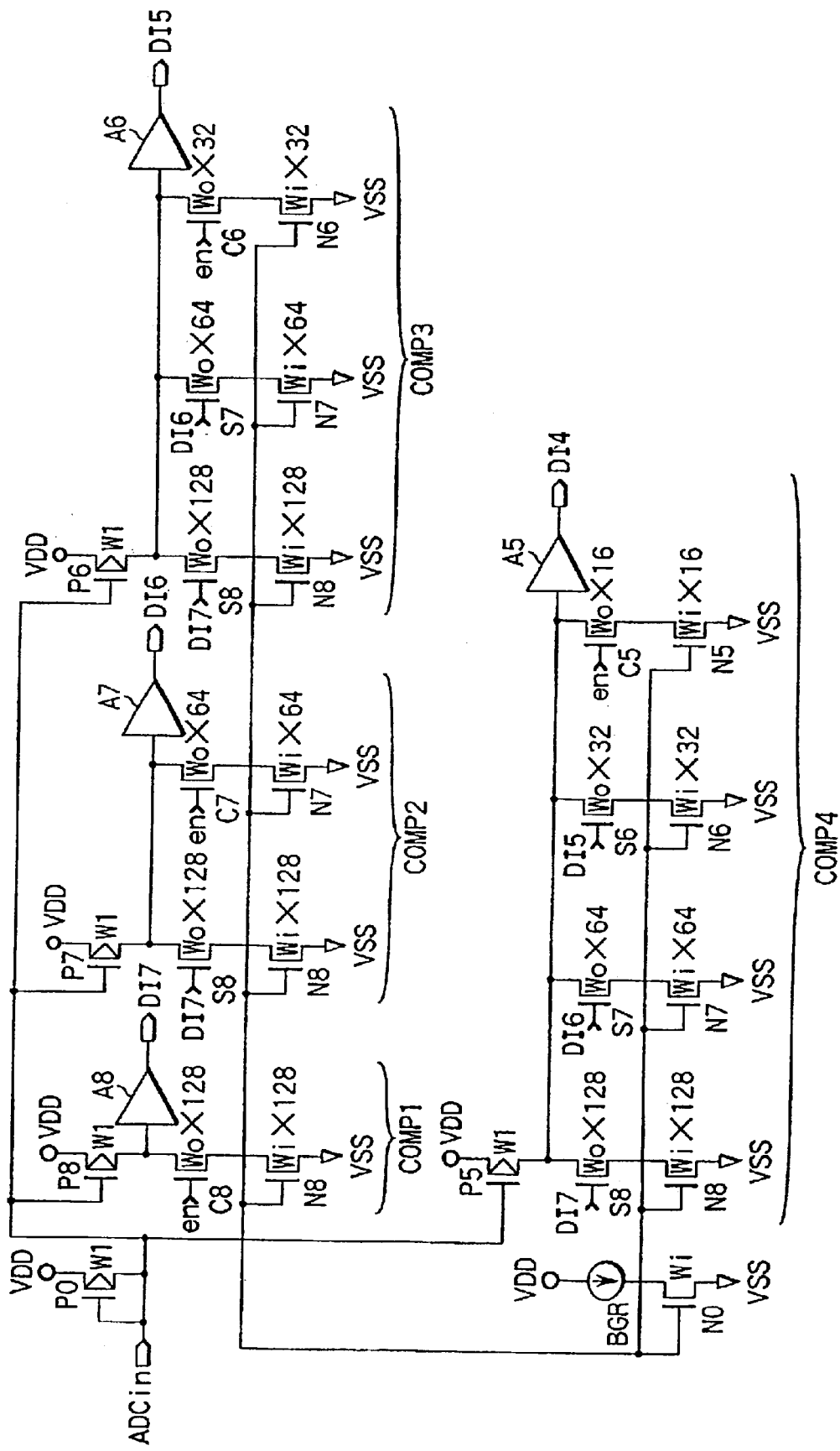
FIGS. 12, 13 and 14 are circuit diagrams collectively illustrating an exemplary circuit of an ADC according to a tenth embodiment.
Figure 13:
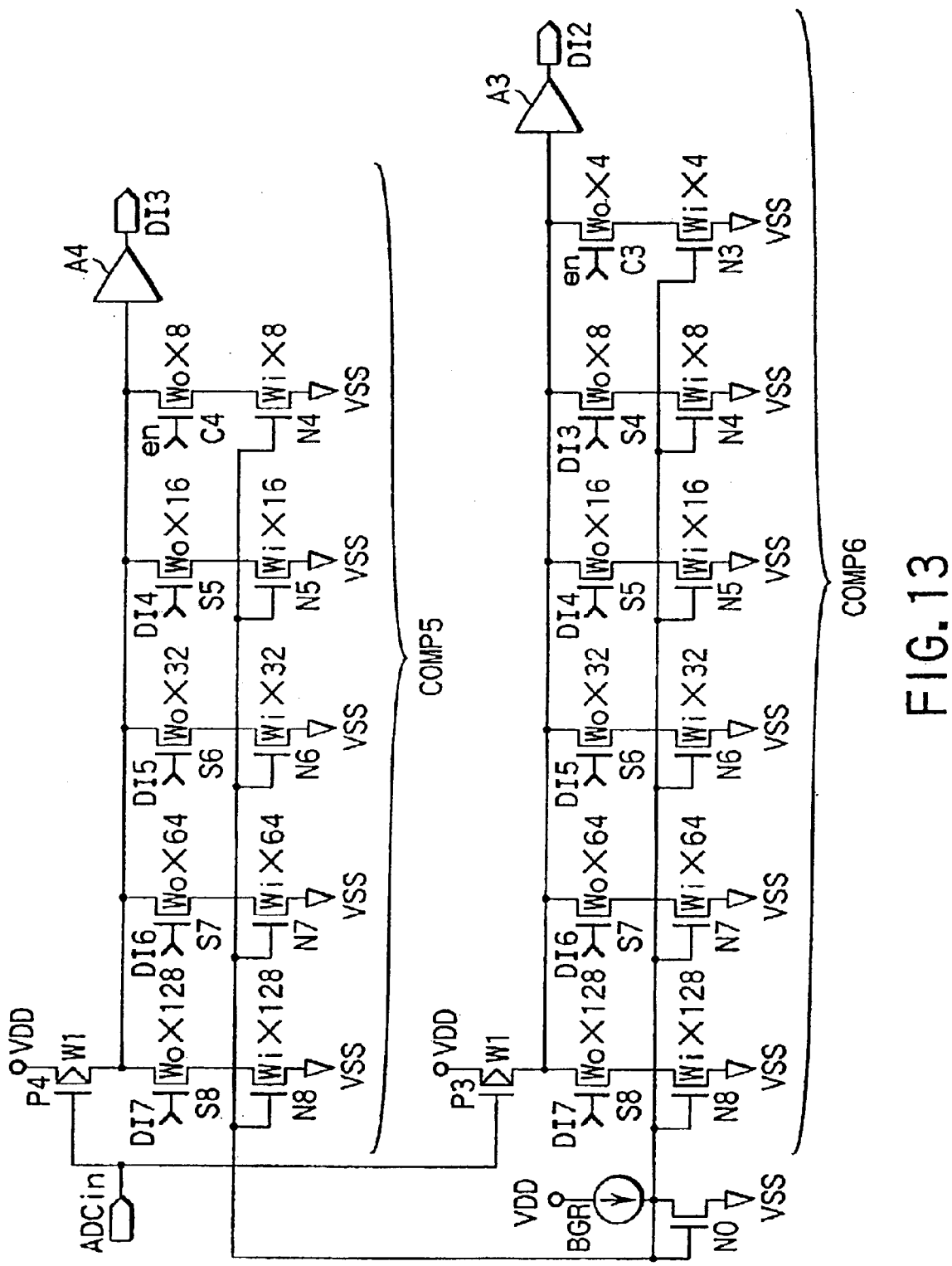
Figure 14:
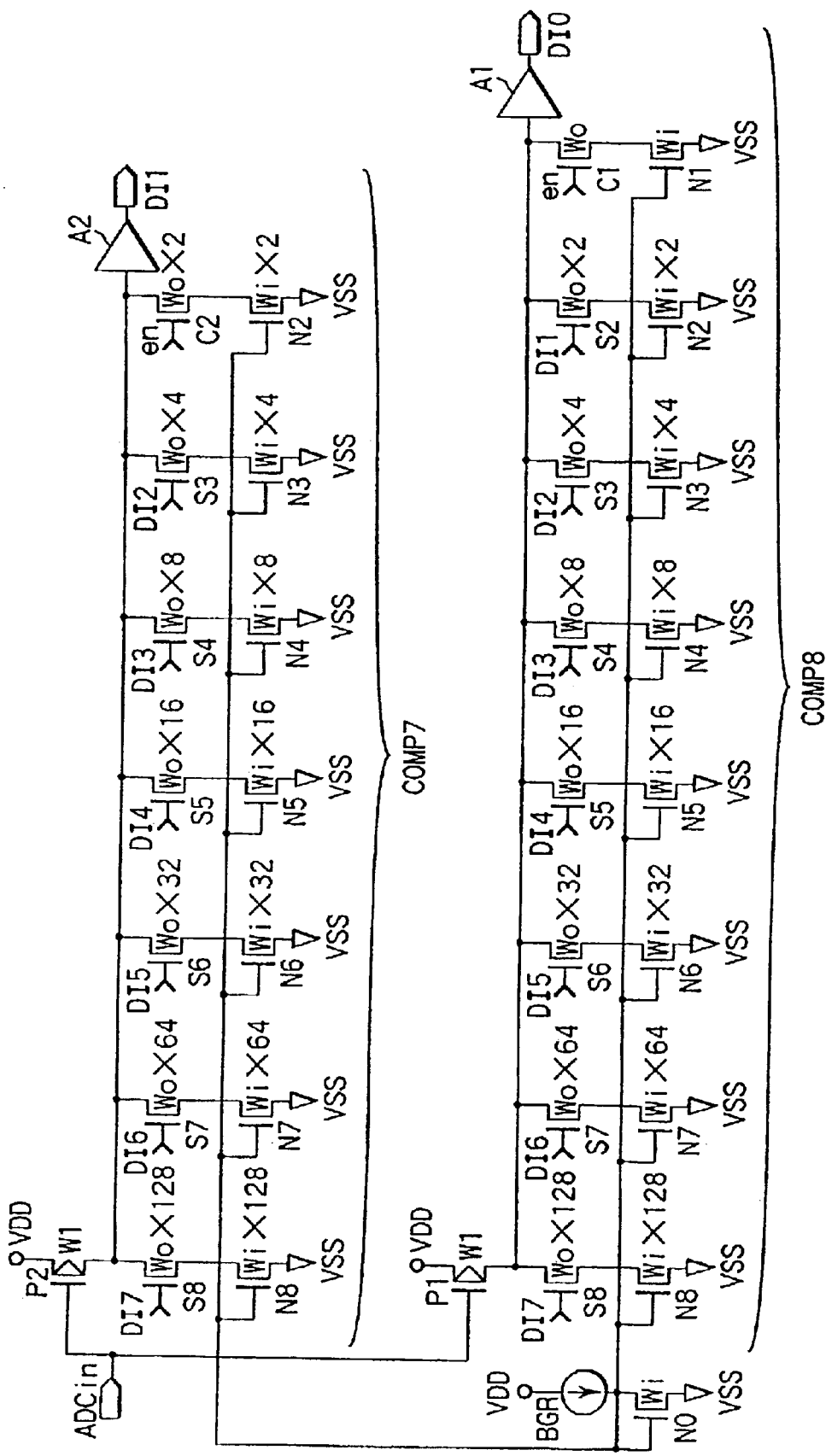

FIGS. 12, 13 and 14 are circuit diagrams illustrating an example of the ADC according to the tenth embodiment. Specifically, FIGS. 12, 13 and 14 illustrate an exemplary ADC (sequential comparison type ADC) for converting denary current data ADCin to 8-bit binary voltage data DI7–DI10. In particular, FIG. 12 illustrates a circuit portion of a single ADC for converting the most significant bit DI7 to a bit DI4 of the binary voltage data DI7–DI0; FIG. 13 illustrates a circuit portion of the ADC for converting bits DI3, DI2; and FIG. 14 illustrates a circuit portion of the ADC for converting bits DI1, DI0.

As illustrated in FIGS. 12, 13 and 14, a PMOS transistor P0 has a source connected to a power supply node and a gate and a drain connected to each other, and is applied with an input current ADCin at the drain. PMOS transistors P8–P1 each have the same size (W1) as the PMOS transistor P0, and are connected to the PMOS transistor P0 in current mirror configuration. In this way, the PMOS transistor P8–P1 pass a current equal to the input current ADCin.

On the other hand, a plurality of weight current source NMOS transistors N8–N1 are connected to a reference current source NMOS transistor N0 in current mirror configuration. The plurality of weight current source NMOS transistors N8–N1 are sized (having the sizes Wix128, . . . , Wi) to have current values which are 128 times, 64 times, 32 times, 16 times, 8 times, 4 times, 2 times, and one time as high as the current value of the reference current source NMOS transistor N0, respectively.

The NMOS transistor S8 applied at the gate with the most significant bit DI7 of the binary voltage data DI7–DI0 is sized (having the size Wox128) to have a current value 128 times as high as the reference current. Similarly, the NMOS transistor S7 applied at the gate with the bit DI6 is sized (having the size Wox64) to have a current value 64 times as high as the reference current. Similarly, the NMOS transistor S6 applied at the gate with the bit DI5 is sized (having the size Wox32) to have a current value 32 times as high as the reference current. Similarly, the NMOS transistor S5 applied at the gate with the bit DI4 is sized (having the size Wox16) to have a current value 16 times as high as the reference current. Similarly, the NMOS transistor S4 applied at the gate with the bit DI3 is sized (having the size Wox8) to have a current value 8 times as high as the reference current. Similarly, the NMOS transistor S3 applied at the gate with the bit DI2 is sized (having the size Wox4) to have a current value 4 times as high as the reference current. Similarly, the NMOS transistor S2 applied at the gate with the bit DI1 is sized (having the size Wox2) to have a current value twice as high as the reference current.

The NMOS transistors C8–C1 applied at their gates with a comparison enable signal en are sized (having the sizes Wox128, . . . , Wo) to have current values 128 times, 64 times, 32 times, 16 times, 8 times, 4 times, 2 times, and one time as high as the reference current, respectively.

A first comparator circuit COMP1 shown in FIG. 12 comprises the PMOS transistor P8 connected in series between the power supply node and a ground node for delivering an input current; the NMOS transistor C8 applied at the gate with the signal en and the NMOS transistor N8 for delivering a current 128 times as high as the reference current; and an amplifier circuit A8 for converting a potential at the drain of the PMOS transistor P8 to a binary level.

With this configuration, the first comparator circuit COMP1 compares the current 128 times as high as the reference current, delivered in response to the signal en, with the input current to determine the logical level of the most significant bit DI7 of the binary data DI7–DI0.

A second comparator circuit COMP2 illustrated in FIG. 12 differs from the first comparator circuit COMP1 in that the PMOS transistor P8 is replaced with P7; the NMOS transistor C8 with S8; and the amplifier circuit A8 with A7, respectively, and that the NMOS transistor C7 applied at the gate with the signal en and the NMOS transistor N7 for delivering a current 64 times as high as the reference current are connected in series between the drain of the PMOS transistor P7 and the ground node. The rest of the configuration is identical to the first comparator circuit COMP1.

Specifically, the second comparator circuit COMP2 comprises the PMOS transistor P7 for delivering an input current, the NMOS transistor S8 applied at the gate with the bit DI7, and the NMOS transistor N8 for delivering a current 128 times as high as the reference current connected in series between a power supply node and a ground node. Further, the NMOS transistor C7 applied at the gate with the signal en and the NMOS transistor N7 for delivering a current 64 times as high as the reference current are connected in series between the drain of the PMOS transistor P7 and the ground node. The second comparator circuit COMP2 also comprises an amplifier circuit A7 for converting a potential at the drain of the PMOS transistor P7 to a binary level.

With this configuration, to determine the logical level of the bit DI6 of the binary data DI7–DI0 the second comparator circuit COMP2 compares a current produced by subtracting the current 128 times as high as the reference current from an input current with the current 64 times as high as the reference current, delivered in response to the signal en, when the bit DI7 is at "HIGH," and compares the input current with the current 64 times as high as the reference current, delivered in response to the signal en, when the bit DI7 is at "LOW".

A third comparator circuit COMP3 illustrated in FIG. 12 differs from the second comparator circuit COMP2 in that the PMOS transistor P7 is replaced with P6; the NMOS transistor C7 with S7; and the amplifier circuit A7 with A6, respectively, and that the NMOS transistor C6 applied at the gate with the signal en and the NMOS transistor N6 for delivering a current 32 times as high as the reference current are connected in series between the drain of the PMOS transistor P6 and a ground node. The rest of the configuration is identical to the second comparator circuit COMP2.

With this configuration, to determine the logical level of the bit DI5 of the binary data DI7–DI0 the third comparator circuit COMP3 compares a current produced by subtracting the currents 128 times and 64 times as high as the reference current from an input current with the current 32 times as high as the reference current, delivered in response to the signal en, when the bits DI7, DI6 are both at "HIGH," and compares the input current with the current 32 times as high as the reference current, delivered in response to the signal en, when the bits DI7, DI6 are both at "LOW".

A fourth comparator circuit COMP4 illustrated in FIG. 12 differs from the third comparator circuit COMP3 in that the PMOS transistor P6 is replaced with P5; the NMOS transistor C6 with S6; and the amplifier circuit A6 with A5, respectively, and that the NMOS transistor C5 applied at the gate with the signal en and the NMOS transistor N5 for delivering a current 16 times as high as the reference current are connected in series between the drain of the PMOS transistor P5 and a ground node. The rest of the configuration is identical to the third comparator circuit COMP3.

With this configuration, to determine the logical level of the bit DI4 of the binary data DI7–DI0 the fourth comparator circuit COMP4 compares a current produced by subtracting the currents 128 times, 64 times and 32 times as high as the reference current from an input current with the current 16 times as high as the reference current, delivered in response to the signal en, when the bits DI7–DI5 are all at "HIGH," and compares the input current with the current 16 times as high as the reference current, delivered in response to the signal en, when the bits DI7–DI5 are all at "LOW".

A fifth comparator circuit COMP5 illustrated in FIG. 13 differs from the fourth comparator circuit COMP4 in that the PMOS transistor P5 is replaced with P4; the NMOS transistor C5 with S5; and the amplifier circuit A5 with A4, respectively, and that the NMOS transistor C4 applied at the gate with the signal en and the NMOS transistor N4 for delivering the current 8 times as high as the reference current are connected in series between the drain of the PMOS transistor P4 and a ground node. The rest of the configuration is identical to the fourth comparator circuit COMP4.

With this configuration, to determine the logical level of the bit DI3 of the binary data DI7–DI0 the fifth comparator circuit COMP5 compares a current produced by subtracting the currents 128 times, 64 times 32 times and 16 times as high as the reference current from an input current with the current 8 times as high as the reference current, delivered in response to the signal en, when the bits DI7–DI4 are all at "HIGH," and compares the input current with the current 8 times as high as the reference current, delivered in response to the signal en, when the bits DI7–DI4 are all at "LOW".

A sixth comparator circuit COMP6 illustrated in FIG. 13 differs from the fifth comparator circuit COMP5 in that the PMOS transistor P4 is replaced with P3; the NMOS transistor C4 with S4; the amplifier circuit A4 with A3, respectively, and that the NMOS transistor C3 applied at the gate with the signal en and the NMOS transistor N3 for delivering a current 4 times as high as the reference current are connected in series between the drain of the PMOS transistor P3 and a ground node. The rest of the configuration is identical to the fifth comparator circuit COMP5.

With this configuration, to determine the logical level of the bit DI2 of the binary data DI7–DI0 the sixth comparator circuit COMP6 compares a current produced by subtracting the currents 128 times, 64 times, 32 times, 16 times and 8 times as high as the reference current from an input current with the current 4 times as high as the reference current, delivered in response to the signal en, when the bits DI7–DI3 are all at "HIGH," and compares the input current with the current 4 times as high as the reference current, delivered in response to the signal en, when the bits DI7–DI3 are all at "LOW".

A seventh comparator circuit COMP7 illustrated in FIG. 14 differs from the sixth comparator circuit COMP6 in that the PMOS transistor P3 is replaced with P2; the NMOS transistor C3 with S3; and the amplifier circuit A3 with A2, respectively, and that the NMOS transistor C2 applied at the gate with the signal en and the NMOS transistor N2 for delivering a current twice as high as the reference current are connected in series between the drain of the PMOS transistor P2 and a ground node. The rest of the configuration is identical to the sixth comparator circuit COMP6.

With this configuration, to determine the logical level of the bit DI1 of the binary data DI7–DI0 the seventh comparator COMP7 compares a current produced by subtracting the currents 128 times, 64 times, 32 times, 16 times, 8 times and 4 times as high as the reference current from an input current with the current twice as high as the reference current, delivered in response to the signal en, when the bits DI7–DI2 are all at "HIGH," and compares the input current with the current twice as high as the reference current, delivered in response to the signal en, when the bits DI7–DI2 are all at "LOW".

An eighth comparator COMP8 illustrated in FIG. 14 differs from the seventh comparator COMP7 in that the PMOS transistor P2 with P1; the NMOS transistor C2 with S2; and the amplifier circuit A2 with A1, respectively, and that the NMOS transistor C1 applied at the gate with the signal en and the NMOS transistor N1 for delivering the current equal to the reference current are connected in series between the drain of the PMOS transistor P1 and a ground node. The rest of the configuration is identical to the seventh comparator COMP7.

With this configuration, to determine the logical level of the least significant bit DI0 of the binary data DI7–DI0 the eighth comparator circuit COMP8 compares a current produced by subtracting the currents 128 times, 64 times, 32 times, 16 times, 8 times, 4 times and twice as high as the reference current from an input current with the current equal to the reference current, delivered in response to the signal en, when the bits DI7–DI1 are all at "HIGH," and compares the input current with the current equal to the reference current, delivered in response to the signal en, when the bits DI7–DI1 are all at "LOW".

Stated another way, the ADC illustrated in FIGS. 12 to 14 is characterized by comprising the first comparator circuit COMP1 for comparing a current value weighted $2^{n-1}$ times as high as the reference current, delivered in response to the comparison enable signal en, with an input signal to determine the logical level of the n-th bit, which is the most significant bit of n-bit binary data; the second comparator circuit COMP2 responsive to the logical level of the n-th bit for comparing a current produced by subtracting a current value $2^{n-1}$ times as high as the reference current from the input current or the input current with a current $2^{n-2}$ times as high as the reference current, delivered in response to the comparison enable signal to determine the logical level of the (n−1)th bit of the binary data; and the third comparator circuit COMP3 to an n-th comparator circuit COMPn each for comparing a current produced by subtracting a current value which is a multiple of the reference current in accordance with a combination of the logical levels of upper bits of the binary data from the input current or the input current with a corresponding one of currents $2^{n-3}$ times to 1 time as high as the reference current, delivered in response to the comparison enable signal, to determine the logical levels of the (n−2)th to the least significant bits of the binary data.

Figure 15:
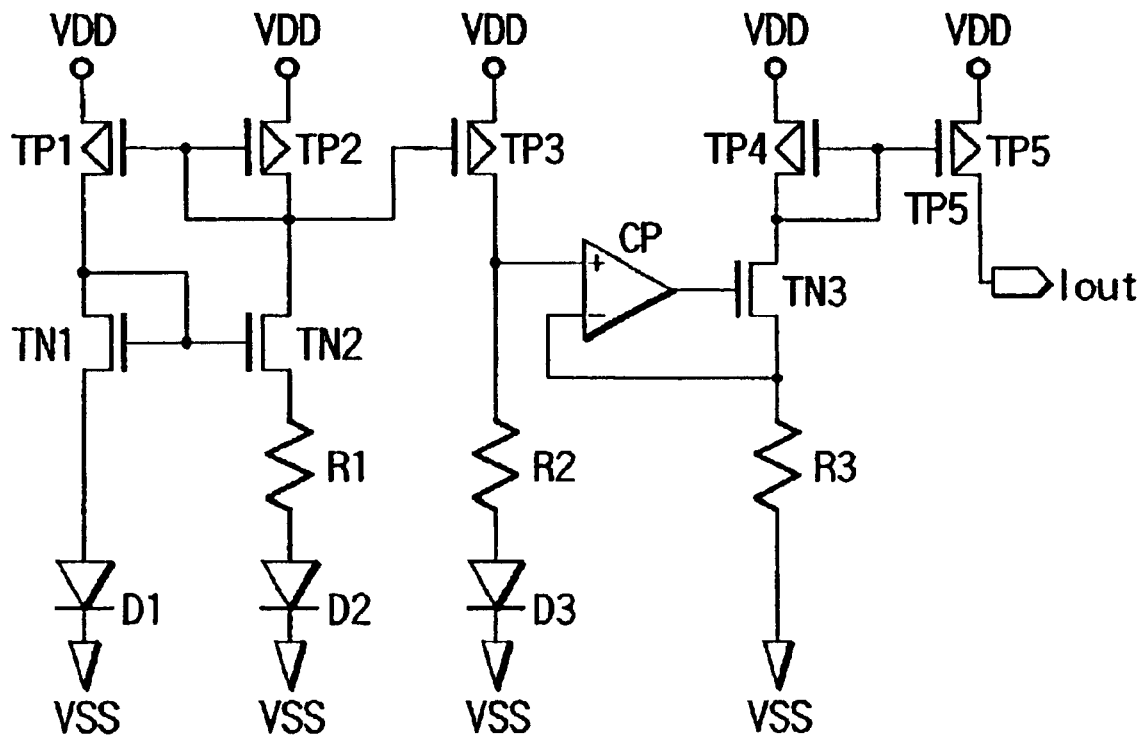
FIG. 15 is a circuit diagram illustrating an exemplary circuit of a reference current source (regulated current source)

FIG. 15 is a circuit diagram illustrating an exemplary reference current source (regulated current source) BGR for use in the DAC illustrated in FIG. 11 or in the ADC illustrated in FIGS. 12, 13 and 14.

As a reference current source, a band gap reference circuit is known, and is described, for example, in "Analysis and Design of Analog Integrated Circuits" (2nd. Ed.) written by P. R. Gray and R. G. Meyer, and published by John Wiley & Sons. Inc, and so on.

The reference current source illustrated in FIG. 15 is based on FIG. 12.29 of the foregoing literature, and configured by simplifying a cascade connection, and replacing a bipolar transistor with a diode. In the following, the principles of its operation will be described.

A PMOS transistor TP1, an NMOS transistor TN1 having a drain and a gate connected to each other, and a diode D1 are connected in series between a power supply node and a ground node. Likewise, a PMOS transistor TP2 having a gate and a drain connected to each other, an NMOS transistor TN2, a resistor R1 and a diode D2 are connected in series between the power supply node and the ground node. Likewise, a PMOS transistor TP3 having a gate and a drain connected to each other, a resistor R2 and a diode D3 are connected in series between the power supply node and the ground node.

The three PMOS transistors TP1–TP3 have their gates connected to one another to form a current mirror circuit, while the two NMOS transistors TN1 and TN2 have their gates connected to each other to form a current mirror circuit.

Further, a PMOS transistor TP4 having a gate and a drain connected to each other, an NMOS transistor TN3 and a resistor R3 are connected in series between the power supply node and the ground node. Then, a potential at a source of the NMOS transistor TN3 and a potential at the drain of the PMOS transistor TP3 are input to a (−) input terminal and a (+) input terminal, associated therewith, of a voltage comparator circuit CP which has an output terminal connected to the gate of the PMOS transistor TN3. Further, a current output PMOS transistor TP5 is connected to the PMOS transistor TP4 in current mirror configuration, and a reference current Iout is output from a drain of the PMOS transistor TP5.

In the foregoing configuration, the diodes D1, D2, D3 are set such that currents flowing therethrough are identical. Also, the diodes D2, D3 have the same size which is larger than the size of the diode D1. The resistors R1, R2, R3 have the same resistance.

Assuming now that currents flowing through the respective diodes D1, D2, D3 are represented by Id; anode-cathode voltages of the diodes D1, D2, D3 by Vbe1, Vbe2, Vbe3, respectively, and a current flowing through the resistor R3 by I:

$$Vbe1 = Id \times R1 + Vbe2$$

$$Id \times R2 + Vbe3 = I \times R3$$

Since the diodes D2, D3 have the same size are set such that the same current flows therethrough, $$Vbe2 = Vbe3$$

Since the resistors R2, R3 have the same resistance $$R2 = R3$$

Here, assuming:

$$\bullet Vbe = Vbe1 - Vbe2$$

$$Vbe = Vbe2 = Vbe3$$

the following equation is derived:

$$I = \bullet Vbe/R1 + Vbe/R2 \quad (1)$$

In the equation (1), Vbe corresponds to a voltage at which a current begins to flow in the forward direction through the diodes D1, D2, D3, and corresponds to a difference of the Fermi level of the p side and n side. At higher temperature, the level of the p side tends to become high and the level of n side from the Fermi-Dirac distribution function tends to low, and the difference of the Fermi level to become smaller, with the result that Vbe becomes smaller.

Also, in the equation (1), •Vbe is generated by a difference between a current Id1 flowing through the diode D1 and a current Id2 flowing through the diode D2, and Id is expressed by:

$$Id = \bullet \times \exp(q \times Vbe/KT) - 1 \quad (2)$$

where • includes a size effect of the diodes D1, D2. Assuming that the diodes D1, D2 have the same size, "−1" in the exponential term in the equation (2) can be ignored, so that:

$$\bullet Vbe = (KT/q) \times \log\{Id1/Id2\} \quad (3)$$

is derived. It is understood from the equation (3) that •Vbe is proportional to the temperature.

As appreciated, the temperature dependency can be eliminated from I by using Vbe and •Vbe whose temperature characteristics vary in opposite directions, and adjusting the ratio Id1/Id2 of the currents flowing through the diodes D1, D2 and the resistances of the resistors R1, R2.

<Eleventh Embodiment>

For employing the Source Synchronous Strobe scheme as mentioned above, a reference current may be sent instead of a voltage as a strobe signal STROBE. The following description is made on an eleventh embodiment which is designed in consideration of this feature.

Figure 16:
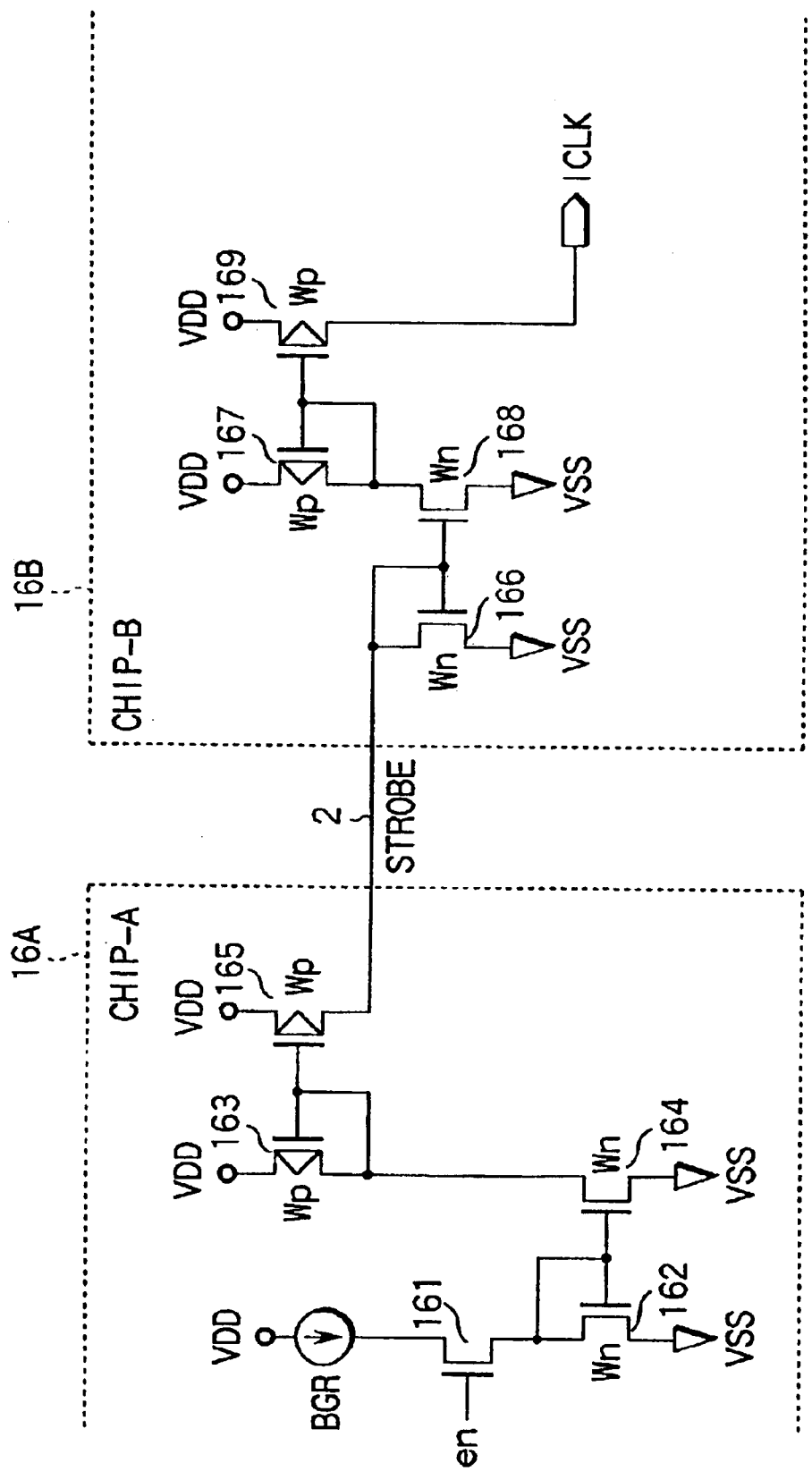
FIG. 16 is a circuit diagram illustrating an exemplary circuit of a current driving circuit according to an eleventh embodiment.

FIG. 16 is a circuit diagram illustrating an exemplary current driving circuit according to the eleventh embodiment. The current driving circuit illustrated in FIG. 16 is disposed in an LSI for driving a strobe signal STROBE as a current in a daisy chain connected data transmission system.

As illustrated in FIG. 16, in a first LSI (CHIP-A) 16A for a controller, a reference current source BGR, an NMOS transistor 161 applied at a gate with a strobe enable signal en, and an NMOS transistor 162 having a drain and a gate connected to each other are connected in series between a power supply node and a ground node. Likewise, a PMOS transistor 163 having a gate and a drain connected to each other, and an NMOS transistor 164 are connected in series between the power supply node and the ground node. The two NMOS transistors 162, 164 have their gates connected to each other to form a current mirror circuit. Then, a current output PMOS transistor 165 is connected to the PMOS transistor 163 in current mirror configuration.

According to the first LSI 16A configured as described, a current output from a drain of the current output PMOS transistor 165 can be delivered to an external strobe signal line 2 as a strobe signal STROBE.

In a second LSI (CHIP-B) 16B, on the other hand, the strobe signal current is input to an NMOS transistor 166, which has a drain and a gate connected to each other, from the external strobe signal line 2. Then, a PMOS transistor 167 having a gate and a drain connected to each other, and an NMOS transistor 168 are connected in series between a power supply node and a ground node. The NMOS transistor 168 is connected to the NMOS transistor 166 in current mirror configuration. Also, a PMOS transistor 169 is connected to the PMOS transistor 167 in current mirror configuration.

According to the second LSI 16B configured as described, a strobe signal current output from a drain of the PMOS transistor 169 can be supplied to an internal circuit, and this strobe signal current can be used as a current source for a DAC or a current source for an ADC.

Figure 17:
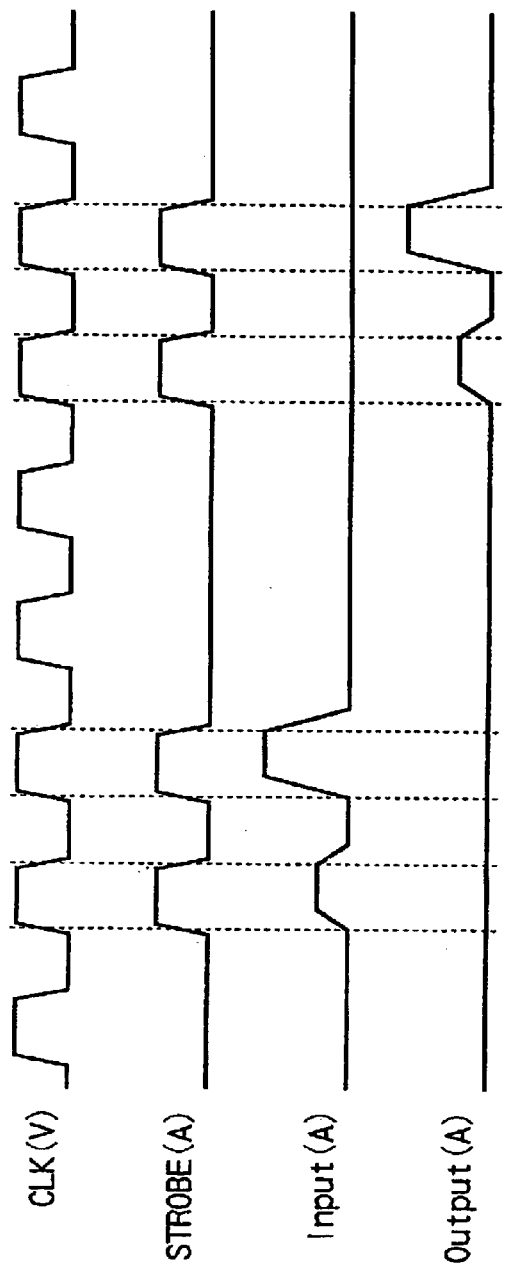
FIG. 17 is a waveform chart showing an exemplary operation when a strobe signal is driven as a current.

FIG. 17 is a waveform chart showing an exemplary operation of the current driving circuit illustrated in FIG. 16 when the strobe signal STROBE is driven as a current. In FIG. 17, CLK(V) is a clock signal voltage; STROBE(A) is a strobe signal current; Input(A) is a current data input; and Output(A) is a current data output.

Figure 18:
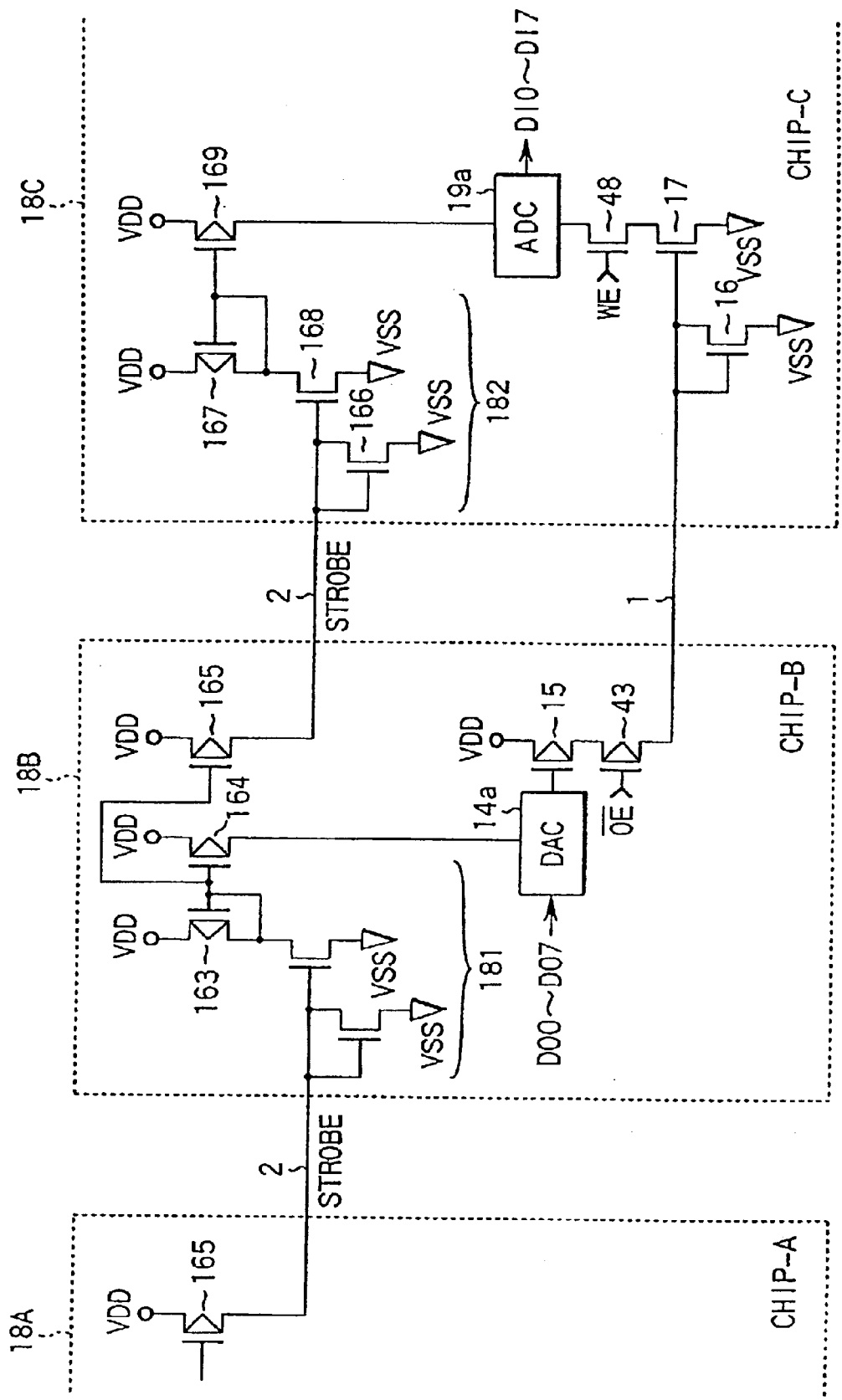
FIG. 18 is a circuit diagram schematically illustrating a transmission path for a strobe signal current in a daisy chain connected data transmission system according to an eleventh embodiment.

FIG. 18 is a circuit diagram schematically illustrating a transmission path for a strobe signal current in daisy chain connected transmission system according to an eleventh embodiment. In the example, the PMOS 164 is the current source for the DAC 14a and the PMOS 169 is the current source for the ADC 19a.

<Twelfth Embodiment>

When the aforementioned Source Synchronous Strobe scheme is employed, it is possible to send the strobe signal current multiplexed on a data current as well as to send the strobe signal as a reference current, as illustrated in FIG. 16. The following description is made on a twelfth embodiment which is designed in consideration of this feature.

FIG. 19A is a circuit diagram schematically illustrating a transmission path for a strobe signal current in a daisy chain connected data transmission system according to the twelfth embodiment.

Specifically, in the twelfth embodiment, when the DAC 14a converts binary voltage data DO0–DO7 to a digital form in the LSI 18B in the next stage, one unit of data meaning the strobe signal STROBE is added to the binary voltage. In this way, when current data controlled by the output of the DAC 14a is delivered to an external data line 1 through a transistor 43 which is controlled to turn on/off by an output enable signal/OE, one unit of a current meaning the strobe signal STROBE can be added to the current data.

The ADC 19a receives the data current (one unit of the strobe signal current is added thereto) supplied thereto through the external data line 1 by NMOS current mirror circuits 16, 17 in the data input circuit portion. Then, the current data is input to a transistor 48, which is controlled to turn on/off by an input enable signal WE, for A/D conversion. In this case, the ADC 19a may be configured to convert the data current with previous knowledge that one unit of current value is excessive as the data value, so that when one unit or more of current flows, it determines that the strobe signal STROBE is received.

Figure 20:
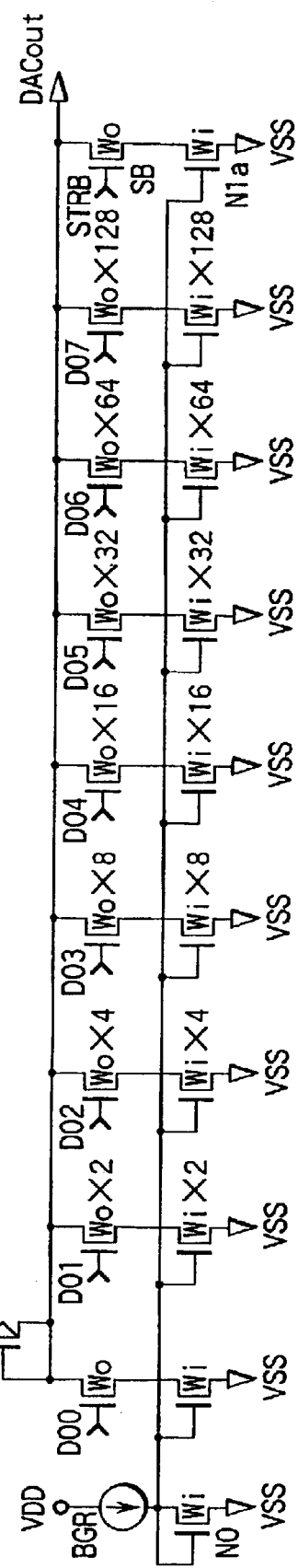
FIG. 20 is a circuit diagram illustrating an exemplary DAC.

FIG. 20 is a circuit diagram illustrating an example of the DAC 14a shown in FIG. 19A. Specifically, FIG. 20 illustrates the DAC 14a which converts 8-bit binary voltage data (DO7–DO0) and one bit of strobe signal (clock signal) STRB to denary current data.

The DAC illustrated in FIG. 20 differs in configuration from the DAC illustrated in FIG. 11 in that:

(1) an additional NMOS transistor N1a for strobe signal current source is connected to a reference current source NMOS transistor N0 in current mirror configuration, where the NMOS transistor N1a is sized to have the same current value as the reference current source NMOS transistor N0; and (2) a switching NMOS transistor SB, which is applied at a gate with the strobe signal STRB, is connected between a DA converted output node and the drain of the strobe signal current source NMOS transistor N1a.

The rest of the configuration is identical to that of the DAC illustrated in FIG. 11, so that reference numerals are omitted for parts included therein.

Also, the operation of the DAC illustrated in FIG. 20 is basically similar to the operation of the DAC illustrated in FIG. 11 except that, in particular, a DA conversion operation is added corresponding to one bit of strobe signal STRB.

Figure 21:
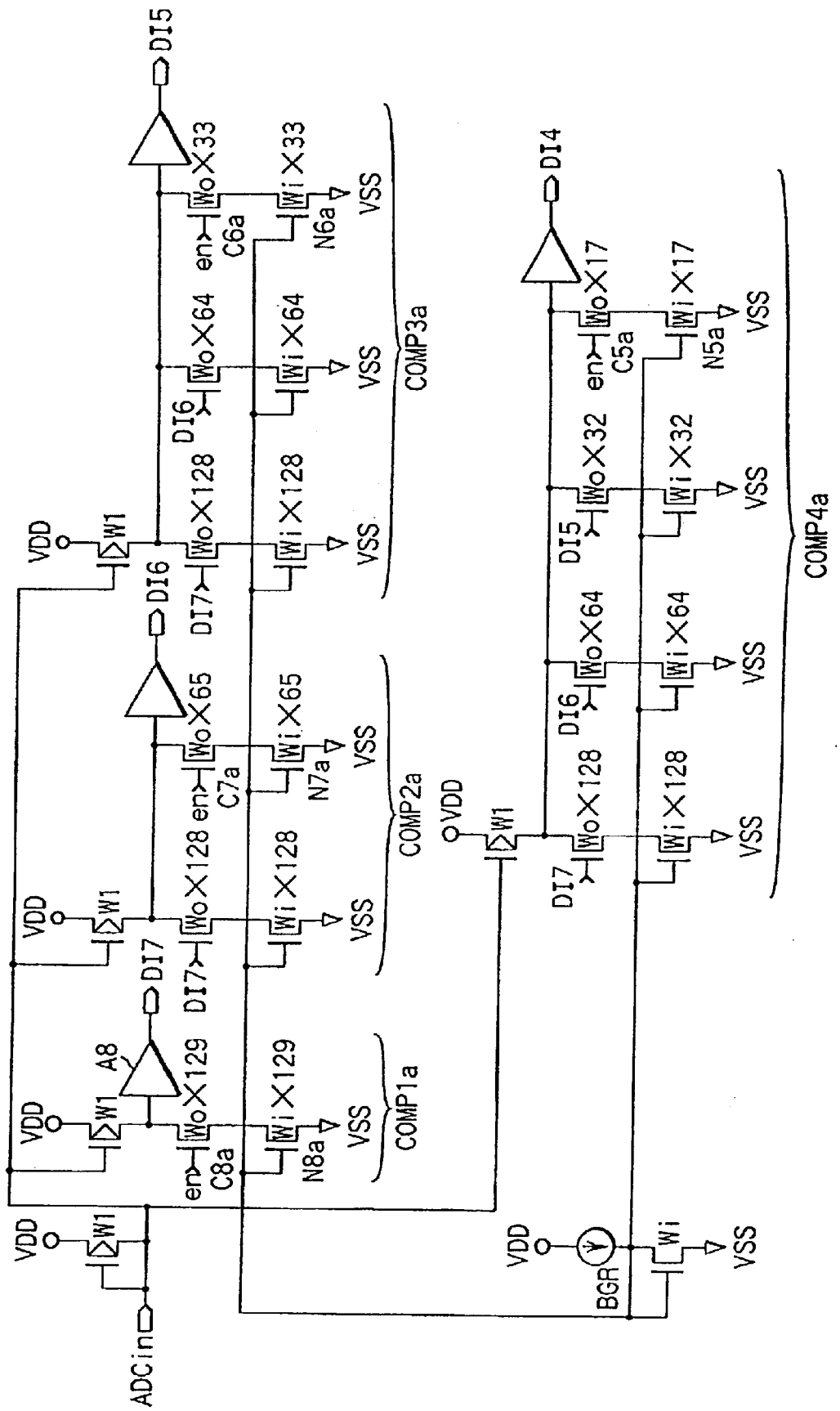
FIGS. 21, 22, 23 and 24 are circuit diagrams collectively illustrating an exemplary ADC.
Figure 22:
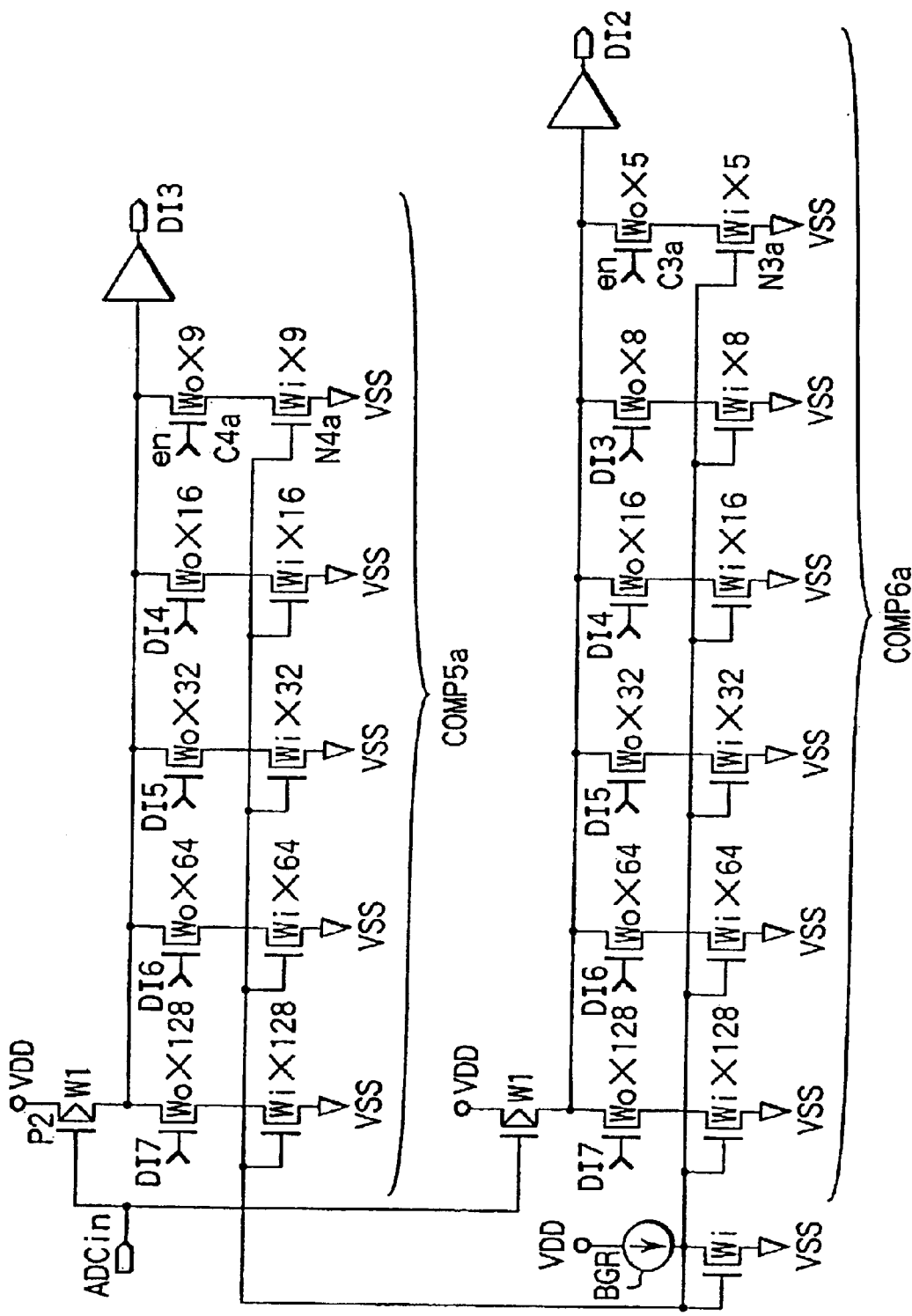
Figure 23:
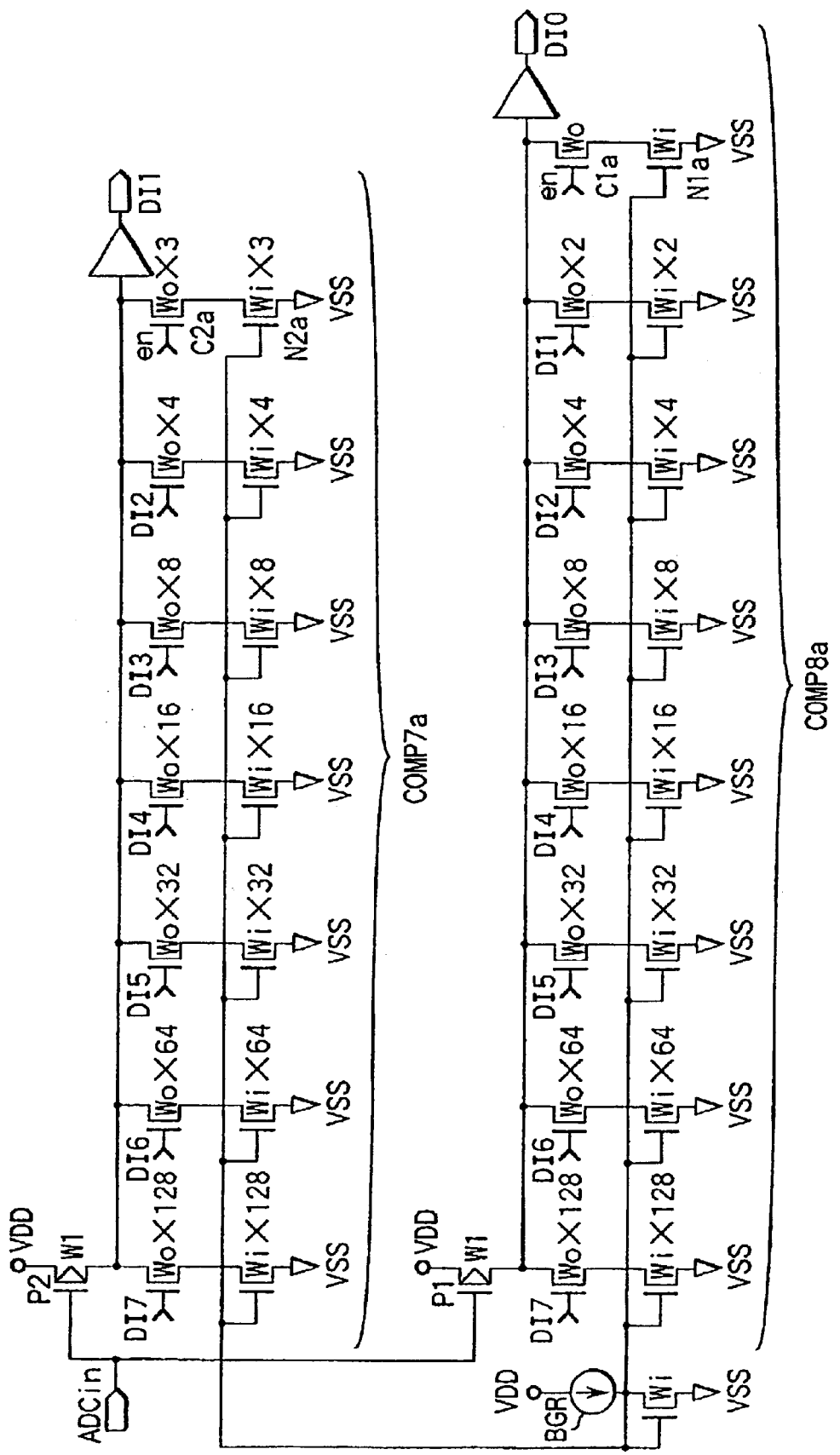
Figure 24:
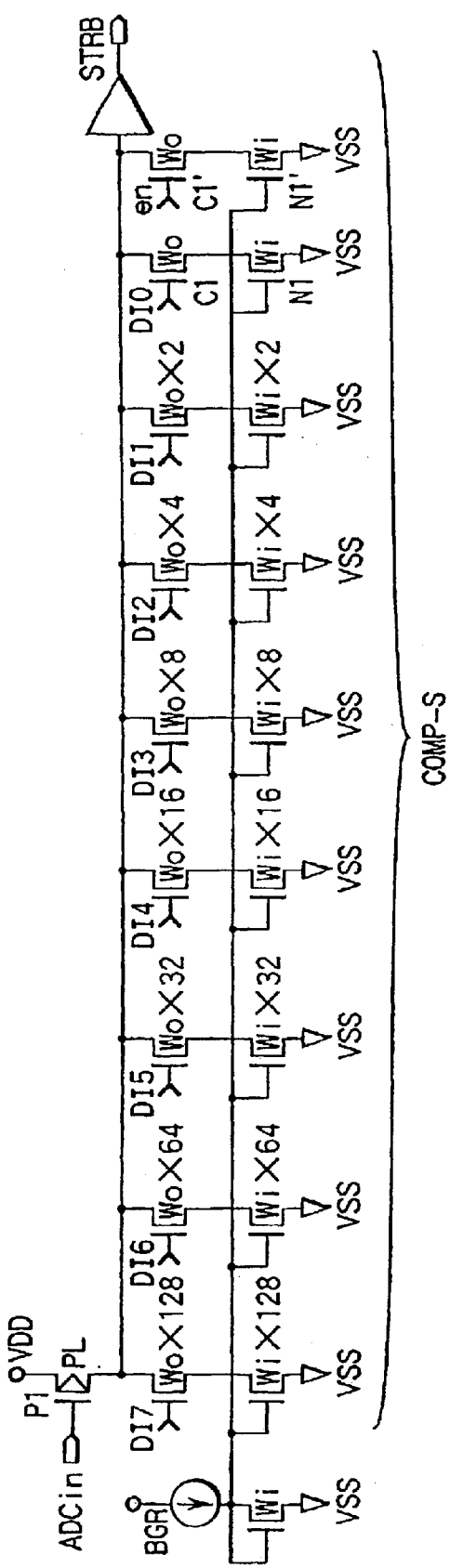

FIGS. 21, 22, 23 and 24 are circuit diagrams illustrating an example of the ADC 19a illustrated in FIG. 19A. Specifically, FIGS. 21, 22, 23 and 24 illustrate an exemplary ADC for converting denary current data ADCin to 8-bit binary voltage data DI7–DI0 and one bit of strobe signal STRB. In particular, FIG. 21 illustrates a circuit portion of a single ADC for converting the most significant bit DI7 to a bit DI4 of the binary voltage data DI7–DI0; FIG. 22 illustrates a circuit portion of the ADC for converting bits DI3, DI2; FIG. 23 illustrates a circuit portion of the ADC for converting bits DI1, DI0; and FIG. 24 illustrates a circuit portion of the ADC for converting the one bit of strobe signal STRB.

The circuits illustrated in FIGS. 21, 22, 23 and 24 differ from the ADC illustrated in FIGS. 12, 13 and 14 in the following configurations (1) to (9), and the rest of the configuration is identical to that ADC, so that reference numerals are omitted for parts included therein:

(1) in a first comparator circuit COMP1a, two NMOS transistors C8a, N8a, which are both sized to deliver a weighted current 129 times as high as the reference current, are used in place of the two NMOS transistors C8, N8 connected in series for delivering a weighted current 128 times as high as the reference current;

(2) in a second comparator circuit COMP2a, two NMOS transistors C7a, N7a, which are both sized to deliver a weighted current 65 times as high as the reference current, are used in place of the two NMOS transistors C7, N7 connected in series for delivering the weighted current 64 times as high as the basic current;

(3) in a third comparator circuit COMP3a, two NMOS transistors C6a, N6a, which are both sized to deliver a weighted current 33 times as high as the reference current, are used in place of the two NMOS transistors C6, N6 connected in series for delivering the weighted current 32 times as high as the reference current;

(4) in a fourth comparator circuit COMP4a, two NMOS transistors C5a, N5a, which are both sized to deliver a weighted current 17 times as high as the reference current, are used in place of the two NMOS transistors C5, N5 connected in series for delivering the weighted current 16 times as high as the reference current;

(5) in a fifth comparator circuit COMP5a, two NMOS transistors C4a, N4a, which are both sized to deliver a weighted current 9 times as high as the reference current, are used in place of the two NMOS transistors C4, N4 connected in series for delivering the weighted current 8 times as high as the reference current;

(6) in a sixth comparator circuit COMP6a, two NMOS transistors C3a, N3a, which are both sized tb deliver a weighted current 5 times as high as the reference current, are used in place of the two NMOS transistors C3, N3 connected in series for delivering the weighted current 4 times as high as the reference current;

(7) in a seventh comparator circuit COMP7a, two NMOS transistors C2a, N2a, which are both sized to deliver a weighted current 3 times as high as the reference current, are used in place of the two NMOS transistors C2, N2 connected in series for delivering the weighted current 2 times as high as the reference current;

(8) in an eighth comparator circuit COMP8a, two NMOS transistors C1a, N1a, which are both sized to deliver a weighted current twice as high as the reference current, are used in place of the two NMOS transistors C1, N1 connected in series for delivering the weighted current equal to the reference current; and (9) a comparator circuit COMP-S is added for the strobe signal. This comparator circuit COMP-S differs from the eighth comparator circuit COMP8 illustrated in FIG. 23 in that two NMOS transistors C1', N1' both sized to deliver a weighted current equal to the reference current are used in place of the two NMOS transistors C1a, N1a connected in series for delivering the weighted current twice as high as the reference current; and an NMOS transistor C1 applied at a gate with a minimally weighted bit DI0 and an NMOS transistor N1 for delivering a current equal to the reference current are connected in series between the drain of the PMOS transistor P1 and a ground node. The rest of the configuration is identical to the eighth comparator circuit COMP8.

With the configuration described above, to determine the level of the strobe signal (clock signal) STRB the strobe signal comparator circuit COMP-S compares a current produced by subtracting currents 128 times, 64 times, 32 times, 16 times, 8 times, 4 times, 2 times and 1 time as high as the reference current from an input current with the current equal to the reference current, delivered in response to the signal en, when the bits DI7–DI0 are all at "HIGH," and compares the input current with the current equal to the reference current, delivered in response to the signal en, when the bits DI7–DI0 are all at "LOW".

Stated another way, the ADC illustrated in FIGS. 21 to 24 is characterized by comprising the first comparator circuit COMP1a for comparing a current value weighted $(2^{n-1}+1)$ times as high as the reference current, delivered in response to the comparison enable signal en with an input signal to determine the logical level of the n-th bit, which is the most significant bit of n-bit binary data; the second comparator circuit COMP2a responsive to the logical level of the n-th bit for comparing a current produced by subtracting a current value $2^{n-1}$ times as high as the reference current from the input current or the input current with a current $(2^{n-2}+1)$ times as high as the reference current, delivered in response to the comparison enable signal, to determine the logical level of the (n−1)th bit of the binary data; the third comparator circuit COMP3a to an n-th comparator circuit COMPna each for comparing a current produced by subtracting a current value which is a multiple of the reference current in accordance with a combination of the logical levels of upper bits of the binary data from the input current or the input current with a corresponding one of currents $(2^{n-3}+1)$ times to $(2^0+1)$ times as high as the reference current, delivered in response to the comparison enable signal, to determine the logical levels of the (n−2)th to the least significant bits of the binary data; and the clock signal comparator circuit for comparing a current produced by subtracting a current value which is a multiple of the reference current in accordance with a combination of logical levels from the most significant bit to the least significant bit of the binary data from the input current or the input current with the current equal to the reference current, delivered in response to the comparison enable signal, to determine the logical level of the strobe signal STRB.

The operation of the ADC illustrated in FIGS. 21 to 24 is basically similar to the operation of the ADC illustrated in FIGS. 12 to 14, except that the AD conversion operation is added corresponding to the one bit of strobe signal STRB. In this case, when one unit of current can be detected after converting the bits DI7–DI1, this current corresponds to the strobe signal STRB. In other words, since the strobe signal STRB can be detected after completion of the AD conversion for the data current, the strobe signal STRB can be utilized as a control signal for a circuit which latches the converted output of the bits DI7–DI1. Namely, the bits DI7 to DI1 are latched in the data latching circuit 170 at a first transition of the strobe signal.

According to the twelfth embodiment, it is possible to sends the strobe signal STROBE as a reference current as well as to send a strobe signal current multiplexed on a data current.

Figure 25:
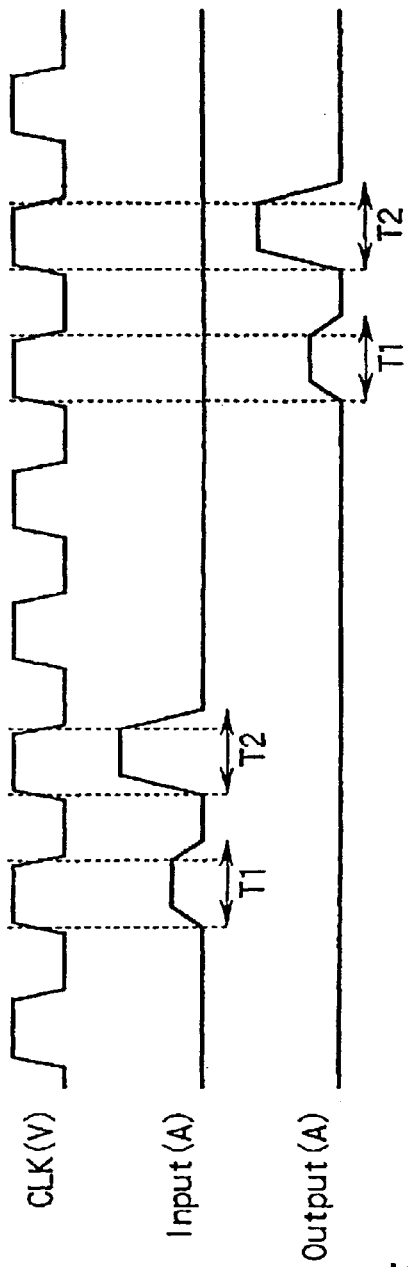
FIG. 25 is a waveform chart showing an exemplary operation of the daisy chain connected data transmission system illustrated in FIG. 19A.

FIG. 25 is a waveform chart showing an exemplary operation of the daisy chain connected data transmission system illustrated in FIG. 19A when the strobe signal current is multiplexed on current data Input(A), Output(A), where a current data period T1 shows only the strobe signal current STRB, and a current data period T2 shows the strobe signal current STRB multiplexed on the current data.

<First and Second Exemplary Modifications to DAC>

The DAC illustrated in FIG. 20 handles one bit of strobe signal (clock signal) STRB as having the same weight as the least significant bit of the 8-bit binary voltage data DO7–DO0.

Figure 26:
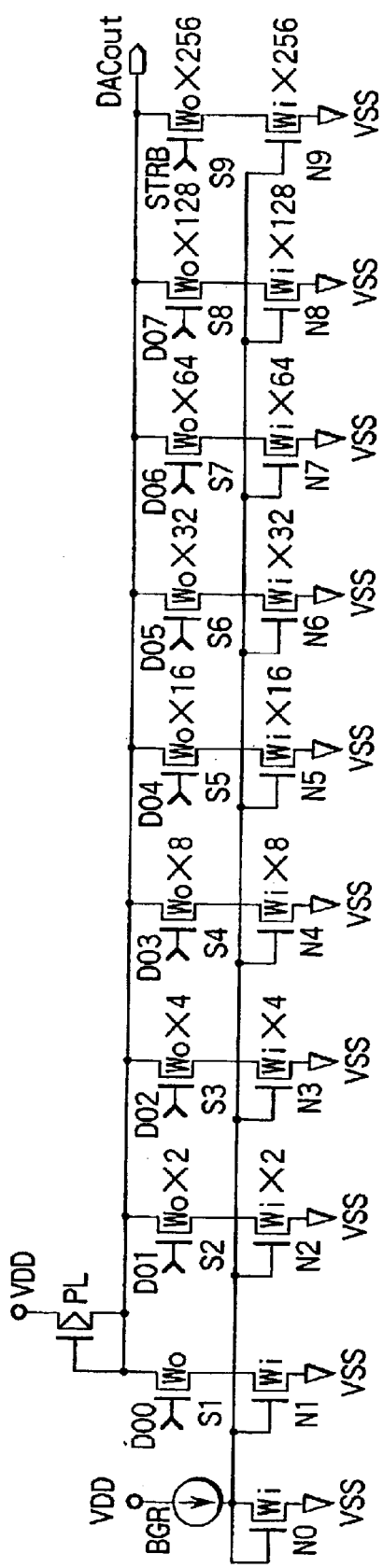
FIG. 26 is a circuit diagram illustrating a first exemplary modification to the DAC.
Figure 27:
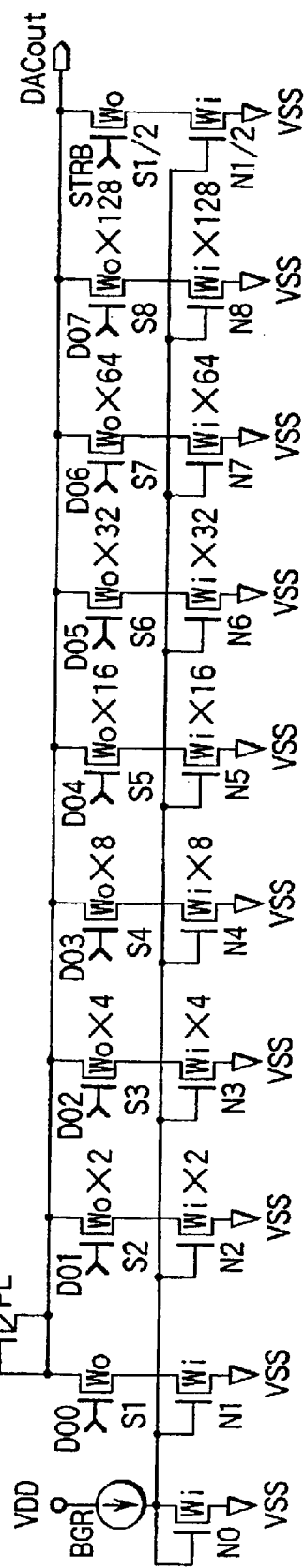
FIG. 27 is a circuit diagram illustrating a second exemplary modification to the DAC.

Alternatively, the one bit of strobe signal (clock signal) STRB may be assigned to an upper bit or a lower bit than the 8-bit binary voltage data DO7–DO0. FIG. 26 illustrates a first exemplary modification in which the strobe signal STRB is assigned to an upper bit, and FIG. 27 illustrates a second exemplary modification in which the strobe signal STRB is assigned to a lower bit.

A DAC illustrated in FIG. 26 differs from the DAC illustrated in FIG. 20 in that NMOS transistors N9, S9 sized to deliver a current 256 times as high as that of a reference current source NMOS transistor are provided in place of the strobe signal current source NMOS transistor N1a and the switching NMOS transistor SB applied at the gate with the strobe signal STRB. The rest of the configuration is identical to the DAC of FIG. 20.

Specifically, the DAC illustrated in FIG. 26 is characterized by comprising a reference current source transistor N0; first to (n+1)th weight current source transistors N1 to N9, connected to the reference current source transistor in current mirror configuration and sized to have current values weighted by a factor of $2^n$ as high as a current value of the reference current source transistor, respectively; and first to (n+1)th switching transistors S1 to S9 each having one end connected to a corresponding one of the first to (n+1)th weight current source transistors and the other end collectively connected to an output node, sized to have current values weighted by a factor of $2^n$, and receiving the least significant bit DO0 to the most significant bit DO7 of n-bit binary voltage data and the strobe signal STRB, corresponding to respective gates.

The operation of the DAC illustrated in FIG. 26 is basically similar to the operation of the DAC illustrated in FIG. 20, except that the strobe signal STRB is assigned to an upper bit than the 8-bit binary voltage data DO7–DO0 for DA conversion.

A DAC illustrated in FIG. 27 differs from the DAC illustrated in FIG. 20 in that NMOS transistors N1/2, S1/2 sized to deliver a current one half an NMOS transistor for reference current source are provided in place of the strobe signal current source NMOS transistor N1a and the switching NMOS transistor SB applied at the gate with the strobe signal STRB. The rest of the configuration is identical, so that reference numerals are omitted for parts included therein.

Specifically, the DAC illustrated in FIG. 27 is characterized by comprising a reference current source transistor N0; first to (n+1)th weight current source transistors N1–N8, N1/2, connected to the reference current source transistor in current mirror configuration and sized to have current values weighted $2^{n-1}$ times and ½ times as high as a current value of the reference current source transistor, respectively; and first to (n+1)th switching transistors S1–S8, S1/2 each having one end corrected to a corresponding one of the first to (n+1)th weight current source transistors and the other end collectively connected to an output node, sized to have current values weighted $2^{n-1}$ times and ½ times, and receiving the least significant bit DO0 to the most significant bit DO7 of n-bit binary voltage data and the strobe signal STRB, corresponding to respective gates.

The operation of the DAC illustrated in FIG. 27 is basically similar to the operation of the DAC illustrated in FIG. 20, except that the strobe signal STRB is assigned to a lower bit than the 8-bit binary voltage data DO7–DO0 for DA conversion.

<First and Second Exemplary Modifications to ADC>

The ADC illustrated in FIGS. 21 to 24 handles one bit of strobe signal (clock signal) STRB as having the same weight as the least significant bit of the 8-bit binary voltage data DO7–DO0.

Figure 28:
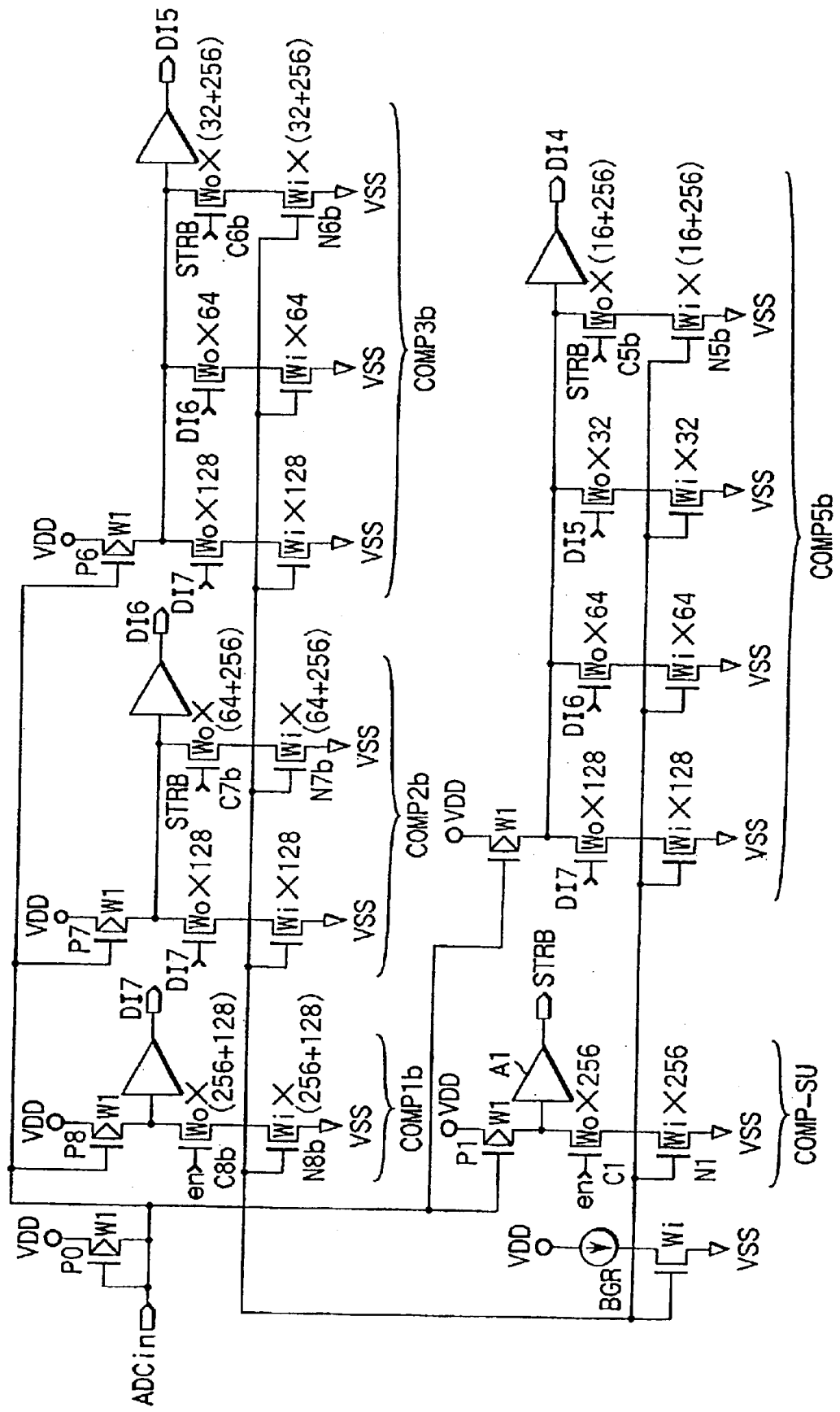
FIGS. 28, 29 and 30 are circuit diagrams collectively illustrating a first exemplary modification to the ADC.
Figure 29:
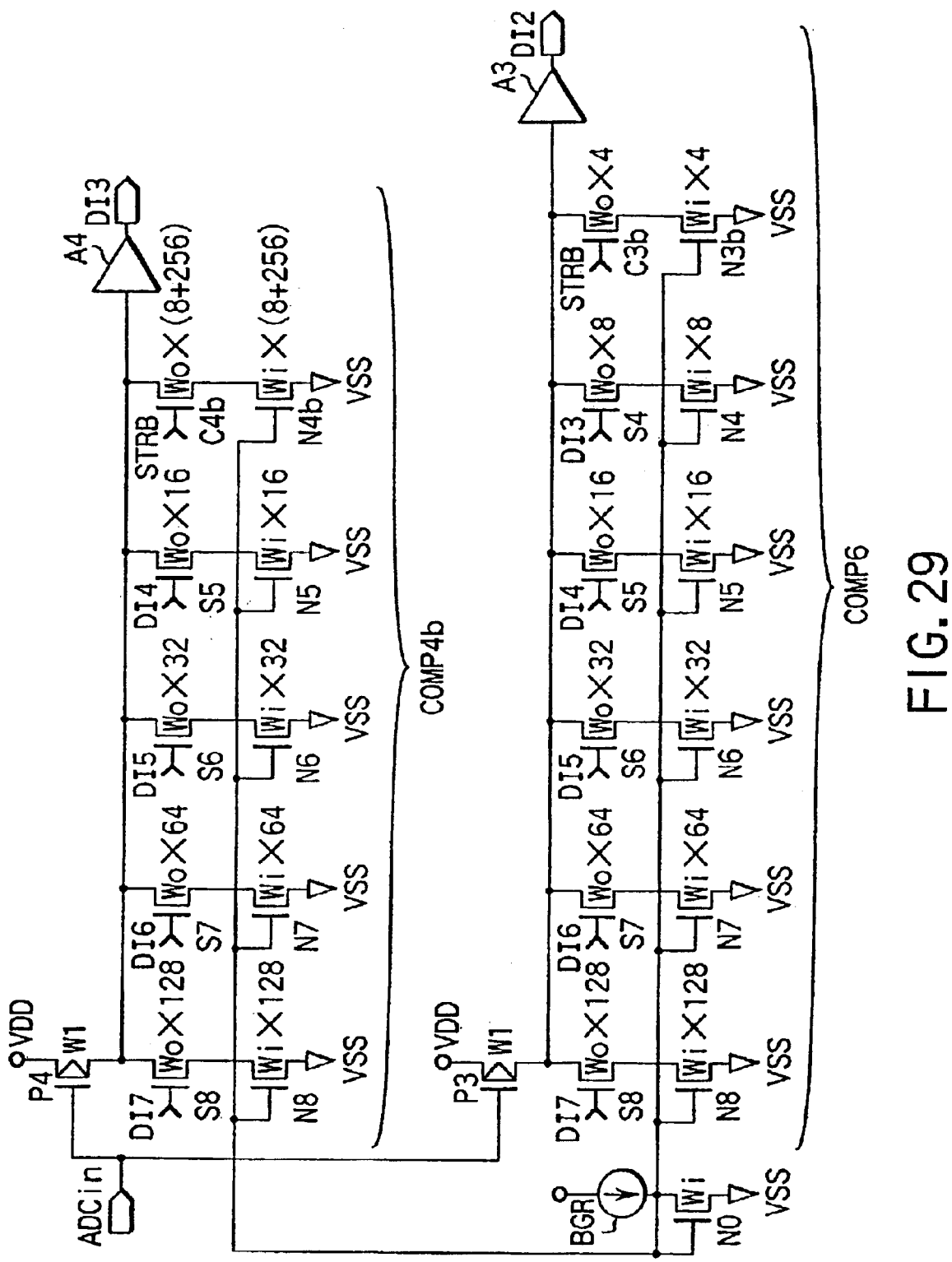
Figure 30:
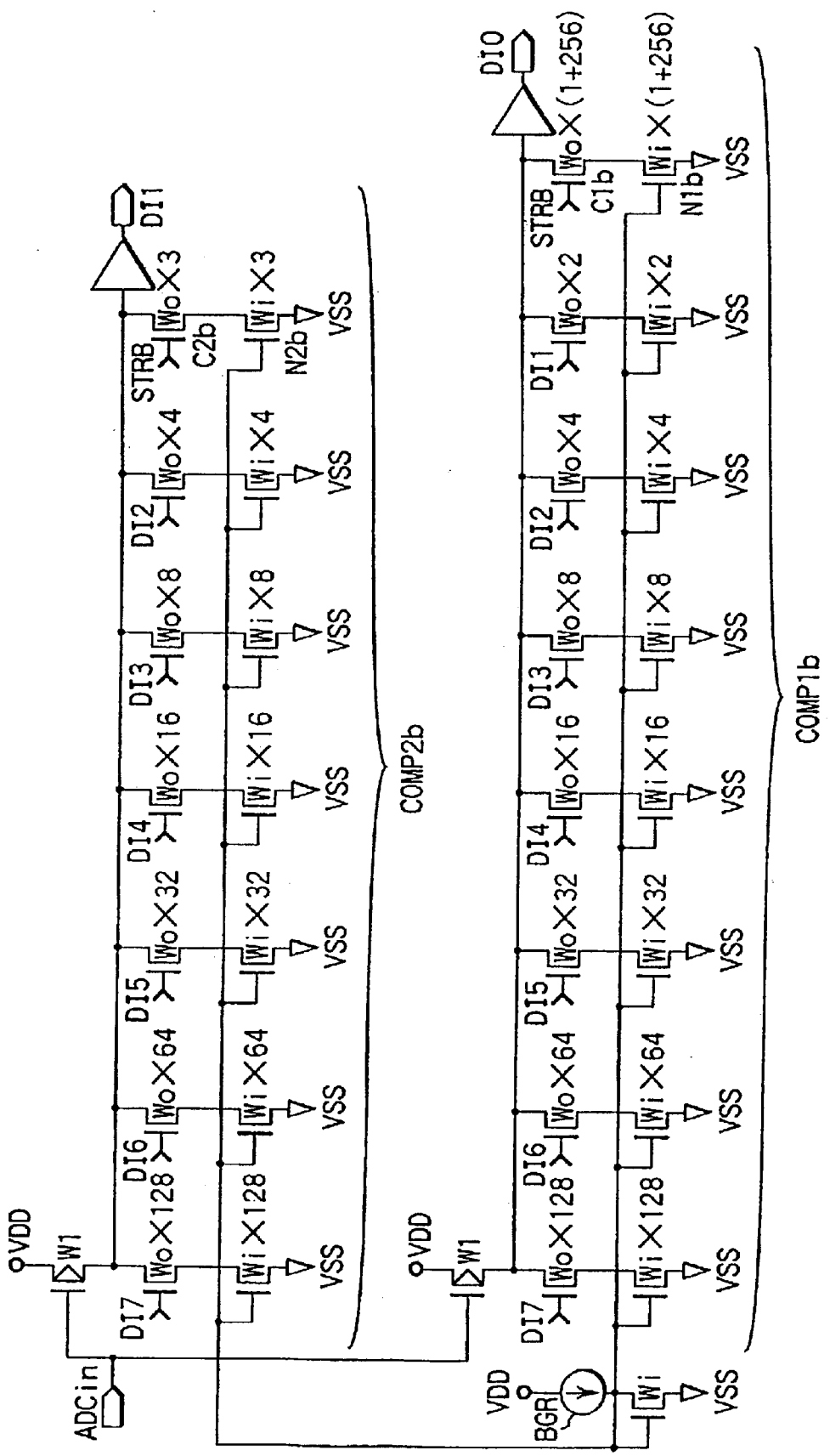
Figure 31:
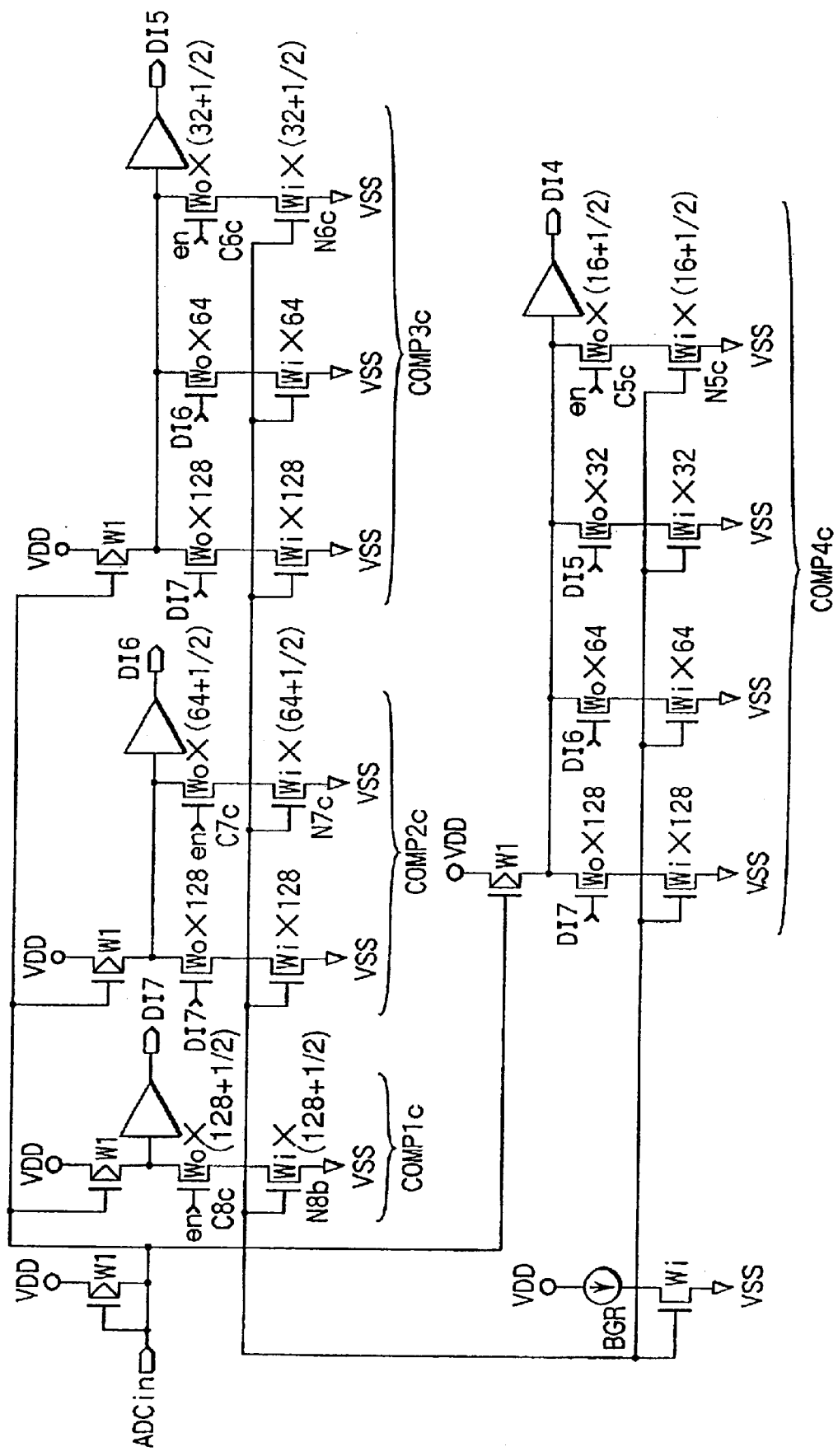
FIGS. 31, 32, 33 and 34 are circuit diagrams collectively illustrating a second exemplary modification to the ADC.
Figure 32:
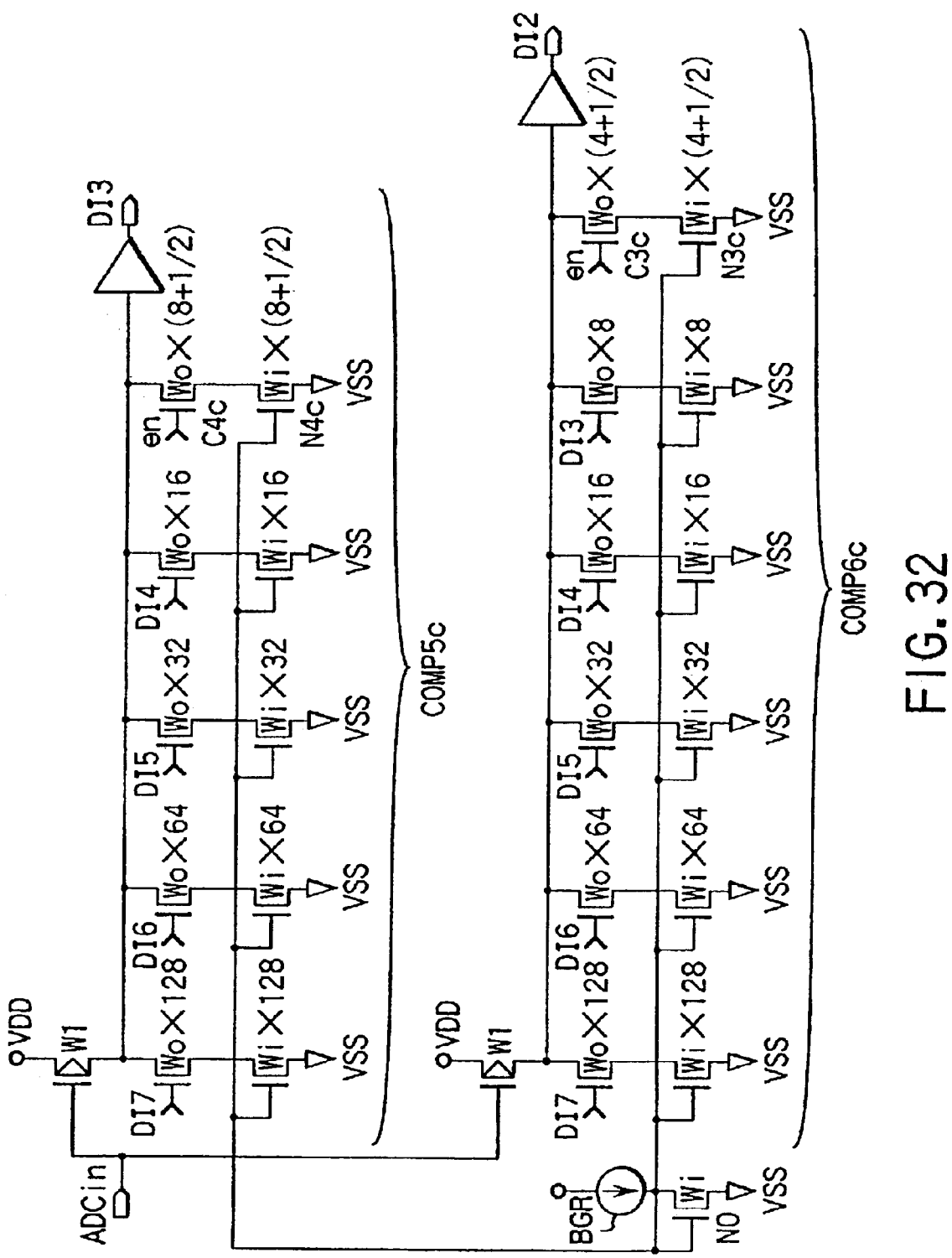
Figure 33:
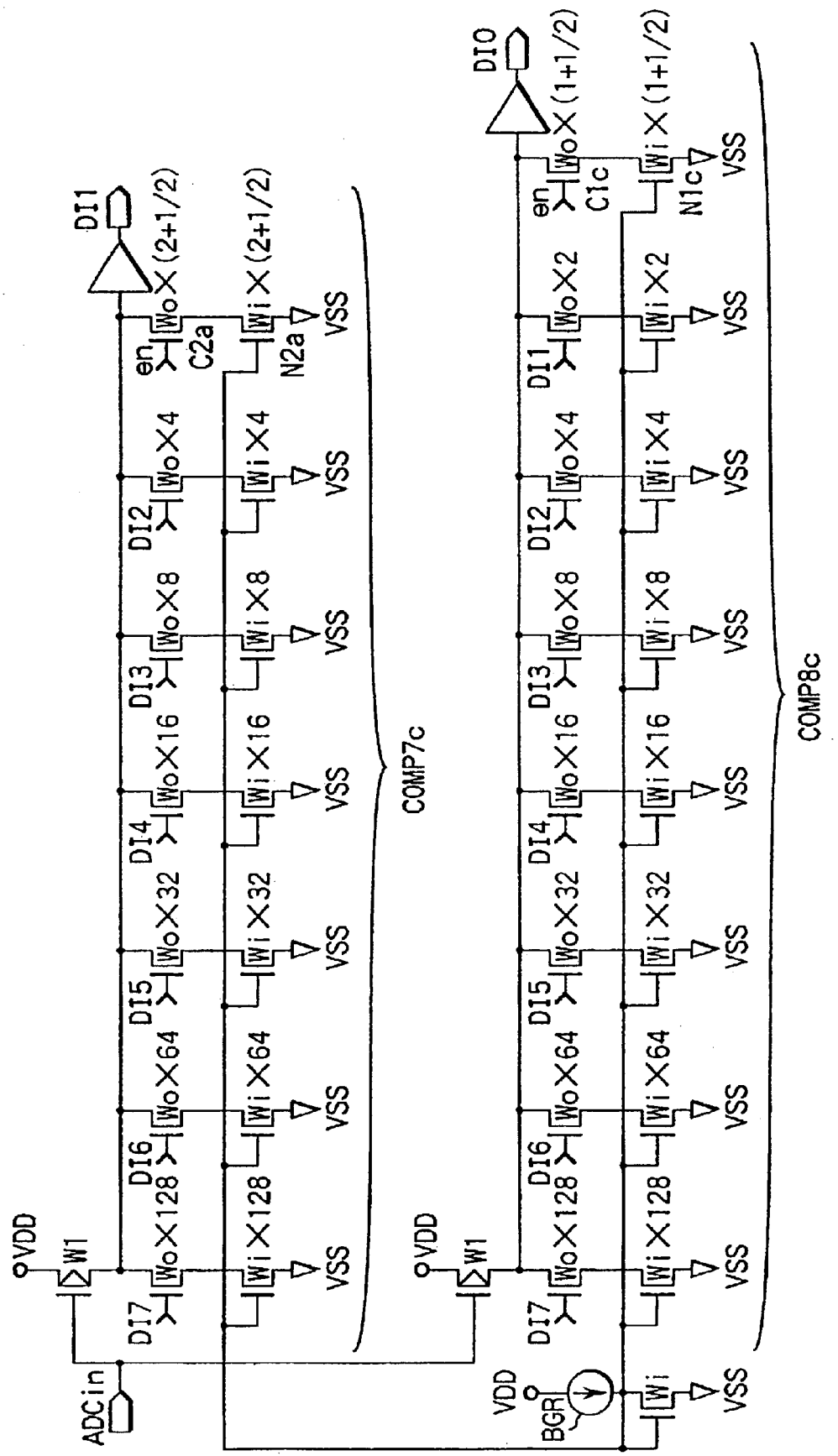
Figure 34:
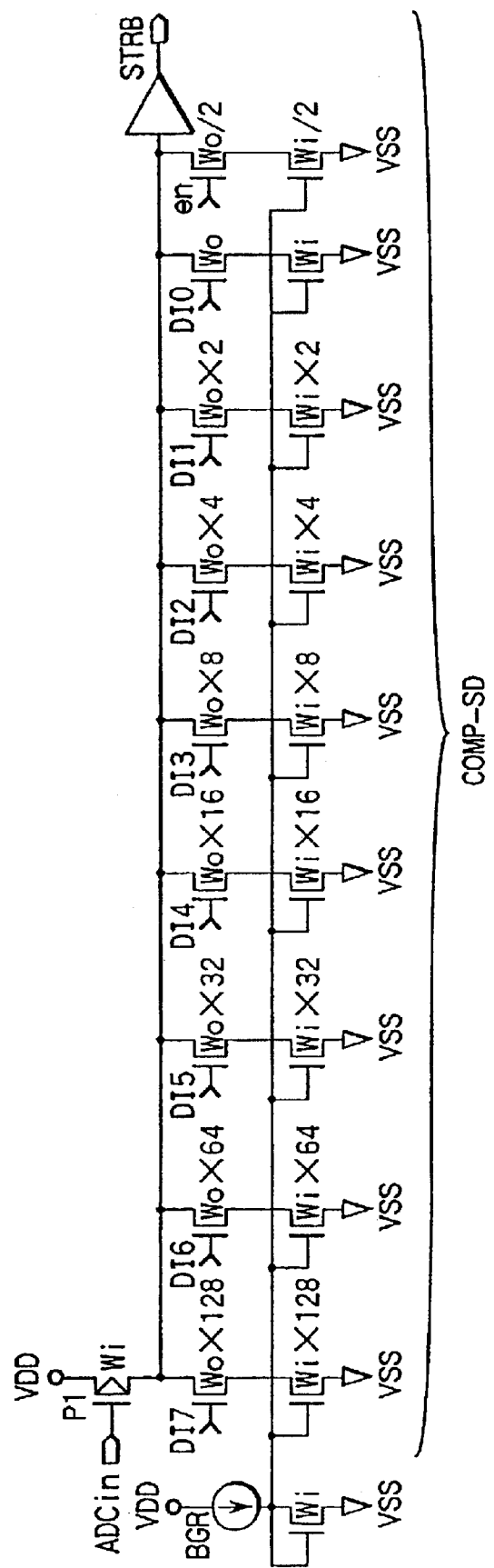

Alternatively, the one bit of strobe signal (clock signal) STRB may be assigned to an upper bit or a lower bit than the 8-bit binary voltage data DO7–DO0. FIGS. 28 to 30 illustrate a first exemplary modification in which the strobe signal STRB is assigned to an upper bit, and FIGS. 31 to 34 illustrate a second exemplary modification in which the strobe signal STRB is assigned to a lower bit.

The ADC illustrated in FIGS. 28 to 30 differs from the ADC illustrated in FIGS. 21 to 24 in that the strobe signal (clock) STRB is used in place of the comparison enable signal en, and in the sizes of NMOS transistors C8b–C1b applied at their gates with the strobe signal; the sizes of weight current source NMOS transistors N8b–N1b connected in series with the NMOS transistors C8b–C1b; and the configuration of a strobe signal comparator circuit COMP-SU. Since the rest of the configuration is identical, reference numerals are omitted for parts included therein.

Specifically, the ADC illustrated in FIGS. 28 to 30 is characterized by comprising a clock signal compactor circuit COMP-SU for comparing a current value weighted $2^n$ times as high as a reference current, delivered in response to the comparison enable signal en, with an input current to determine the logical level of the strobe signal STRB; a first comparator circuit COMP1b for comparing a current value weighted $(2^n+2^{n-1})$ times as high as the reference current, delivered in response to the strobe signal STRB, with the input current to determine the logical level of the n-th bit, which is the most significant bit of n-bit binary data; a second comparator circuit COMP2b responsive to the logical level of the n-th bit for comparing a current value produced by subtracting a current value $2^{n-1}$ times as high as the reference current from the input current or the input current with a current $(2^n+2^{n-2})$ times as high as the reference current, delivered in response to the strobe signal STRB, to determine the logical level of the (n–1)th bit of the binary data; and a third comparator circuit COMP3b to an n-th comparator circuit COMPnb each for comparing a current produced by subtracting a current value which is a multiple of the reference current in accordance with a combination of logical levels of upper bits of the binary data from the input current or the input current with a corresponding one of currents $(2^n+2^{n-3})$ to $(2^n+2^0)$ times as high as the reference current, delivered in response to the strobe signal STRB, to determine the logical levels of the (n–2)th to the least significant bits of the binary data.

The operation of the ADC illustrated in FIGS. 28 to 30 is basically similar to the operation of the ADC illustrated in FIGS. 21 to 24, except that the strobe signal STRB is assigned to an upper bit than the 8-bit binary voltage data DO7–DO0 for AD conversion.

The ADC illustrated in FIGS. 31 to 34 differs from the ADC illustrated in FIGS. 21 to 24 in the sizes of NMOS transistors C8c–C1c applied at their gates with the comparison enable signal en; the sizes of weight current source NMOS transistors N8c–N1c connected in series with the NMOS transistors C8c–C1c; and the configuration of a strobe signal comparator circuit COMP-SD. Since the rest of the configuration is identical, reference numerals are omitted for parts included therein.

Specifically, the ADC illustrated in FIGS. 31 to 34 is characterized by comprising a first comparator circuit COMP1c for comparing a current value weighted $(2^{n-1}+½)$ times as high as the reference current, delivered in response to the comparison enable signal en, with the input current to determine the logical level of the n-th bit, which is the most significant bit of n-bit binary data; a second comparator circuit COMP2c responsive to the logical level of the nth bit for comparing a current value produced by subtracting a current value $2^{n-1}$ times as high as the reference current from the input current or the input current with a current $(2^{n-2}+½)$ times as high as the reference current, delivered in response to the comparison enable signal en, to determine the logical level of the (n–1)th bit of the binary data; a third comparator circuit COMP3c to an n-th comparator circuit COMPnc each for comparing a current produced by subtracting a current value which is a multiple of the reference current in accordance with a combination of logical levels of upper bits of the binary data from the input current or the input current with a corresponding one of currents $(2^{n-3}+½)$ to $(2^0+½)$ times as high as the reference current, delivered in response to the comparison enable signal en, to determine the logical levels of the (n–2)th to the least significant bits of the binary data; and a clock signal compactor circuit COMP-SD for comparing a current produced by subtracting a current value which is a multiple of the reference current in accordance with a combination of logical levels of the most significant to the least significant bits of the binary data from the input current or the input current with a current one half the reference current, delivered in response to the comparison enable signal en, to determine the logical level of the strobe signal STRB.

The operation of the ADC illustrated in FIGS. 31 to 34 is basically similar to the operation of the ADC illustrated in FIGS. 21 to 24, except that the strobe signal STRB is assigned to a lower bit than the 8-bit binary voltage data DO7–DO0 for AD conversion.

In this manner, in the case that the strobe signal STRB is the least significant bit, a determination or judgement about the strobe signal STRB is made lastly. For this reason, the data is latched at the first transition of the strobe signal STRB.

Incidentally, when the strobe signal STRB is the most significant bit, the determination about the strobe signal STRB is made first. For this reason, as shown in FIG. 19B, after the strobe signal STRB is delayed for the time required for AD conversion of bit DO7 to bit DO0 in a delay circuit 171, data is latched at the first transition of the delayed strobe signal. Alternatively, as shown in FIG. 19C, after the strobe signal STRB is inverted in an inverter 172, data may be latched at the last transition of the inverted strobe signal/STRB.

<Relationship between Reference Current of DAC and Reference Current of ADC, and First to Third Exemplary Modifications to Reference Current Source>

For accurately conducting the DAC circuit operation and the ADC circuit operation, the reference current of the ADC may be set higher than one half the reference current of the DAC and smaller than twice the reference current of the DAC.

Also, for increasing an operational margin for an amplifier circuit on the ADC output side, the amplitude of an input potential to the amplifier circuit is desirably made larger, in which case the reference current of the ADC should be set equal to or higher than the reference current of the DAC and lower than twice the reference current of the DAC.

Figure 35:
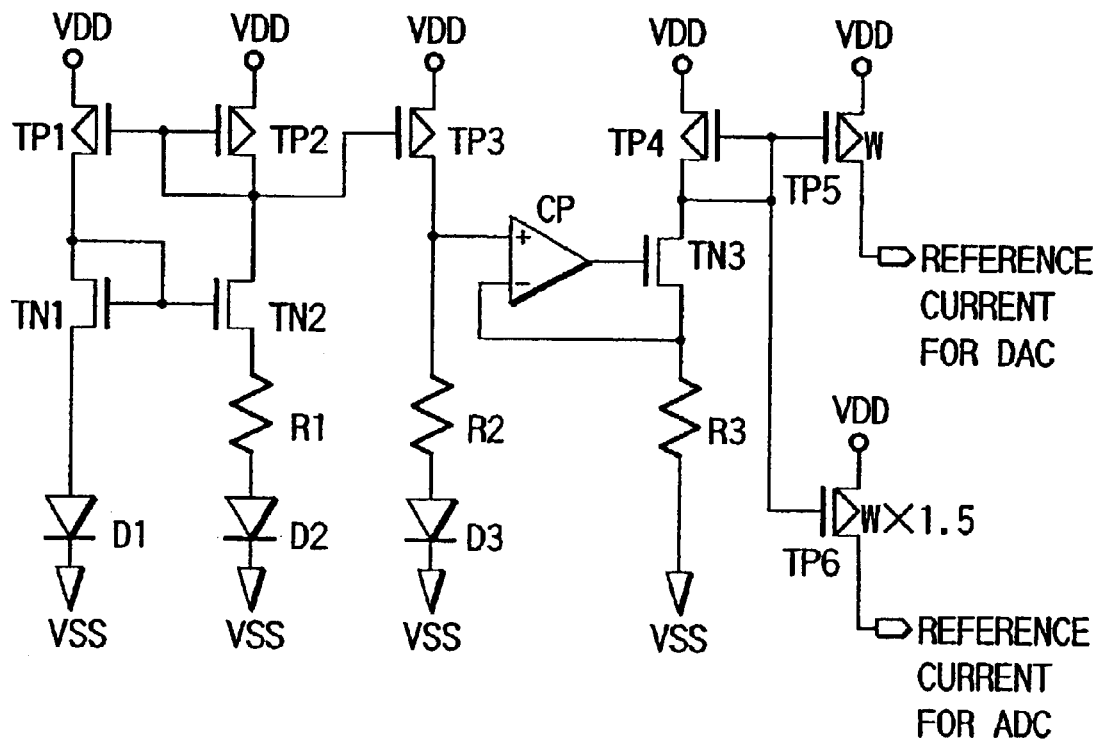
FIG. 35 is a circuit diagram illustrating a first exemplary modification to the reference current source.

The value of the reference current may be determined to meet particular specifications based on the relationship between the reference currents of the DAC and the ADC as mentioned. In this case, as illustrated in FIG. 35, the current value of the BGR may be used as it is as the reference current for the DAC, while the reference current for the DAC multiplied, for example, by 1.5 may be used as the reference current for the ADC. Alternatively, as illustrated in FIGS. 36 and 37, a reference current source may be provided in a data transmission system such that a current value of the reference current source is used as the reference current for the DAC, while the current value of the reference current multiplied, for example, by 1.5 is used as the reference current for the ADC.

FIG. 35 illustrates an exemplary circuit of the reference current source when a current value of a BGR in an LSI is used as a reference current for a DAC, and a current value 1.5 times the current value of the BGR is used as a reference current for an ADC.

The circuit illustrated in FIG. 35 supplies an output current of the PMOS transistor TP5 connected to the PMOS transistor TP4 in current mirror configuration and having a size W in the output stage of the BGR illustrated in FIG. 15 as the reference current for the DAC, and supplies an output current of the PMOS transistor TP6 connected to the PMOS transistor TP4 in current mirror configuration and having a size of 1.5×W as the reference current for the ADC. In FIG. 35, parts identical to those in FIG. 15 are designated the same reference numerals.

Figure 36:
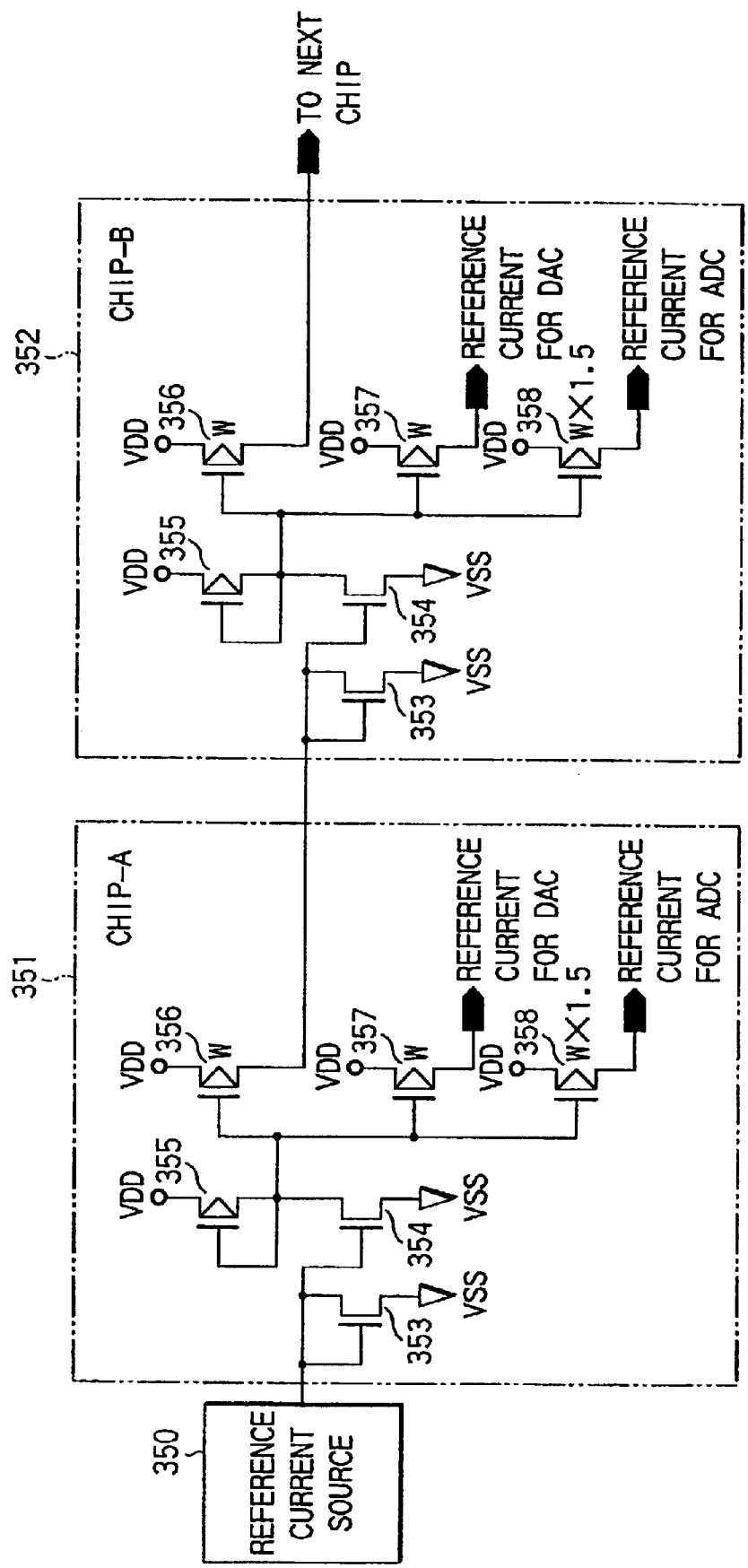
FIG. 36 is a circuit diagram illustrating a second exemplary modification to the reference current source.
Figure 37:
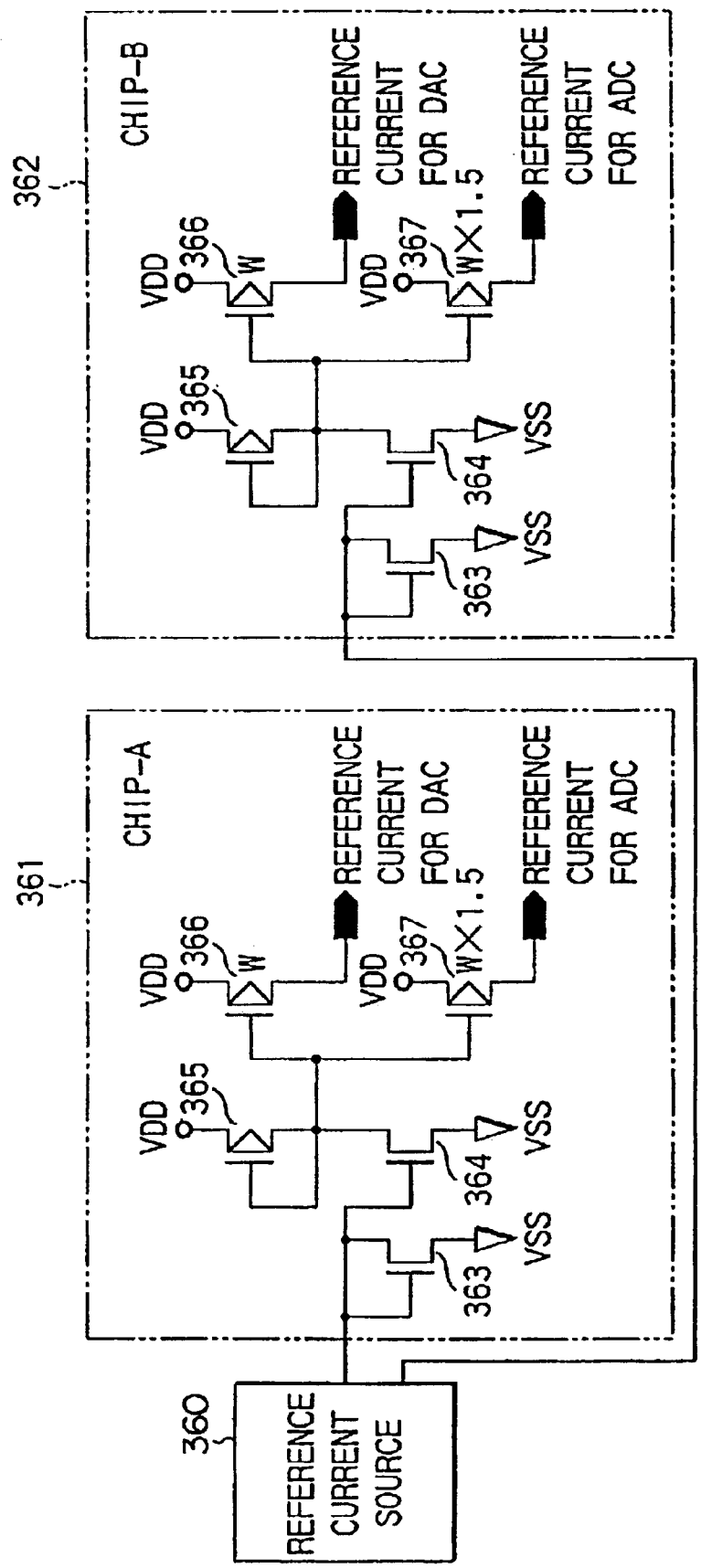
FIG. 37 is a circuit diagram illustrating a third exemplary modification to the reference current source.

FIG. 36 illustrates an exemplary circuit for use with a daisy chain connected data transmission system in which the values of reference currents for a DAC and an ADC in an LSI are determined by an external reference current source, a current value of the reference current source is used as the reference current for the DAC, and the current value of the reference current source multiplied by 1.5 is used as the reference current for the ADC.

In FIG. 36, a first LSI chip 351 receives the reference current input from an external reference current source 350 (for example, a controller) by a current mirror circuit comprised of NMOS transistors 353, 354, and receives this reference current by a current mirror circuit comprised of PMOS transistors 355, 356. Further, PMOS transistors 357, 358 are connected to the PMOS transistor 355 in current mirror configuration. In this case, assuming that the size of the PMOS transistors 356, 357 is W, the size of the PMOS transistor 358 is set at 1.5×W. Then, an output current of the PMOS transistor 357 is supplied as the reference current for the DAC, an output current of the PMOS transistor 358 is supplied as the reference current for the ADC, and an output current of the PMOS transistor 356 is transmitted to a second LSI chip 352 in the next stage as a reference current.

The second LSI chip 352, which also has a configuration similar to the first LSI chip 351, receives the reference current input from the first LSI 351 in the preceding stage by a current mirror circuit comprised of NMOS transistors 353, 354, supplies an output current of a PMOS transistor 357 as a reference current for a DAC, supplies an output current of a PMOS transistor 358 as a reference current for the ADC, and transmits an output current of a PMOS transistor 356 as a reference current to an LSI chip in the next stage.

FIG. 37 illustrates an exemplary circuit of the reference current source for use with a star connected data transmission system when the values of reference currents for a DAC and an ADC in an LSI are determined by an external reference current source (for example, a controller), a current value of the reference current source is used as the reference current for the DAC, and the current value of the reference current source multiplied by 1.5 is used as the reference current for the ADC.

In FIG. 37, a first LSI chip 361 receives a reference current input from an external reference current source 360 (for example, a controller) by a current mirror circuit comprised of NMOS transistors 363, 364, and receives this reference current by a current mirror circuit comprised of PMOS transistors 365, 366. Further, a PMOS transistor 367 is connected to the PMOS transistor 365 in current mirror configuration.

In this case, assuming that the size of the PMOS transistor 366 is W, the size of the PMOS transistor 367 is set at 1.5×W. Then, an output current of the PMOS transistor 366 is supplied as the reference current for a DAC, and a output current of the PMOS transistor 367 is supplied as a reference current for an ADC. A second LSI chip 362 also has a similar configuration to the first LSI chip 361 and operates in a similar manner. However, the second LSI chip 362 receives a different current output from that received by the first LSI chip 361.

<Thirteenth Embodiment>

In the aforementioned daisy chain connected data transmission system, a transfer of a current from an LSI in the preceding stage to an LSI in the next stage involves a low efficiency resulting from a DA conversion of a once ADconverted current input to produce a current output. In the following, description will be made on a thirteenth embodiment which improves the efficiency in this respect.

Figure 38:
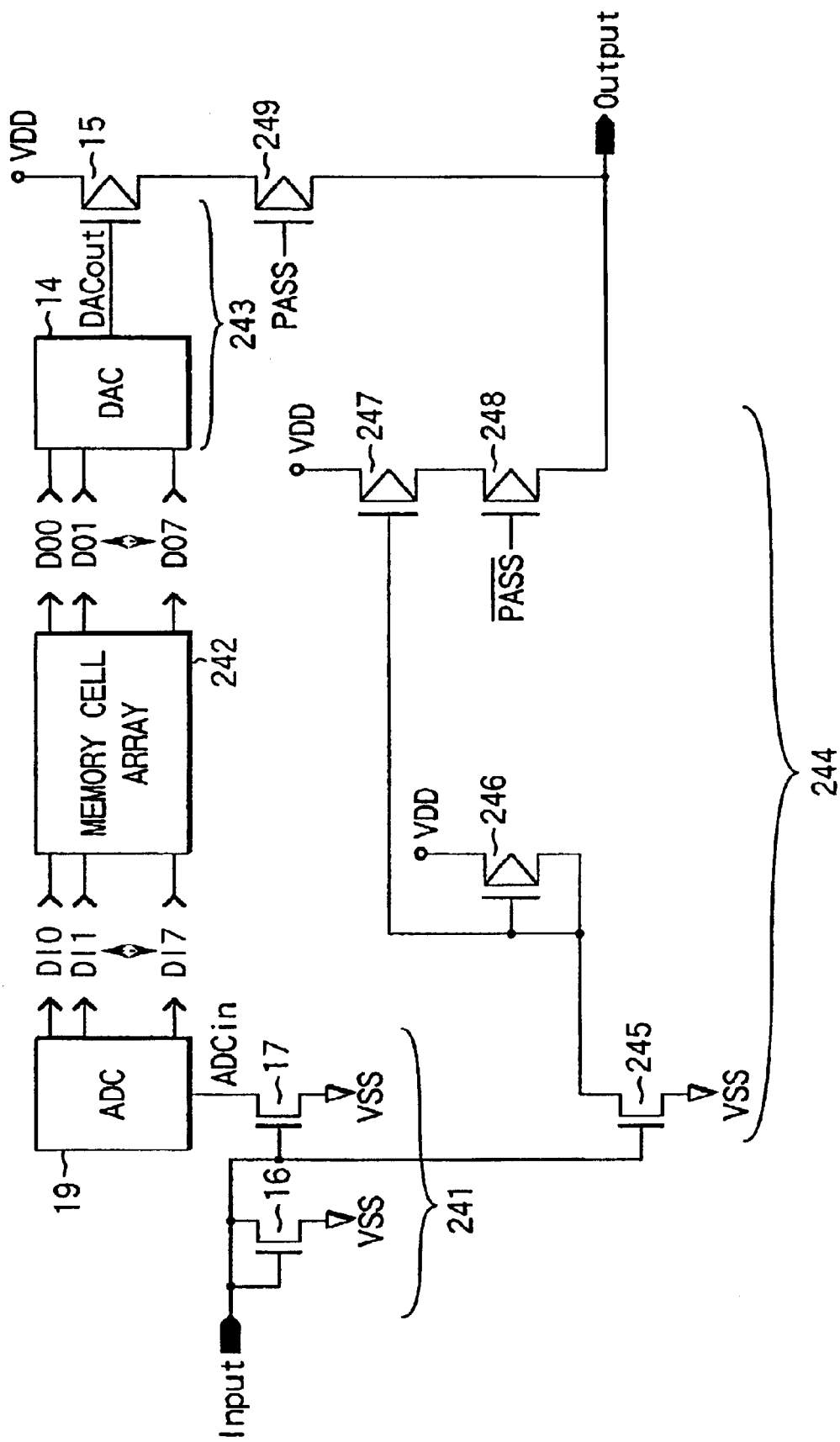
FIG. 38 is a circuit diagram schematically illustrating a memory LSI which is adapted to a daisy chain connected data transmission system according to a thirteenth embodiment.

FIG. 38 is a circuit diagram schematically illustrating a memory LSI adapted to a daisy chain connected data transmission system according to the thirteenth embodiment.

Specifically, the memory LSI illustrated in FIG. 38 comprises a current input type data input circuit portion 241 connected to an external data line; a memory cell array 242 for storing voltage data output from an ADC 19 in the data input circuit portion; a current output type data output circuit portion 243 for converting voltage data output from the memory cell array 242 by a DAC 14 to output converted voltage data to an external data line; and a current transfer circuit 244 for transferring an input current from the external data line connected to the preceding stage without AD conversion, as it is, to the external data line connected to the rear stage, as a current output.

The current transfer circuit 244 comprises an NMOS transistor 245 connected in current mirror configuration to a current input NMOS transistor 16 in the data input circuit portion 241; a PMOS transistor 246 having a gate and a drain connected to a path on which a current from the NMOS transistor 245 flows; a PMOS transistor 247 connected to the PMOS transistor 246 in current mirror configuration; and a current transfer PMOS transistor 248 connected, between the PMOS transistor 247 and a current output node and applied at a gate with an inverted version of a transfer enable signal/PASS.

The current output type data output circuit portion 243 has a PMOS transistor 249, which is applied at a gate with the transfer enable signal PASS, inserted between a current output PMOS transistor 15 and the current output node.

Therefore, when the signal/PASS is inactive (at "HIGH" level), the current transfer PMOS transistor 248 turns off, and the current output PMOS transistor 249 turns on, causing current data to be output in accordance with voltage data output from the memory cell array 242.

Conversely, as the signal/PASS becomes active ("LOW" level), the current transfer PMOS transistor 248 turns on, and the current output PMOS transistor 249 turns off, thereby making it possible to transfer an input current from an LSI in the preceding stage without AD conversion, as it is, to an LSI in the subsequent stage as a current output.

According to the thirteenth embodiment, the power consumption can be reduced as compared with the configuration which once AD converts an input current and then DA converts the AD converted current input to output a current.
<Fourteenth Embodiment>

In the aforementioned daisy chain connected data transmission system, transmitted current data is not limited to one type, but a plurality of types of data may be selected. In the following, description will be made on a fourteenth embodiment which is considered in this respect.

Figure 39:
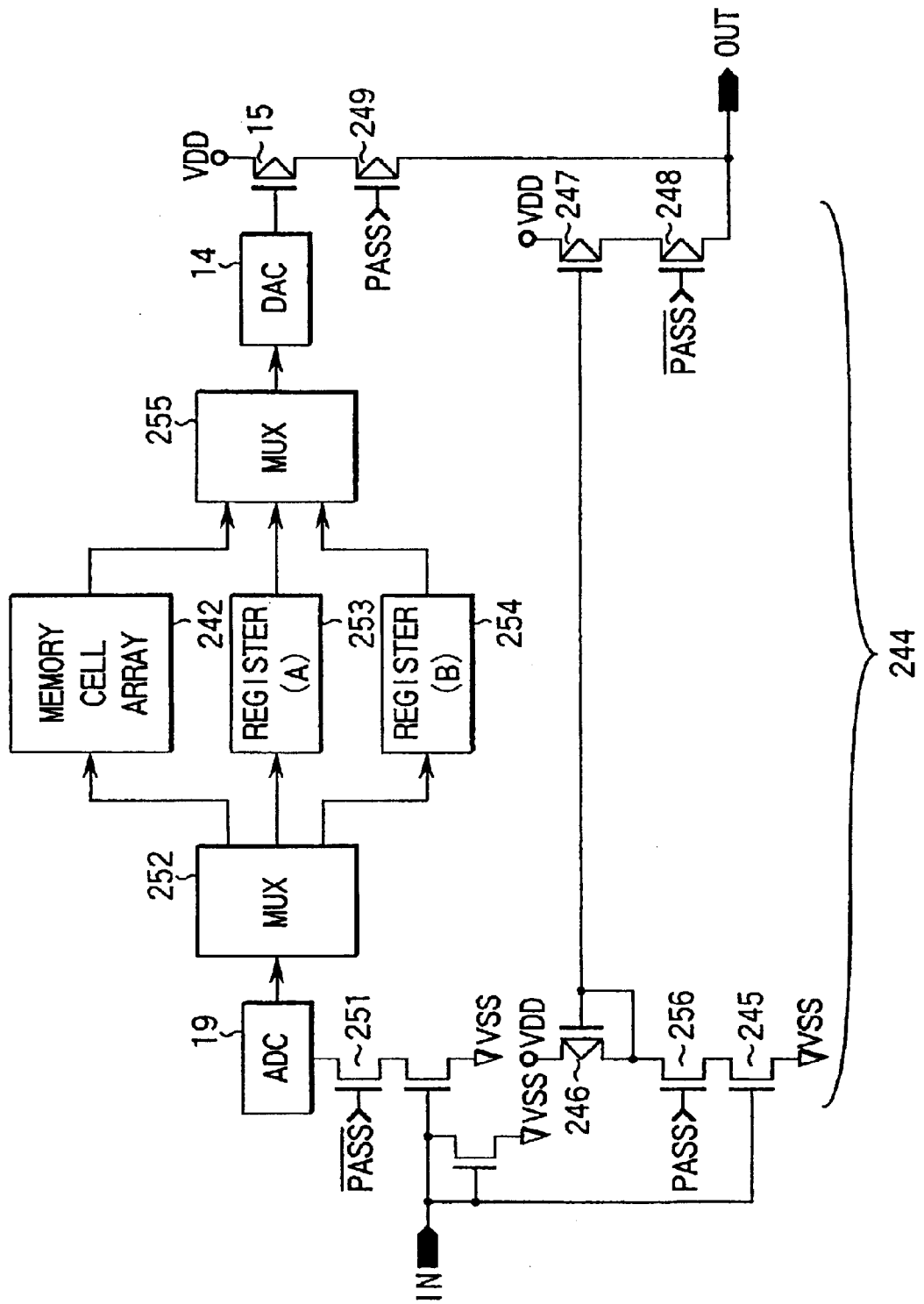
FIG. 39 is a circuit diagram schematically illustrating a memory LSI which is adapted to a daisy chain connected data transmission system according to a fourteenth embodiment.

FIG. 39 is a circuit diagram schematically illustrating a memory LSI adapted to a daisy chain connected data transmission system according to the fourteenth embodiment, wherein parts identical to those in FIG. 38 are designated the same reference numerals.

In a data input circuit portion of this memory LSI, an input signal from an external data line from the preceding stage is input to an ADC 19 through an NMOS transistor 251 which is applied at a gate with a signal/PASS. Binary converted output data, generated by the ADC 19, is selectively stored in a memory cell array 242, a register (A) 253, and a register (B) 254 by a first multiplexer (MUX) 252. Also, output data from the memory cell array 242, register (A) 253 and register (B) 254 are selectively switched by a second MUX 255 for input to a DAC 14. Then, a current in accordance with a denary converted output generated by the DAC 14 is output to an output data line connected to the subsequent stage through a PMOS transistor 249 which is applied at a gate with the transfer enable signal PASS.

Also, the input current from the external data line from the preceding stage is input to a current transfer circuit 244 whose current transfer operation is controlled by a transfer NMOS transistor 256 applied at a gate with the transfer enable signal PASS and a PMOS transistor 248 applied at a gate with the signal/PASS to output the input current to the external data line connected to the subsequent stage.
<Exemplary Modification to Fourteenth Embodiment>

In the fourteenth embodiment described above, it is assumed that a current transmitted through the external data line only comprises data. The present invention, however, is not limited to the transfer of data, and a control signal may be included in data, as described above. In the following, description will be made on an exemplary modification which is considered in this respect.

Figure 40:
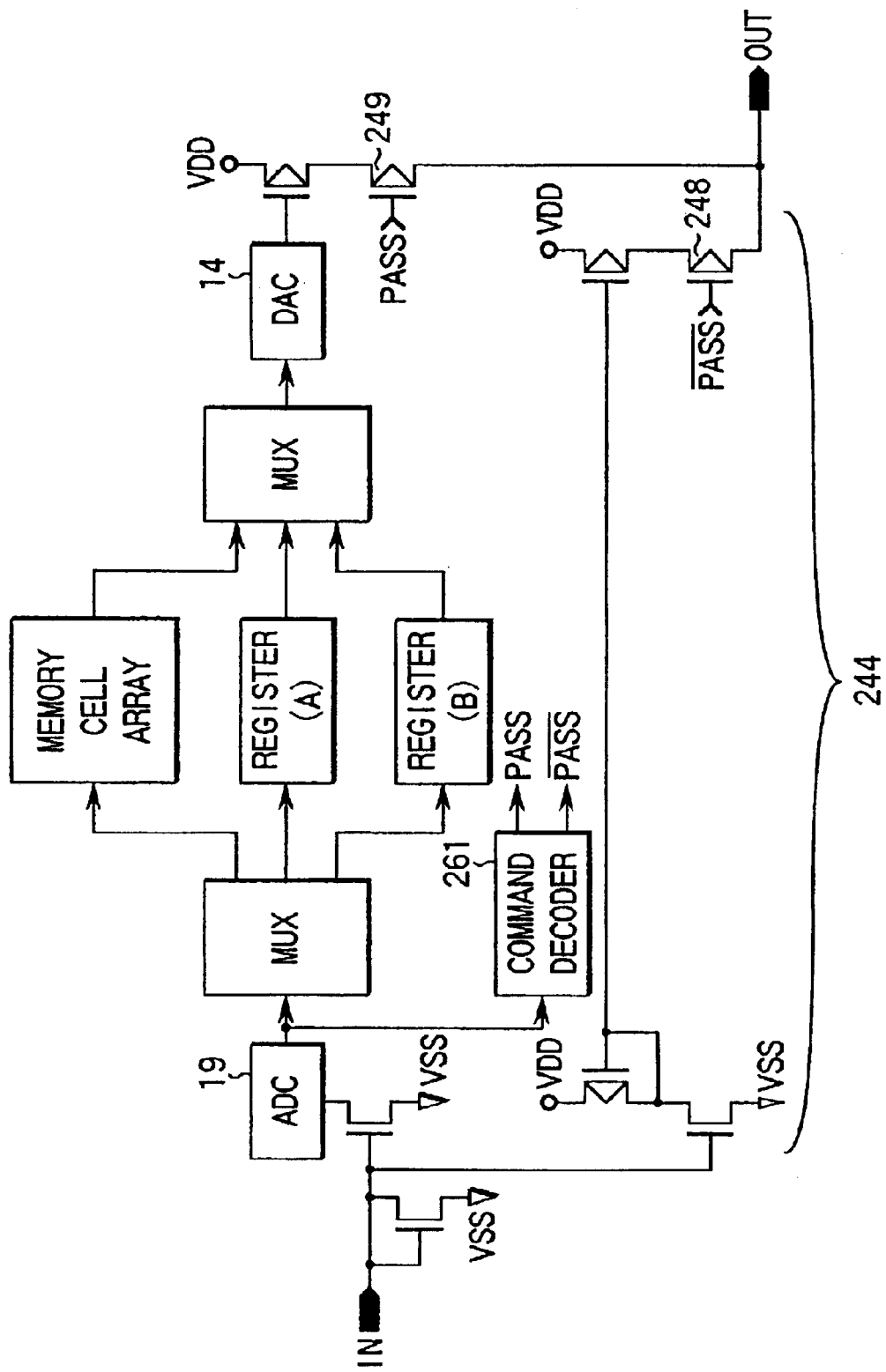
FIG. 40 is a circuit diagram schematically illustrating a memory LSI according to an exemplary modification to the fourteenth embodiment.

FIG. 40 is a circuit diagram schematically illustrating a memory LSI according to an exemplary modification to the fourteenth embodiment.

The LSI illustrated in FIG. 40 differs from the LSI previously described with reference to FIG. 39 in that a control signal included in data converted from an input current by an ADC 19 is input to a command decoder 261. The command decoder 261 controls complimentary signals PASS and /PASS, which are decoded outputs, to be active/inactive in accordance with the results of interpreting the contents of the control signal included in the data. Specifically, the signals PASS, /PASS are activated (PASS is at "HIGH" and /PASS is at "LOW") when the current transfer circuit 244 is forced to transfer an input current, and the signals PASS, /PASS are deactivated (PASS is at "LOW" and /PASS is at "HIGH") when data again converted by the DAC 14 itself from the data is output.

When the signals PASS, /PASS are activated, the current transfer transistor 248 turns on, and the data output transistor 249 turns off. Conversely, when the signals PASS, /PASS are deactivated, the current transfer transistor 248 turns off, and the data output transistor 249 turns on.
<Fifteenth Embodiment>

Figure 41:
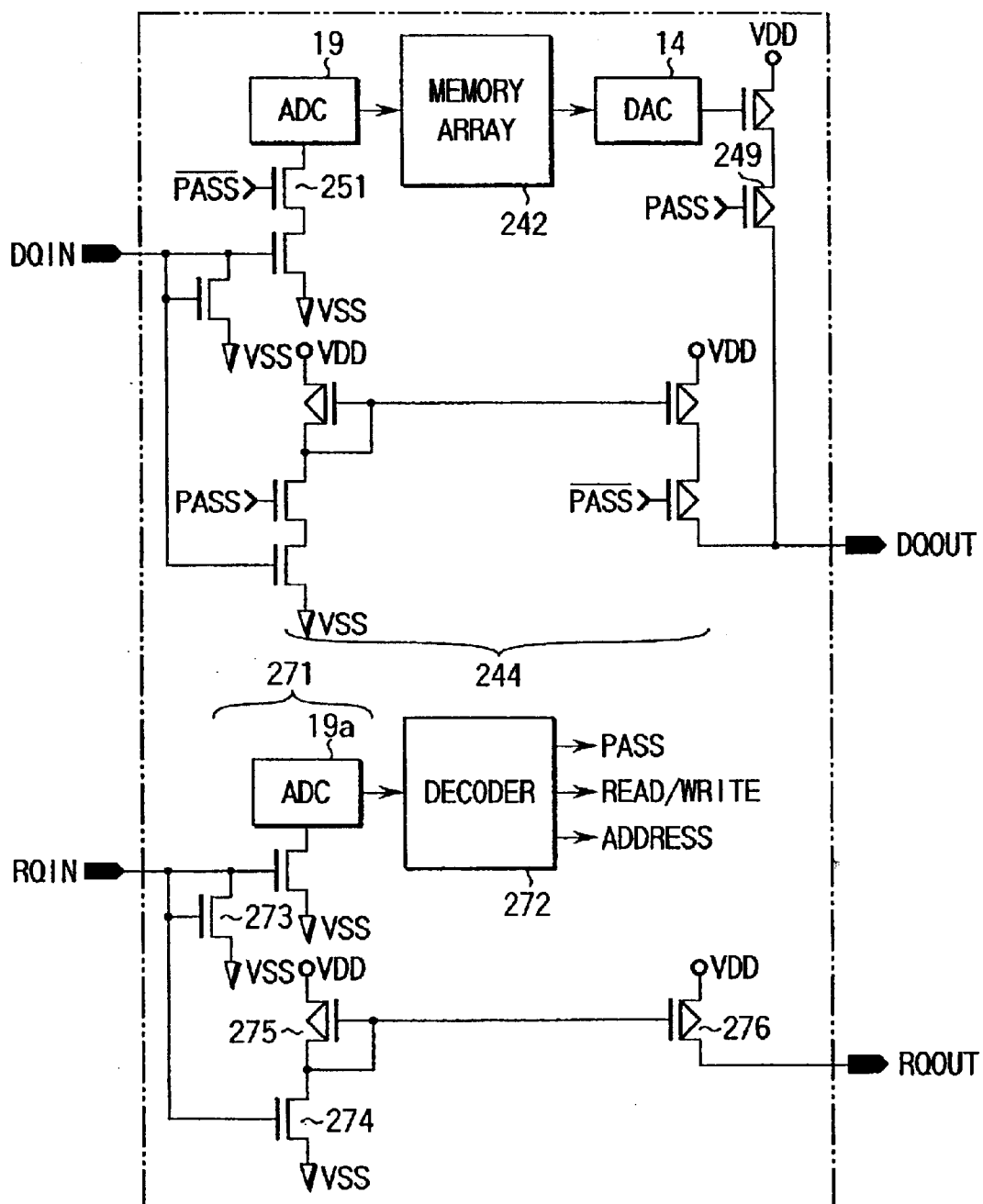
FIG. 41 is a circuit diagram schematically illustrating a memory LSI which is adapted to a daisy chain connected data transmission system according to a fifteenth embodiment.

FIG. 41 is a circuit diagram schematically illustrating a memory LSI adapted to a daisy chain connected data transmission system according to a fifteenth embodiment.

This memory LSI separates a transmission path for data (DQ) from a transmission path for control signals such as Read/Write, and an address signal (RQ).

Specifically, the transmission path for data (DQ) is substantially similar to the configuration of the memory LSI previously described with reference to FIG. 39 from which the two multiplexers 252, 255, the two registers (A) 253, and the register (b) 254 are omitted, and receives a current data input DQIN from a data input line connected to the preceding stage, and outputs a current data output DQOUT to a data output line connected to the subsequent stage.

On the other hand, the transmission path for the control signal/address signal (RQ) comprises a current input type control signal/address signal input circuit portion 271 which receives a control signal/address signal input RQIN from a control signal/address signal input line connected to the preceding stage; a decoder 272 for decoding voltage data output from a ADC 19a in the input circuit portion to output control signals such as a transfer enable signal PASS, Read/Write and so on, as well as an address signal; an NMOS transistor 274 connected to a current input NMOS transistor 273 in current mirror configuration in the control signal/address signal input circuit portion 271; a PMOS transistor 275 passed through by a current from the NMOS transistor 274 and having a gate and a drain connected to each other; and a PMOS transistor 276 connected to the PMOS transistor 275 in current mirror configuration, having a drain connected to a control signal/address signal output node, and adapted to output a control signal/address signal line current output RQOUT to a control signal/address signal line connected to the subsequent stage.

<Sixteenth Embodiment>

Figure 42:
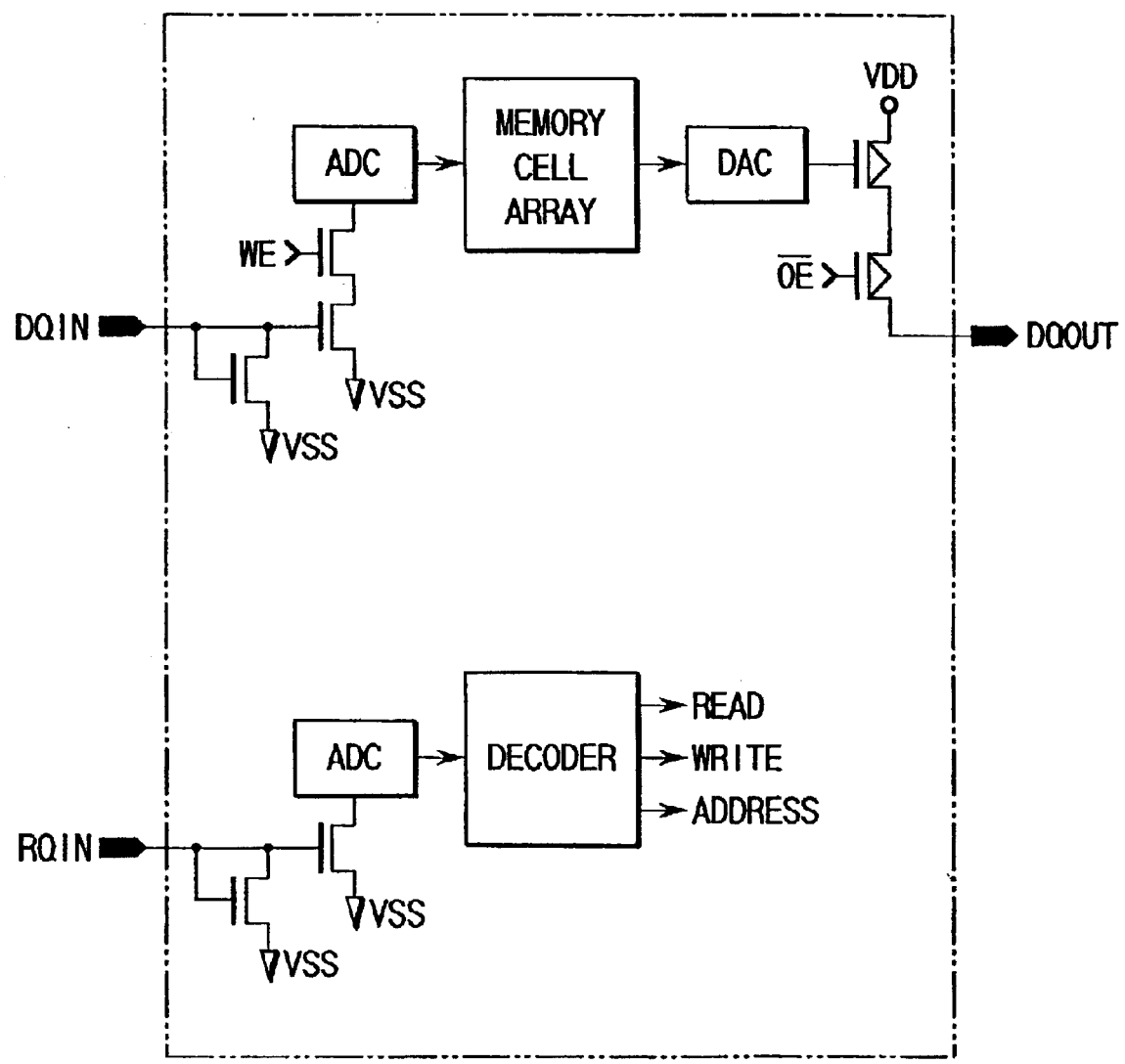
FIG. 42 is a circuit diagram schematically illustrating a memory LSI which is adapted to a star connected data transmission system according to a sixteenth embodiment.

FIG. 42 is a circuit diagram schematically illustrating a memory LSI adapted to a star connected data transmission system according to a sixteenth embodiment.

This memory LSI differs from the memory LSI previously described with reference to FIG. 41 in that, for accommodating the star connected configuration, the current transfer circuits are omitted from the transmission path for the data (DQ) and from the transmission path for the control signal/address signal (RQ), and an input enable signal WE is used in place of the signal /PASS, and an output enable signal /OE is used in place of the signal PASS.

The input/output operation of this memory LSI with a data transmission system is basically similar to the input/output operation of the memory LSI, previously described with reference to FIG. 41, with a data transmission system, except for some aspects due to the difference in the communication protocol between the star connected data transmission system and the daisy chain connected data transmission system.

<First Exemplary Modification to Fifteenth Embodiment and Sixteenth Embodiment>

While in the fifteenth and sixteenth embodiments, the control signals and address signal are transferred on the same transmission path, the present invention is not limited to the grouping of the control signals and address signal. Alternatively, the control signals and address signal may be separated from each other.

<Second Exemplary Modification to Fifteenth Embodiment and Sixteenth Embodiment>

While the fifteenth embodiment and the sixteenth embodiment each provide a set of transmission path for data (DQ), transmitted data may be increased to two or more sets, in which case additional transmission paths for data (DQ) may be provided corresponding to the increase in the number of sets of the transmitted data.

<Seventeenth Embodiment>

While in the foregoing embodiment, the strobe signal current is multiplexed on the data current, a clock signal current can also be multiplexed on a data current. In the following, description will be made on a seventeenth embodiment which is considered in this respect.

Figure 43:
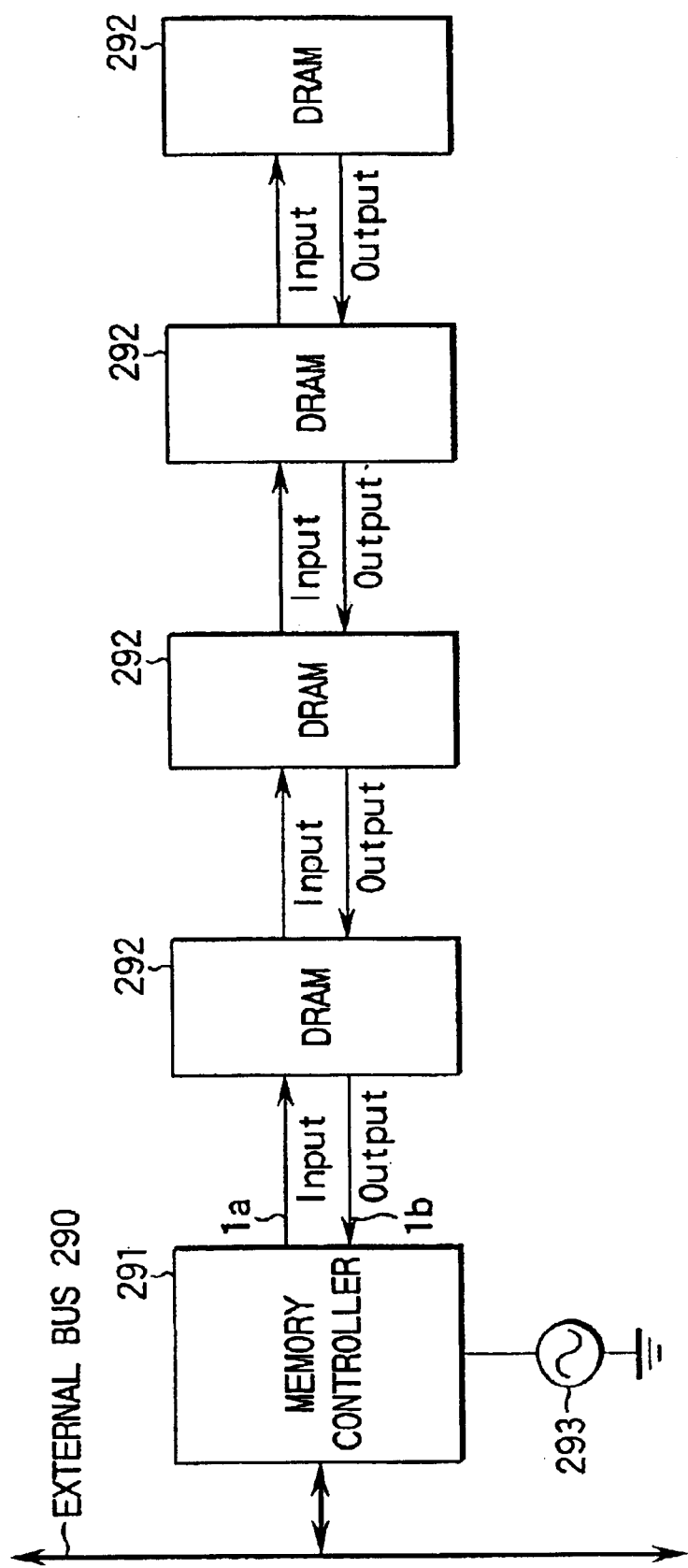
FIG. 43 is a block diagram illustrating a daisy chain connected data transmission system according to a seventeenth embodiment.

FIG. 43 is a block diagram illustrating a daisy chain connected data transmission system according to a seventeenth embodiment.

FIG. 43 illustrates a system configuration in which a plurality of DRAMs 292 are daisy chain connected to a single memory controller 291 through two unidirectional data lines 1a, 1b, and the controller 291 is connected to an external bus 290.

The memory controller 291 of this data transmission system receives a clock signal in a voltage mode input from a clock signal source 293, converts the clock signal in the voltage mode to a clock signal in a current mode to output the clock signal in the current mode at all times, and multiplexes a data current on a clock current output when data is output.

In the DRAM 292 of this data transmission system, a current driving circuit may be implemented, as is the case of multiplexing a strobe signal current on a data current for transmission, for example, as illustrated in FIG. 19A.

For this configuration, a circuit, for example, as illustrated in FIG. 20 may be used as the DAC 14a in the output portion of the current driving circuit illustrated in FIG. 19A, with a clock signal Clock used in place of the strobe signal S1RB. In addition, a circuit, for example, as illustrated in FIGS. 21 to 23, may be provided as the ADC 19a in the input portion of the current driving circuit, with the clock signal Clock used in place of the strobe signal STRB.

Figure 44:
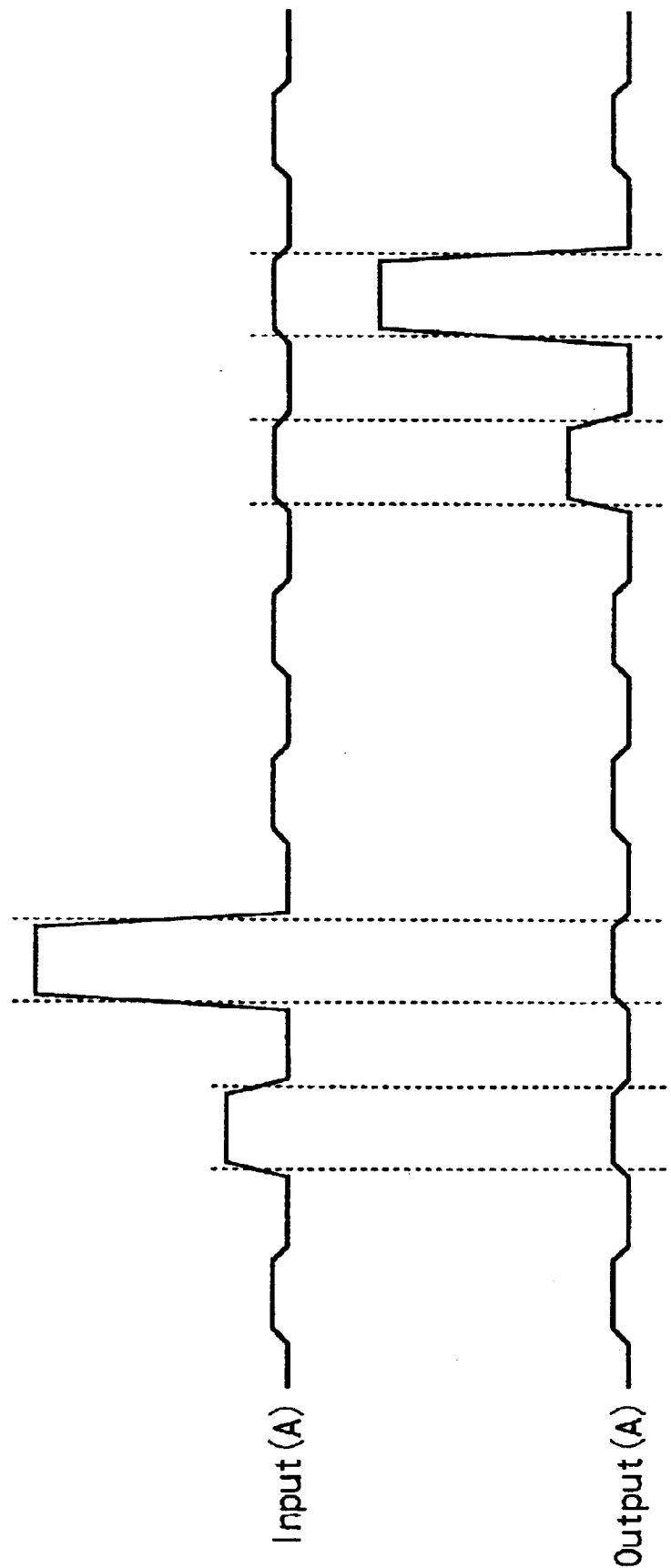
FIG. 44 is a waveform chart showing an exemplary operation when a data current is multiplexed on a clock signal current in the data transmission system illustrated in FIG. 42.

FIG. 44 is a waveform chart showing an exemplary operation of the data transmission system illustrated in FIG. 43 when the data current is multiplexed on the clock signal current.

<Exemplary Modification to Seventeenth Embodiment>

A reference current may be sent as the clock signal, and received to generate a clock signal voltage therefrom. In the following, description will be made on an exemplary modification which is considered in this respect.

Figure 45:
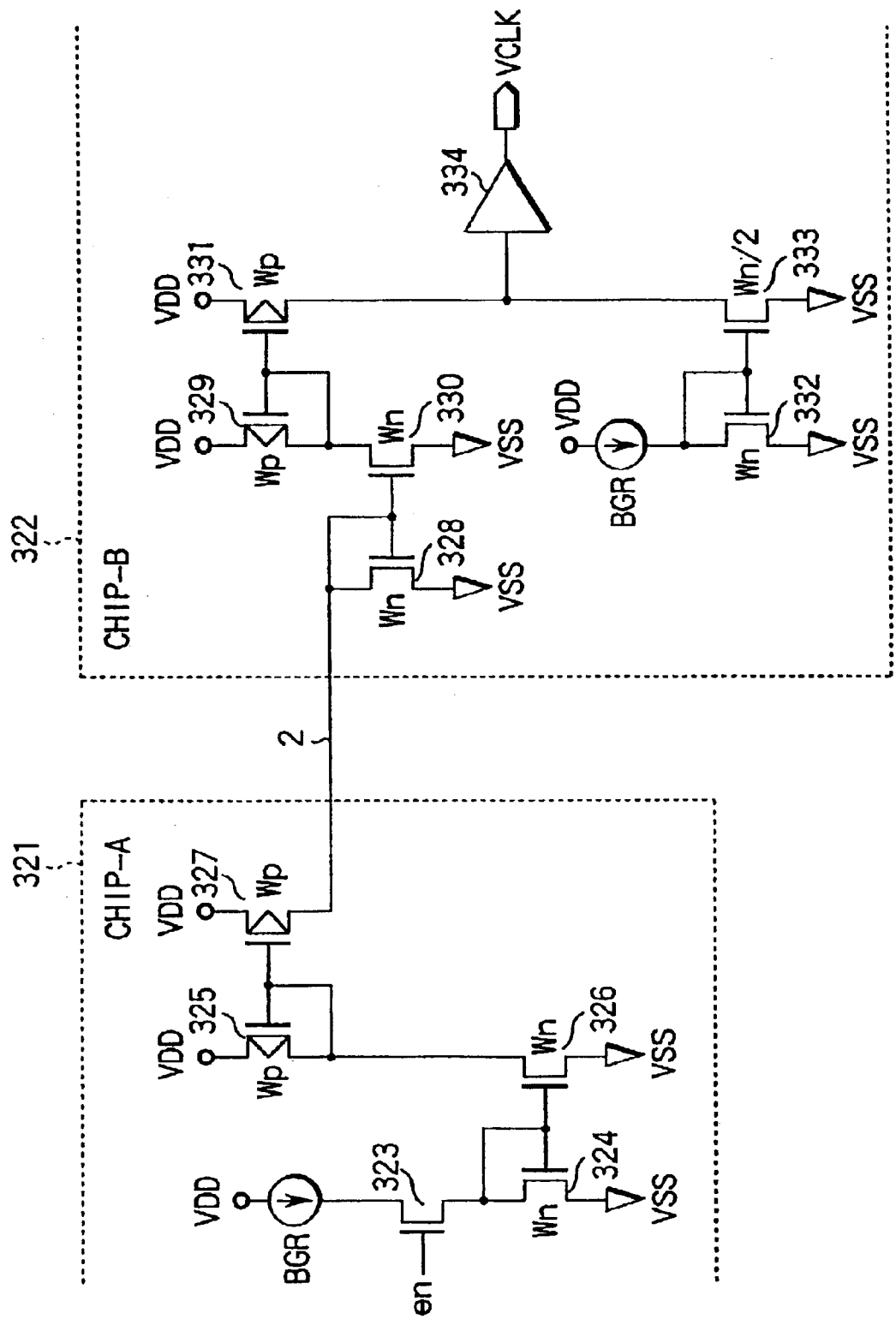
FIG. 45 is a circuit diagram illustrating an exemplary modification to the seventeenth embodiment.

FIG. 45 is a circuit diagram illustrating an example of a current driving circuit for outputting a clock signal as a current and a circuit for converting the clock signal current to a clock signal voltage in a data transmission system according to an exemplary modification to the seventeenth embodiment.

In FIG. 45, a first LSI 321 for a controller has a reference current source BGR, an NMOS transistor 323 applied at a gate with a clock source signal en, and an NMOS transistor 324 having a drain and a gate connected to each other, connected in series between a power supply node and a ground node. Likewise, a PMOS transistor 325 having a gate and a drain connected to each other, and an NMOS transistor 326 are connected in series between the power supply node and the ground node. The two NMOS transistors 324, 326 have their gates connected to each other to form a current mirror circuit. Then, a current output PMOS transistor 327 is connected to the PMOS transistor 325 in current mirror configuration.

According to the first LSI configured as described above, it is possible to output a current output from the drain of the current output PMOS transistor 327 to the external signal line (strobe signal line) 2 as the clock signal Clock.

In a second LSI 322, on the other hand, an NMOS transistor 328 having a drain and a gate connected to each other receives the strobe signal current from the strobe external signal line 2. Then, a PMOS transistor 329 having a gate and a drain connected to each other, and an NMOS transistor 330 are connected in series between a power supply node and a ground node. The NMOS transistor 330 is connected to the NMOS transistor 328 in current mirror configuration. Also, a PMOS transistor 331 is connected to the PMOS transistor 329 in current mirror configuration.

Further, a reference current source BRG and an NMOS transistor 332 having a drain and a gate connected to each other are connected in series between the power supply node and the ground node. An NMOS transistor 333 is connected to the NMOS transistor 332 in current mirror configuration, and the NMOS transistor 333 has a drain connected to a drain of the PMOS transistor 331. Also, an amplifier circuit 334 is connected to a common connection node to which the drains of the PMOS transistor 331 and the NMOS transistor 333 are connected.

Here, a current from the reference current source BGR in the second LSI 322 is set equal to a current from the reference current source BGR in the first LSI 321, and the NMOS transistor 331 in the second LSI 322 is sized such that one half of a current from the NMOS transistor 333 flows thereinto.

According to the second LSI 322 configured as described above, the amplifier 334 normally receives a low potential input, but receives a high potential input when a current is output from the PMOS transistor 331 at the time the clock signal current is input to the second LSI 322, thereby making it possible to convert the clock signal current input to a clock signal voltage which is supplied to an internal circuit.

<Eighteenth Embodiment>

Figure 46:
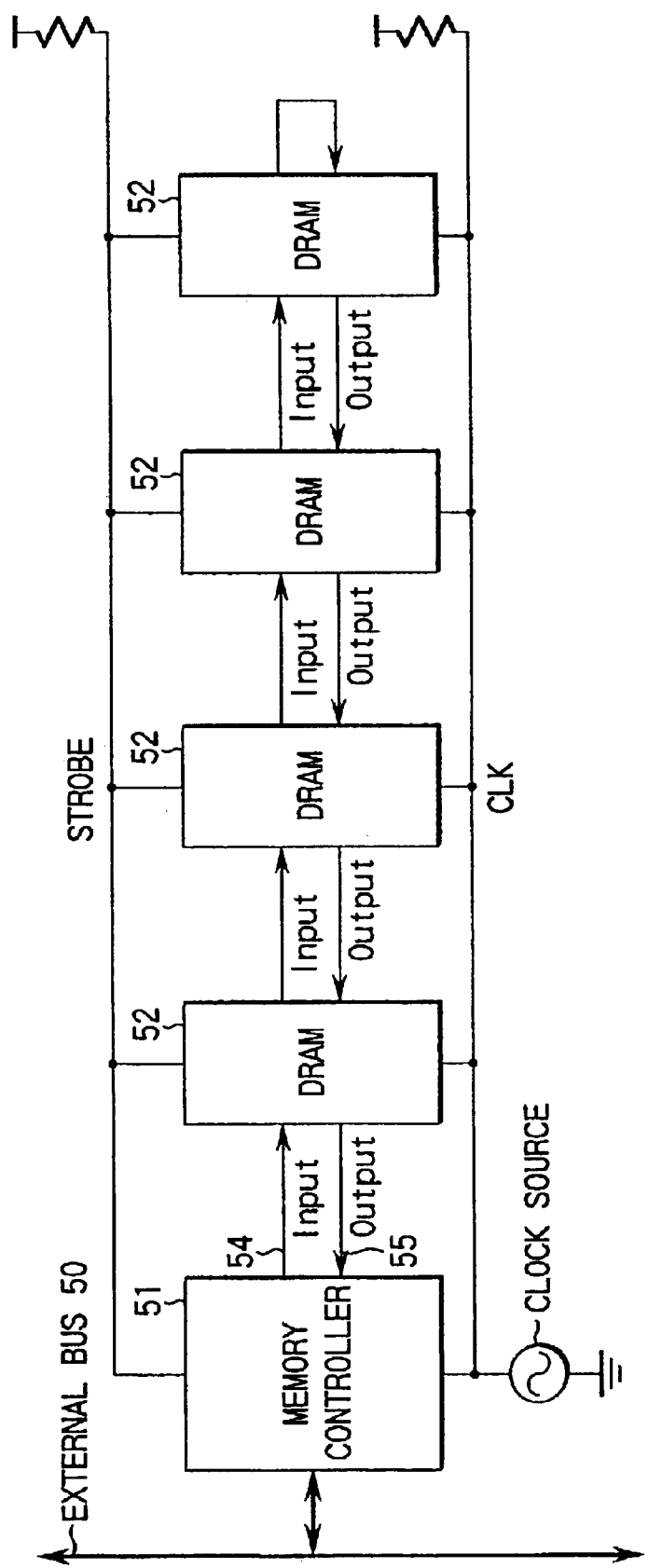
FIG. 46 is a block diagram illustrating a data transmission system according to an eighteenth embodiment of the present invention.

FIG. 46 is a block diagram illustrating a data transmission system according to an eighteenth embodiment.

This data transmission system differs from the data transmission system according to the fifth embodiment illustrated in FIG. 5 in that the strobe signal line is terminated as a bus wire, and the clock signal line is also terminated. The rest of the configuration is identical to the fifth embodiment.

<Nineteenth Embodiment>

Figure 47:
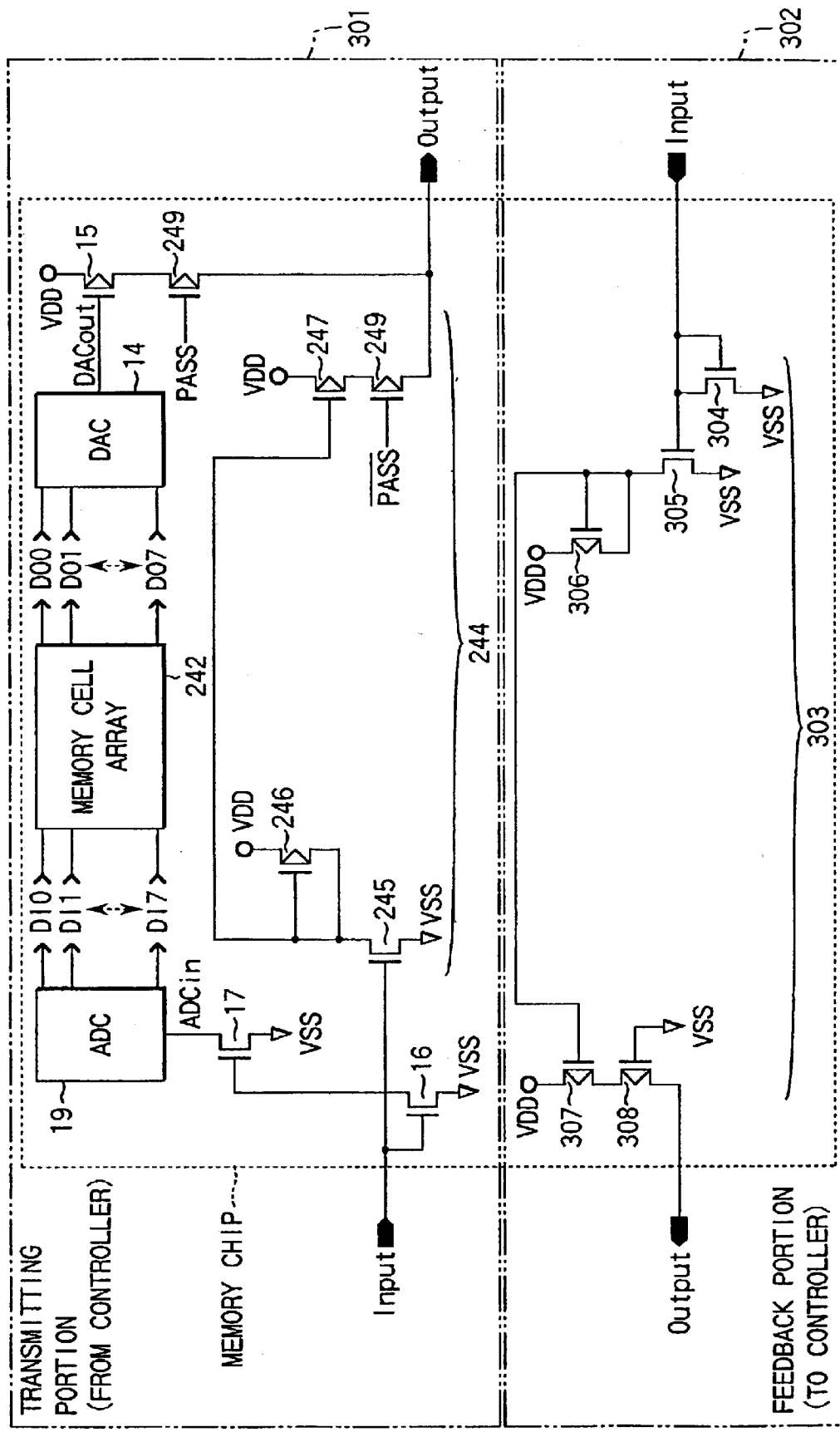
FIG. 47 is a circuit diagram schematically illustrating a memory LSI which is adapted to a daisy chain connected data transmission system according to a nineteenth embodiment.

FIG. 47 is a circuit diagram schematically illustrating a memory LSI adapted to a daisy chain connected data transmission system according to a nineteenth embodiment.

This embodiment differs from the memory LSI according to the thirteenth embodiment illustrated in FIG. 38 in that data input and data output are performed in a data transmitting portion 301 from a controller disposed in a memory chip. For this reason, a circuit similar to that illustrated in FIG. 38 is also disposed in the data transmitting portion 301.

A data feedback portion 302 to the controller comprises a current transfer circuit 303 having a similar circuit configuration to the current transfer circuit 244. The current transfer circuit 303 differs from the current transfer circuit 244 in that it transfers a data current at all times.

As illustrated in FIG. 47, the current transfer circuit 303 comprises a current input NMOS transistor 304; an NMOS transistor 305 connected to the NMOS transistor 304 in current mirror configuration; a PMOS transistor 306 having a gate and a drain connected to a path on which a current from the NMOS transistor 305 flows; a PMOS transistor 307 connected to the PMOS transistor 306 in current mirror configuration; and a PMOS transistor 308 connected between a drain of the PMOS transistor and a current output node for receiving an intra-circuit ground potential Vss at a gate. The PMOS transistor 308 being omitted and the PMOS transistor 307 being directly connected to the output is no problem.

<Twentieth Embodiment>

Figure 48:
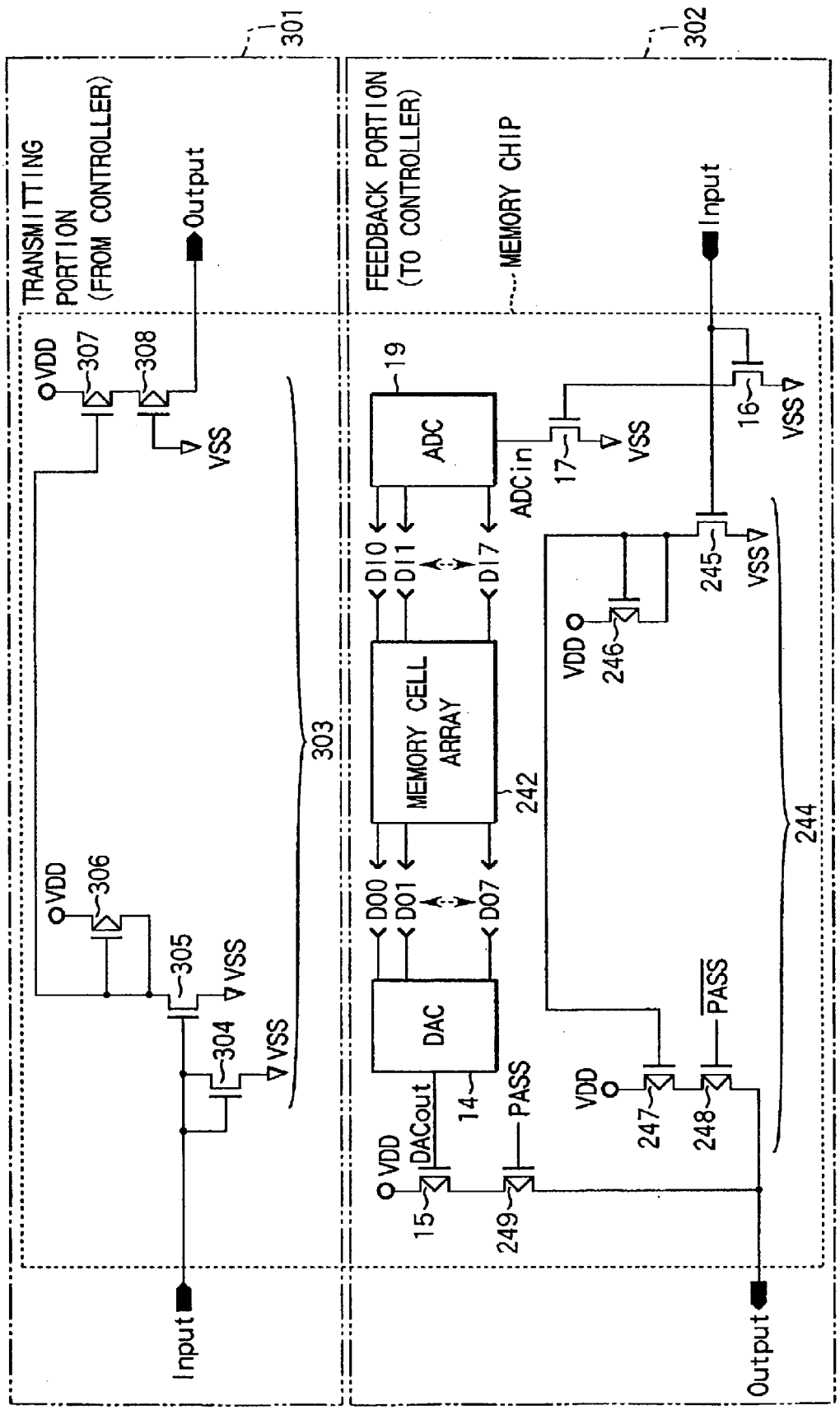
FIG. 48 is a circuit diagram schematically illustrating a memory LSI which is adapted to a daisy chain connected data transmission system according to a twentieth embodiment.

FIG. 48 is a circuit diagram schematically illustrating a memory LSI adapted to a daisy chain connected data transmission system according to a twentieth embodiment.

This embodiment differs from the memory LSI according to the nineteenth embodiment illustrated in FIG. 48 in that data input and data output are respectively performed in a data feedback portion 302 from a controller disposed in a memory chip. For this reason, a circuit similar to that illustrated in FIG. 38 is disposed in the data feedback portion 302. Then, a data transmitting portion 301 from the controller comprises a current transfer circuit 303 which transfers a data current at all times.

<Twenty First Embodiment>

Figure 49:
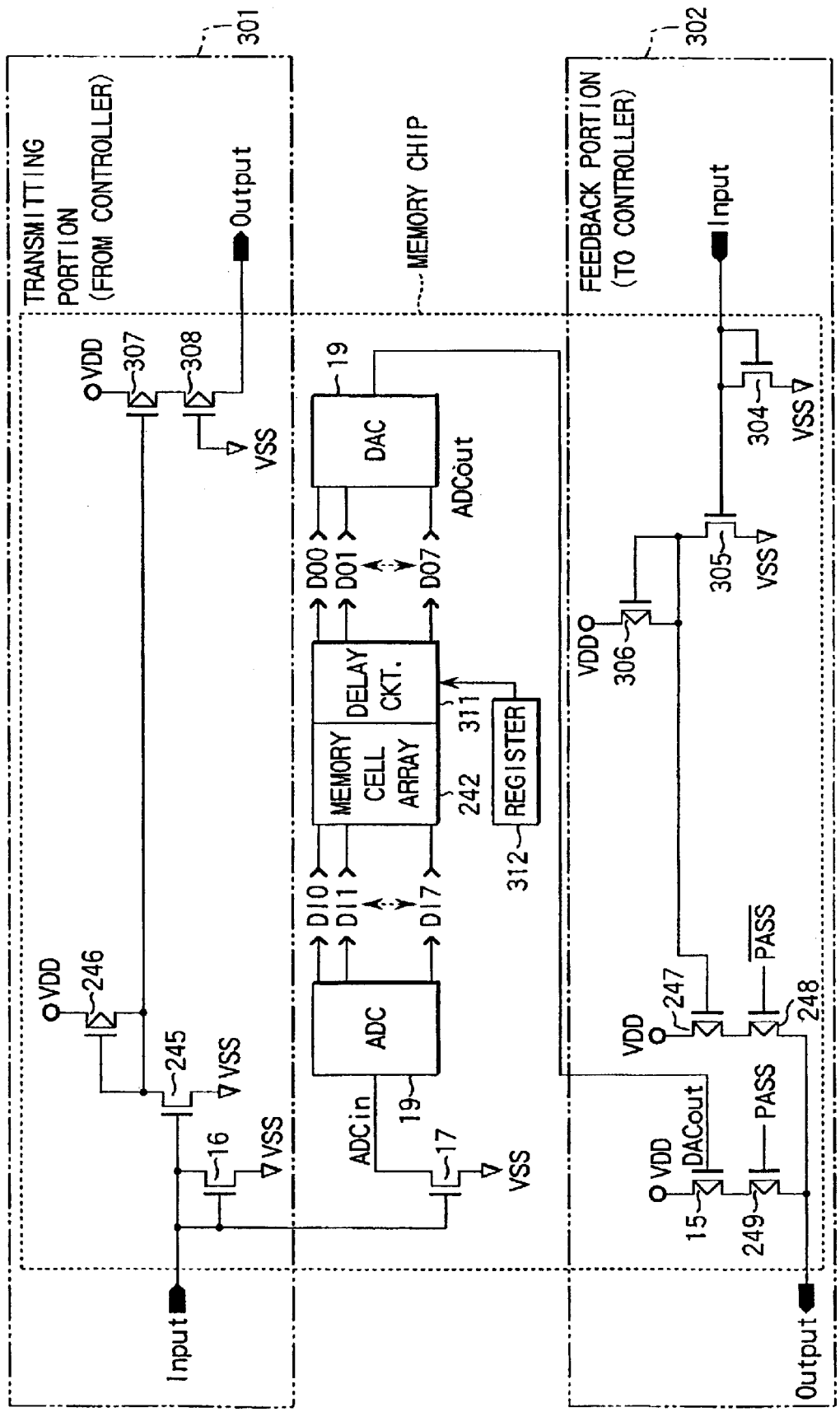
FIG. 49 is a circuit diagram schematically illustrating a memory LSI which is adapted to a daisy chain connected data transmission system according to a twenty first embodiment.

FIG. 49 is a circuit diagram schematically illustrating a memory LSI adapted to a daisy chain connected data transmission system according to a twenty first embodiment.

This embodiment differs from the memory LSI according to the nineteenth embodiment illustrated in FIG. 47 in that data input is performed in a data transmitting portion 301, while data output is performed in a data feedback portion 302. For this reason, PMOS transistors 307, 308 constituting an output stage of a current transfer circuit 303 are disposed in the data transmitting portion 301, while NMOS transistors 304, 305 and a PMOS transistor 306 constituting an input stage are disposed in the data feedback portion 302.

Also, when the data input is performed in the data transmitting portion 301 and the data output is performed in the data feedback portion 302, as is the case of this embodiment, it is important to adjust the timing of the data output. This is because a latency viewed from the controller is set in each of a plurality of daisy chain connected memory chips. For this reason, in this embodiment, a delay circuit 311 is disposed in an output portion of a memory cell array 242. The delay circuit 311 is controlled, for example, by delay data stored in a register 312. Then, a data output from the memory cell array is delayed such that the latency viewed from the controller is identical at each of the plurality of daisy chain connected memory chips. The delay data are stored by initialization of the daisy chain with chip-ID setting. The nearest memory is set to the largest latency. The data set method is same as chip-ID. The unit delay time accordance with delay data is designed to match the latency viewed from the <Twenty Second Embodiment>

Figure 50:
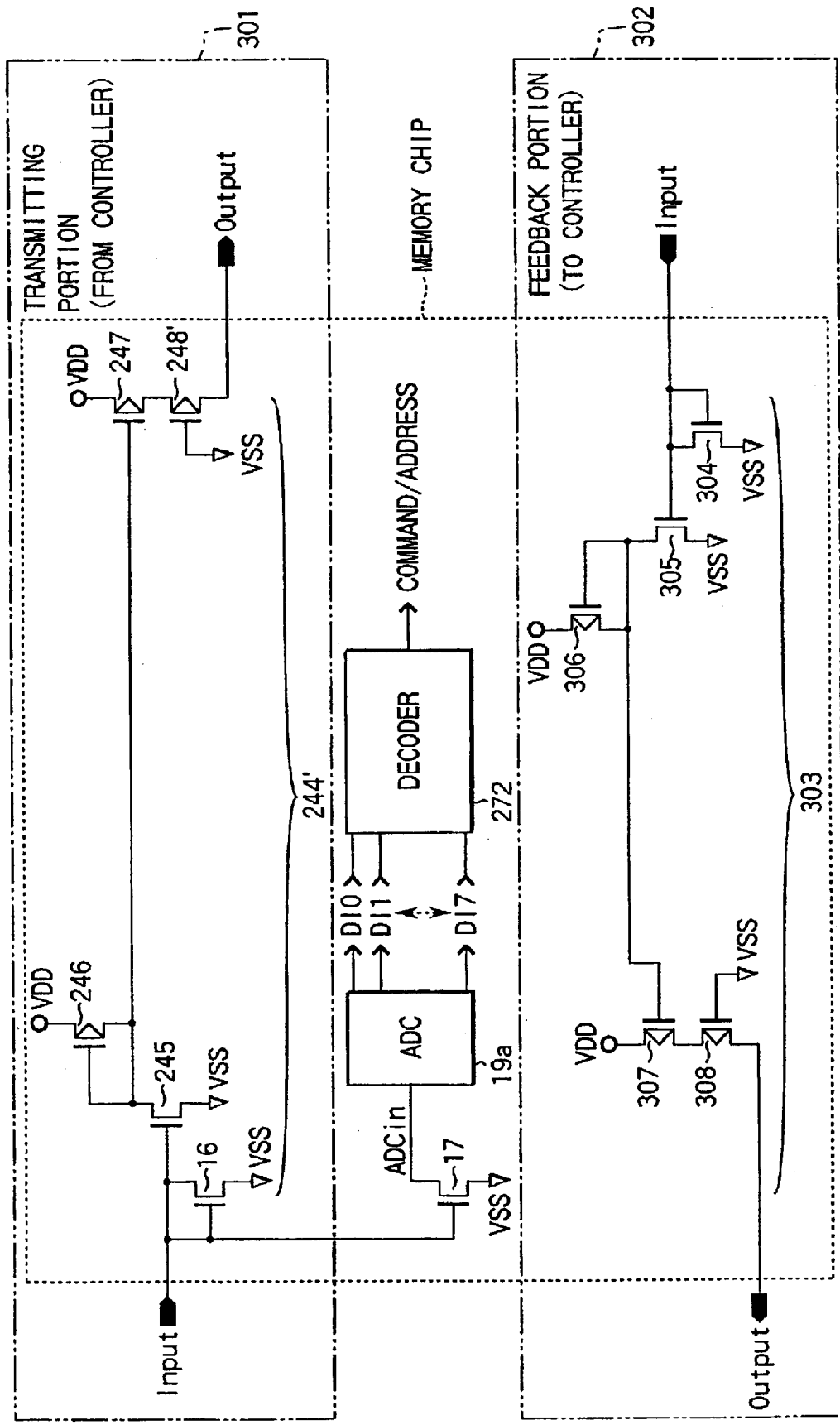
FIG. 50 is a circuit diagram schematically illustrating a memory LSI which is adapted to a daisy chain connected data transmission system according to a twenty second embodiment.

FIG. 50 is a circuit diagram schematically illustrating a memory LSI adapted to a daisy chain connected data transmission system according to a twenty second embodiment.

While the nineteenth, twentieth and twenty first embodiments have shown a portion of the data path, this embodiment illustrates a portion of an address/command path.

The twenty second embodiment differs from the nineteenth embodiment illustrated in FIG. 47 in that the former comprises an ADC 19a for AD converting an address signal and a command signal, and a decoder 272 for decoding voltage data output from the ADC 19a to output the address signal and the command signal.

Also, a current transfer circuit 244' is configured to transfer a current at all times by supplying an intra-circuit ground potential VSS to a gate of a PMOS transistor 248' which forms part of an output stage of the memory LSI.

<Twenty Third Embodiment>

Figure 51:
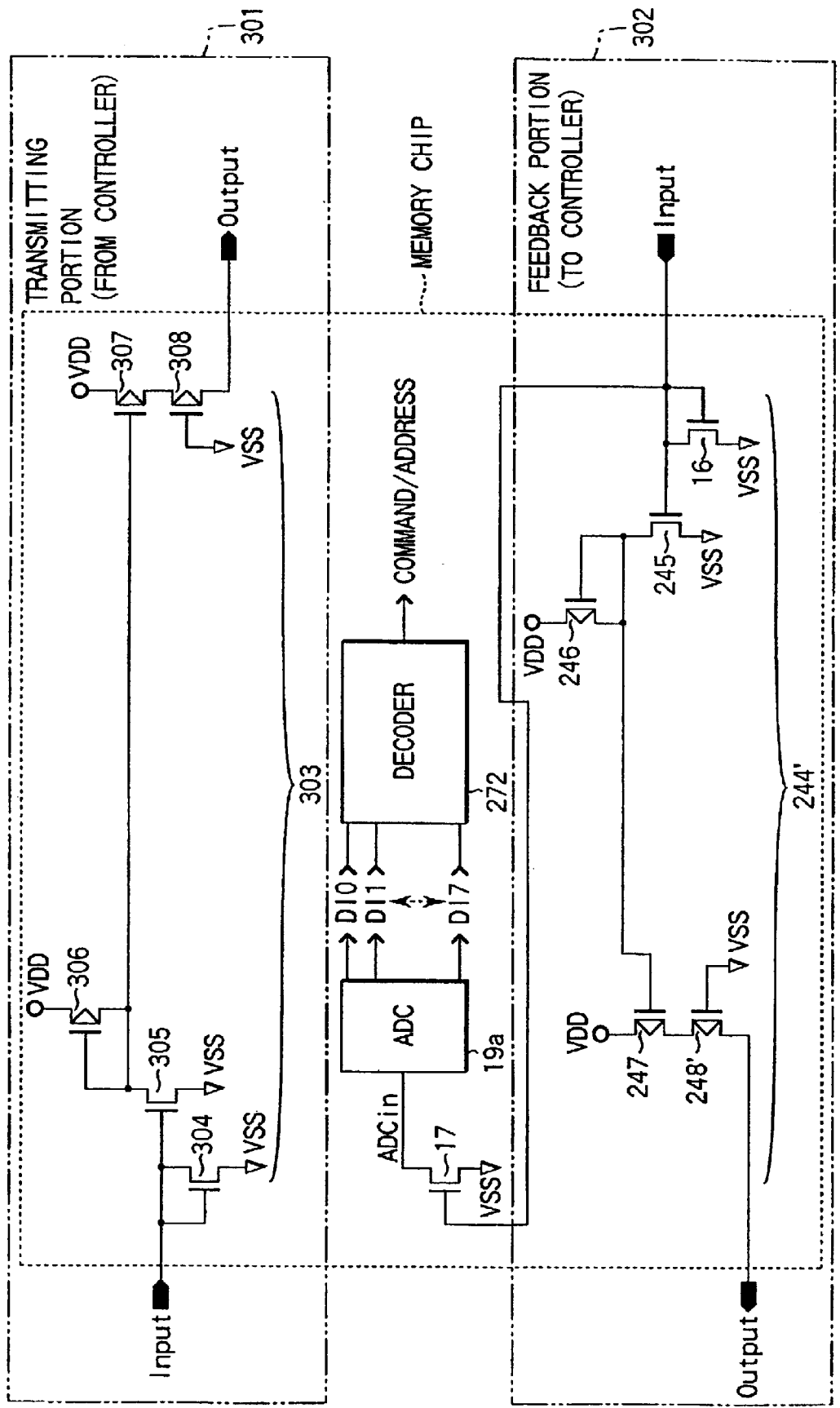
FIG. 51 is a circuit diagram schematically illustrating a memory LSI which is adapted to a daisy chain connected data transmission system according to a twenty third embodiment.

FIG. 51 is a circuit diagram schematically illustrating a memory LSI adapted to a daisy chain connected data transmission system according to a twenty third embodiment.

This embodiment differs from the memory LSI according to the twenty second embodiment illustrated in FIG. 50 in that data input and data output are respectively performed in a data feedback portion 302 from a controller disposed in a memory chip. For this reason, a circuit similar to the circuit disposed in the data transmitting portion 301 in FIG. 50 is also disposed in the data feedback portion 302. Then, the data transmitting portion 301 from the controller comprises a current transfer circuit 303 which transfers a data current at all times.

<Twenty Fourth Embodiment>

Figure 52:
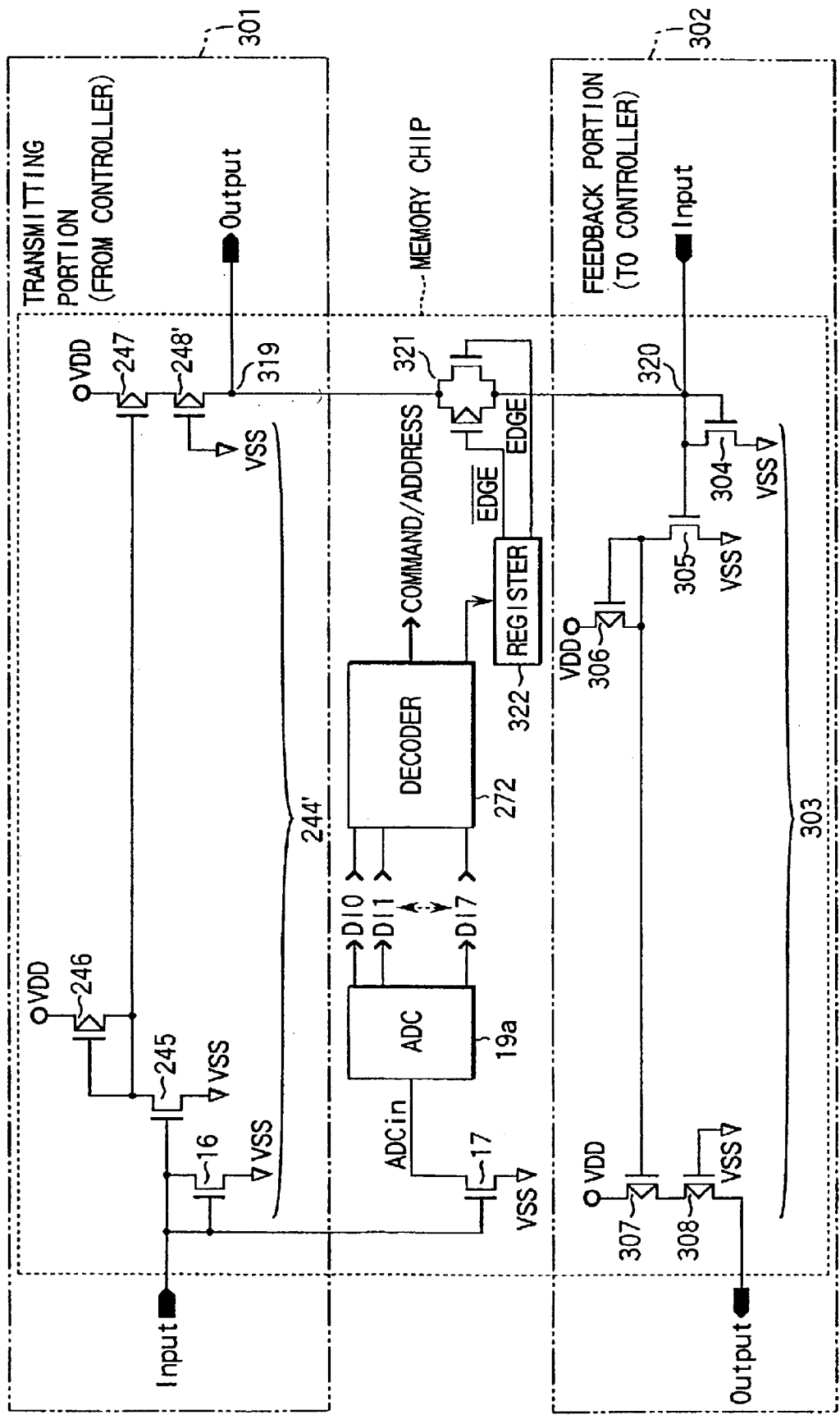
FIG. 52 is a circuit diagram schematically illustrating a memory LSI which is adapted to a daisy chain connected data transmission system according to a twenty fourth embodiment.

FIG. 52 is a circuit diagram schematically illustrating a memory LSI adapted to a daisy chain connected data transmission system according to a twenty fourth embodiment.

This embodiment differs from the memory LSI according to the twenty second embodiment illustrated in FIG. 50 in that a current output node 319 and a current input node 320 are interconnected through a transfer gate circuit 321. The transfer gate circuit 321 is controlled by control signals EDGE, /EDGE output from a register 322. The current output node 319 is connected to the current input node 320 when the control signal EDGE is at "HIGH" and the control signal /EDGE is at "LOW." This enables a current output to be folded back from the data transmitting portion 301 to the data feedback portion 302 within a memory chip. Conversely, the current output node 319 is disconnected from the current input node 320 when the control signal EDGE is at "LOW" and the control signal /EDGE is at "HIGH." The EDGE signal state is set by initialization of the daisy chain.

This embodiment is effective when the terminal of the daisy chain is closed, for example, as is the case in the eighteenth embodiment illustrated in FIG. 46. By using this embodiment, the external connection of input and output of the edge chip is not needed.

<Twenty Fifth Embodiment>

Figure 53:
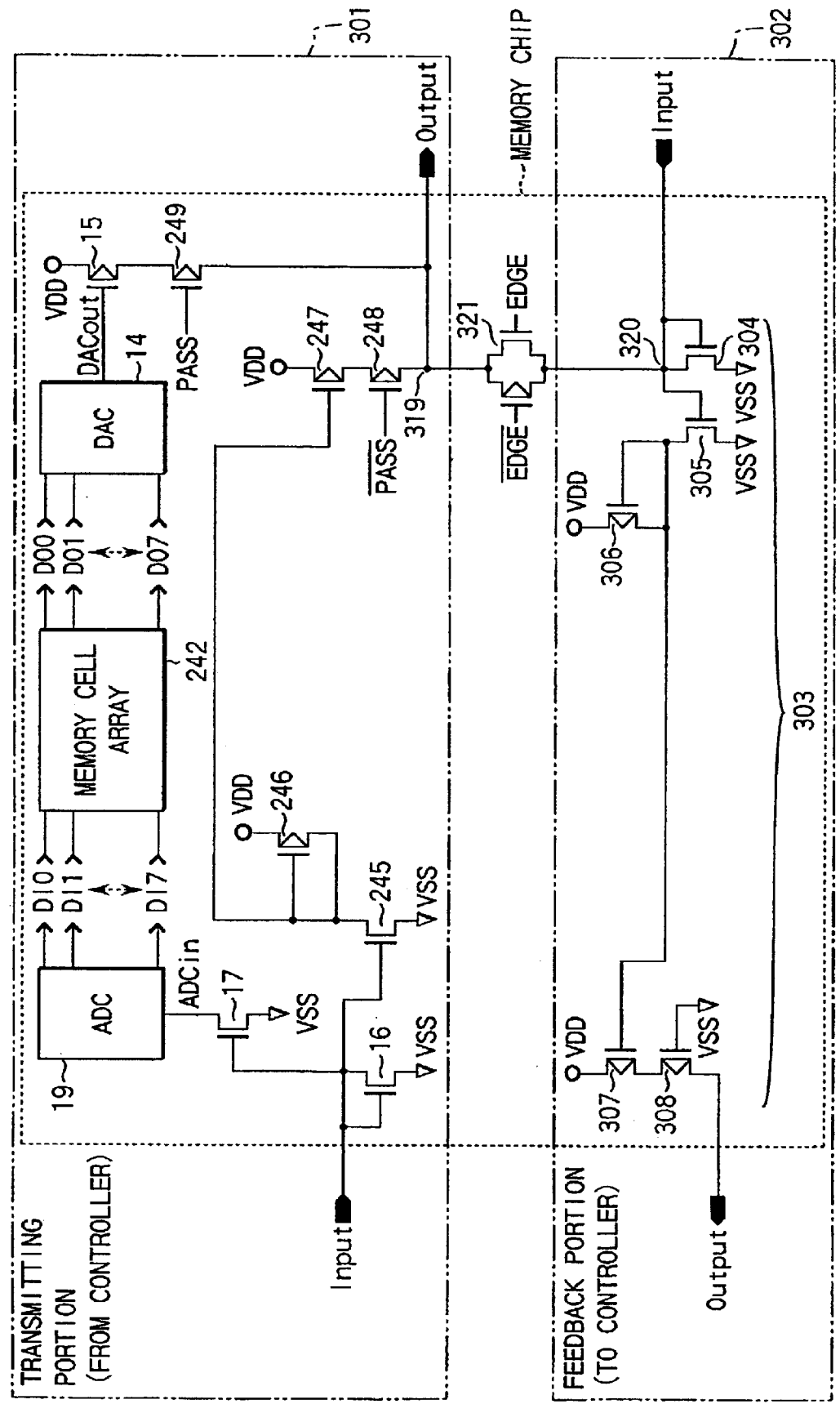
FIG. 53 is a circuit diagram schematically illustrating a memory LSI which is adapted to a daisy chain connected data transmission system according to a twenty fifth embodiment.

FIG. 53 is a circuit diagram schematically illustrating a memory LSI adapted to a daisy chain connected data transmission system according to a twenty fifth embodiment.

This embodiment differs from the memory LSI according to the nineteenth embodiment illustrated in FIG. 47 in that a current output node 319 and a current input node 320 are interconnected through a transfer gate circuit 321, in a manner similar to the twenty fourth embodiment.

Likewise, in this embodiment, the current output node 319 is connected to the current input node 320 when a control signal EDGE is at "HIGH" and a control signal /EDGE is at "LOW" so that a current output can be folded back from a data transmitting portion 301 to a data feedback portion 302 within a memory chip. This embodiment, therefore, is effective when the terminal of the daisy chain is closed, as is the case in the eighteenth embodiment illustrated in FIG. 46.

<Twenty Sixth Embodiment>

Figure 54:
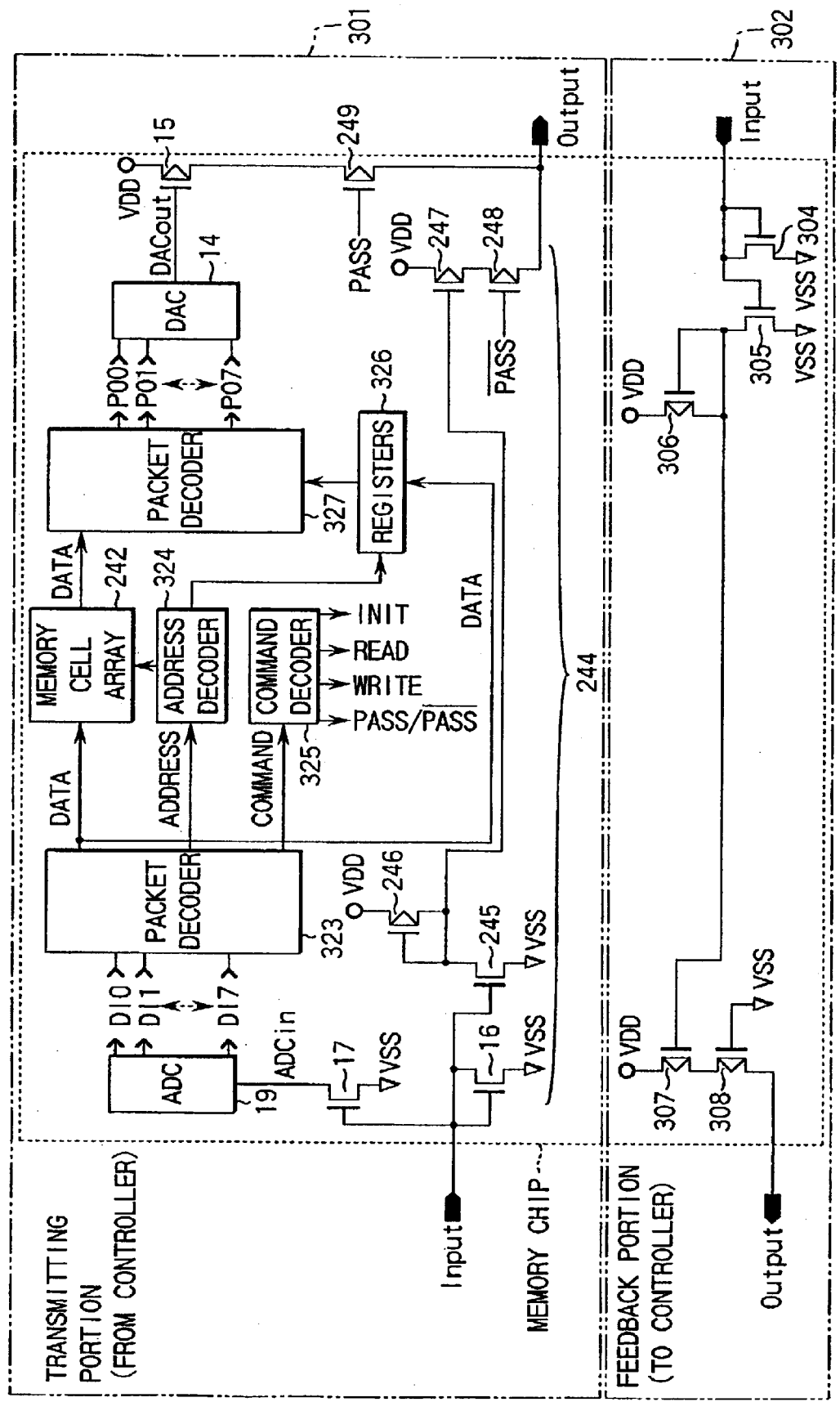
FIG. 54 is a circuit diagram schematically illustrating a memory LSI which is adapted to a daisy chain connected data transmission system according to a twenty sixth embodiment.

FIG. 54 is a circuit diagram schematically illustrating a memory LSI adapted to a daisy chain connected data transmission system according to a twenty sixth embodiment.

The foregoing embodiments have been described for an example in which data is transmitted/received, and for an example in which an address and a command are transmitted/received, respectively.

However, it is also possible to transmit/receive a packet which groups data, an address and a command into one set. This embodiment relates to an example which is adapted to such packet transmission/reception.

This embodiment differs from the memory LSI according to the nineteenth embodiment illustrated in FIG. 47 in that the former comprises a packet decoder 323, an address decoder 324, a command decoder 325, a register 326 and a packet encoder 327.

The packet decoder 323 decodes an input packet to classify it into data, an address, and a command. The classified data is input to a memory cell array 242, and the classified address and commands are likewise input to the address decoder 324 and the command decoder 325, respectively.

The address decoder 324 decodes an input address, and outputs the decoded address to the memory cell array 242 and the register 326.

The command decoder 325 decodes an input command, and outputs internal control signals (PASS,/PASS, WRITE, READ, INIT) based on the decoded command.

The register 326 stores a chip-ID. The chip-ID is an ID address registered in a controller and each chip to identify a plurality of memory chips which are daisy chain connected to the controller. While the foregoing embodiments omit detailed description on the chip-ID, it goes without saying that the chip-ID is registered in the respective embodiments. In the following, description will be made on an example of how the chip-ID is allocated.

First, the chip-ID of the controller is set to "0000" and registered in the controller. The controller transmits the chip-ID "0000" to the first chip memory in the daisy chain connection. The chip memory, which receives the chip-ID "0000," adds "1" to this chip-ID to generate "0001" which is registered as its own chip-ID. The memory chip, which has been registered with the chip-ID "0001," transmits the chip-ID "0001" to the next memory chip in the daisy chain connection. The memory chip, which receives the chip-ID "0001," adds "1" to this chip-ID to generate "0010" which is registered as its own chip-ID. Such processing is sequentially performed for all of the daisy chain connected memory chips, so that the controller and the respective memory chips can be registered with the chip-IDs different from one another. The registered chip-ID is transmitted as included in an address or a command upon processing of data. Then, the data processing is performed in a memory chip which has the chip-ID coincident with the transmitted chip-ID.

The register 326 stores such chip-ID. When a transmitted chip-ID is coincident with a chip-ID stored in the register 326, the register 326 outputs the chip-ID indicative of the controller, and a code indicative of a data output to the controller, respectively. This is because data output from a certain memory chip is not received by other memory chips in the daisy chain connection.

The packet encoder 327 encodes data output from the memory cell array 242, the chip-ID indicative of the controller output from the register 326, and the code indicative of data output to the controller to form them into a packet. The packet is input to a DAC 14 and output after it is DA converted by the DAC 14, in a manner similar to the foregoing embodiments.

<Twenty Seventh Embodiment>

Figure 55:
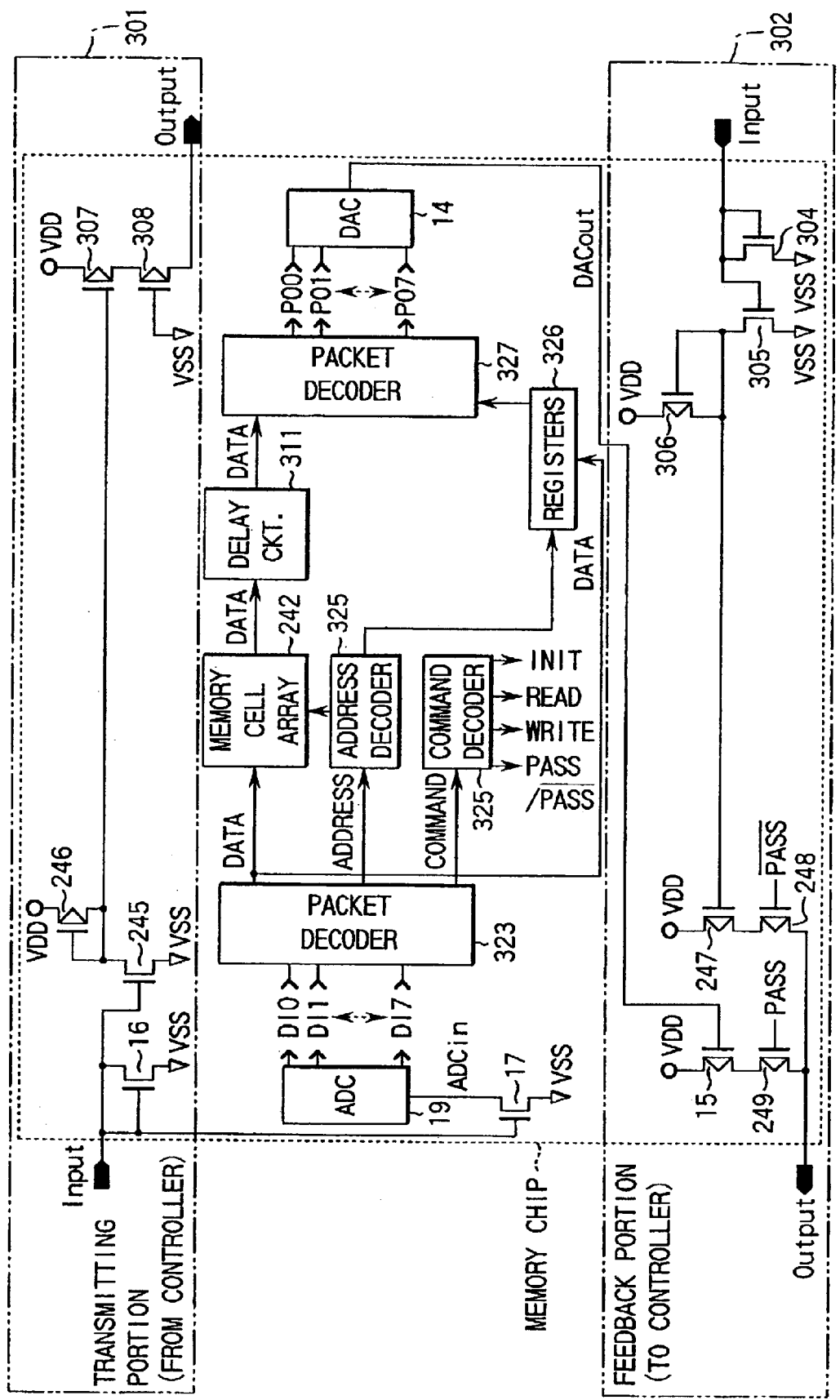
FIG. 55 is a circuit diagram schematically illustrating a memory LSI which is adapted to a daisy chain connected data transmission system according to a twenty seventh embodiment.
Figure 56:
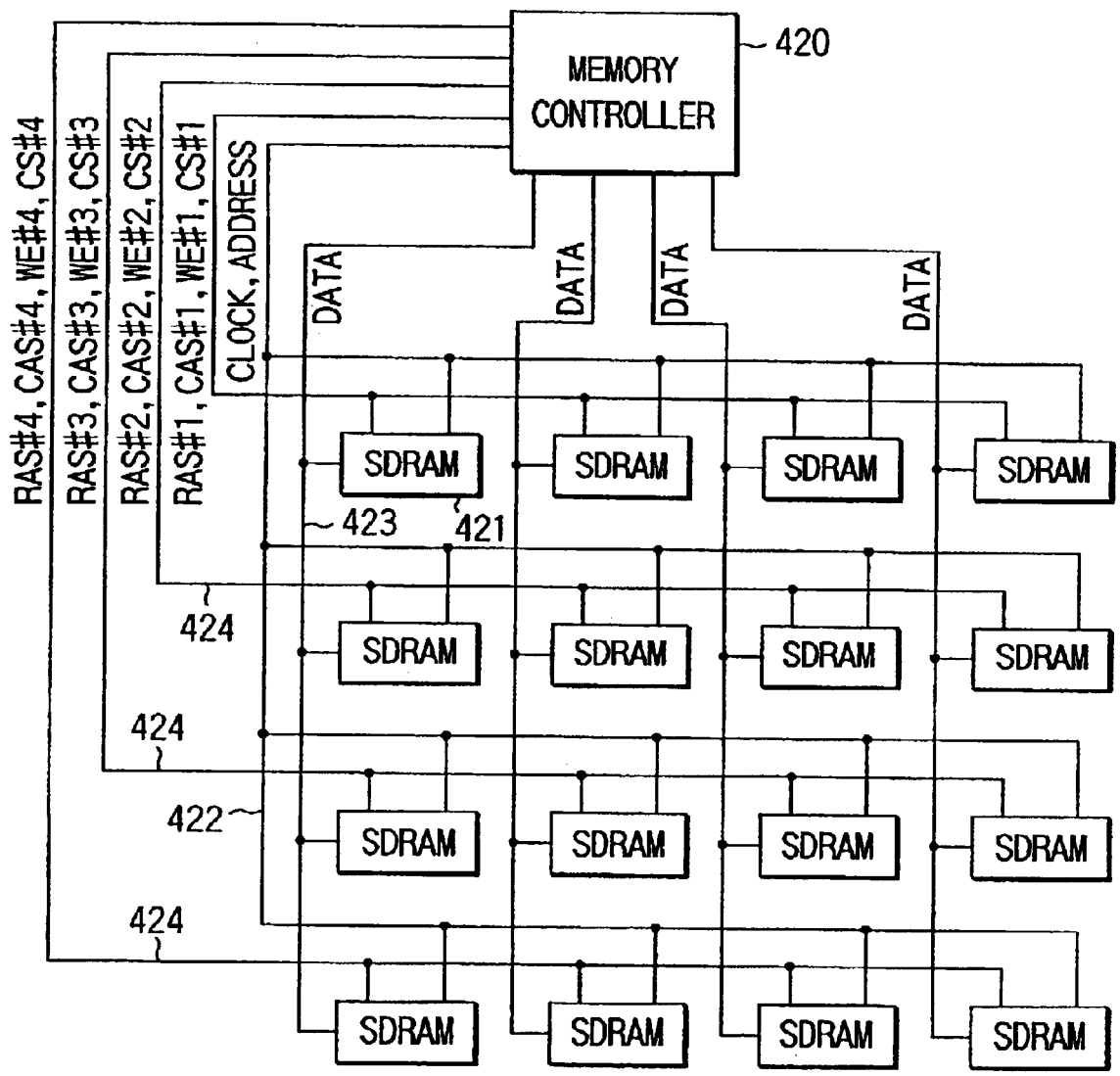
FIG. 56 is a block diagram illustrating an example of a conventional data transmission system.
Figure 57:
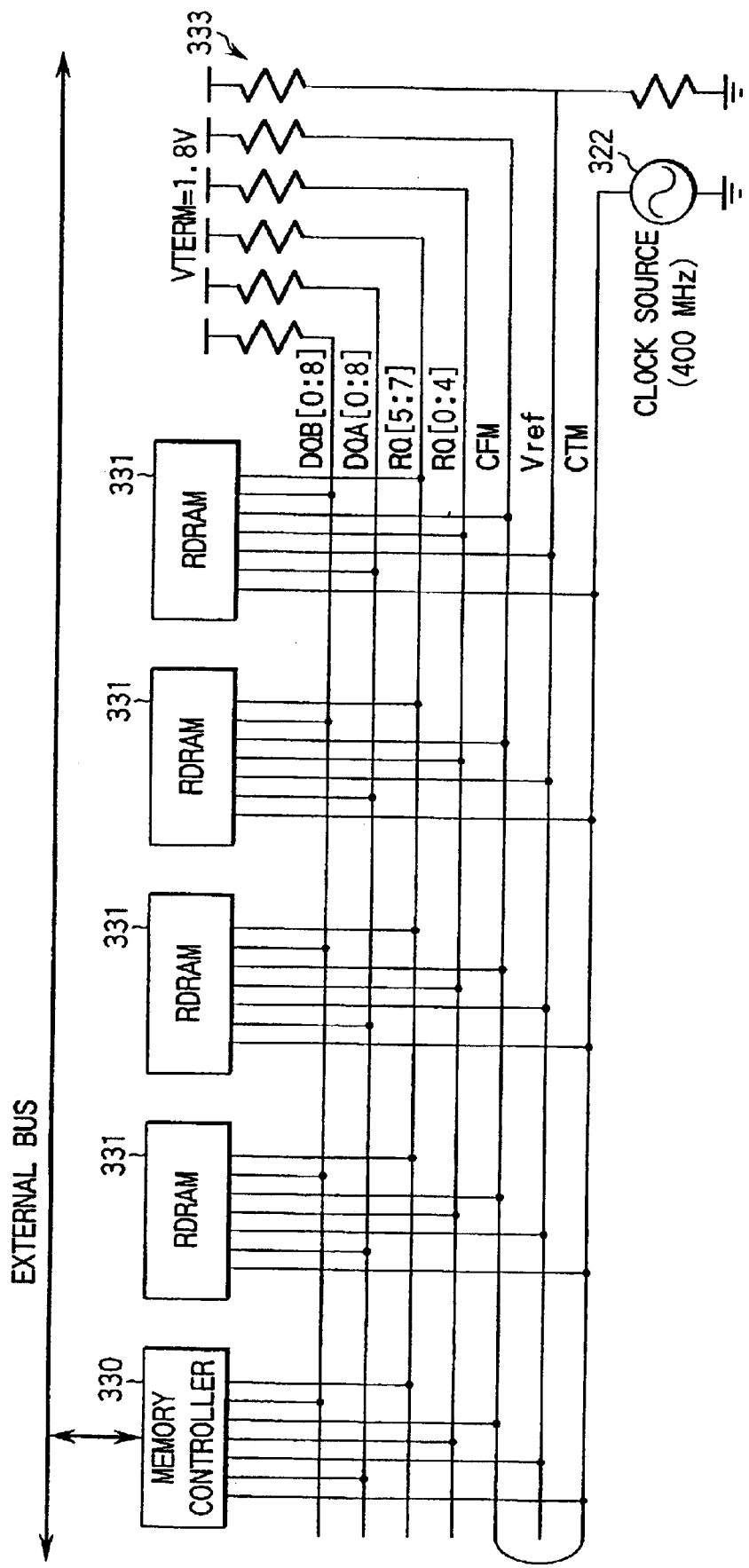
FIG. 57 is a block diagram illustrating another example of conventional data transmission system.

FIG. 55 is a circuit diagram schematically illustrating a memory LSI adapted to a daisy chain connected data transmission system according to a twenty seventh embodiment.

This embodiment differs from the twenty sixth embodiment illustrated in FIG. 54 in that data input is performed in a data transmitting portion 301, and data output is performed in a data feedback portion 302, as is the case of the twenty first embodiment. The rest of the configuration is substantially similar to the twenty sixth embodiment.

While the present invention has been described above in connection with the first to twenty seventh embodiments, the present invention is not limited to the respective embodiments, but may be modified in various ways when it is practiced without departing from the spirit and scope of the invention.

Also, it is of course possible to implement the first to the twenty seventh embodiments independently or in combination as appropriate.

Further, since the first to the twenty seventh embodiments include inventions at a variety of stages, it is possible to extract the inventions at a variety of stages by appropriately combining a plurality of components disclosed in the respective embodiments.

As described above, the data transmission system and the semiconductor integrated circuit device according to the present invention handle transmission data as a current amount rather than a voltage potential. Also, the conversion of current data to multi-valued data enables multi-value data to be transmitted without requiring an increase in the number of the data lines and the signal lines even in a current transfer performed between the transmission side and the reception side in a one-to-one correspondence.

When such current data is represented in a multi-valued form, the multi-valued current is advantageous over a multi-valued voltage in that a voltage noise margin is wider, due to the additive nature of the current. It is therefore possible to readily accommodate a reduction in a power supply voltage and an amplitude voltage on an external signal line resulting from the miniaturization of elements in LSIs. Also, even when a low speed synchronization clock is transmitted, the multi-valued current enables transmission/reception of a large amount of data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data transmission system comprising:
   a clock source;
   a plurality of semiconductor integrated circuit devices;
   a controller configured to control said plurality of semiconductor integrated circuit devices;
   a clock signal pass connected to said clock source, said controller and said plurality of semiconductor integrated circuit devices;
   a daisy chain data pass connected to said controller and said plurality of semiconductor integrated circuit devices; and
   a two-way data strobe signal pass connected to said controller and said plurality of semiconductor integrated circuit devices, wherein
      said clock source, said plurality of semiconductor integrated circuit devices and said controller transmit and receive therebetween a clock signal via said clock signal pass,
      said plurality of semiconductor integrated circuit devices and said controller transmit and receive therebetween multi-valued current data via said daisy chain data pass, and
      said plurality of semiconductor integrated circuit devices and said controller transmit and receive therebetween a data strobe signal in the form of a binary voltage signal via said two-way data strobe signal pass.

2. The data transmission system according to claim 1, wherein
   said controller includes an output terminal for data transmission and an input terminal for data feedback, and
   said plurality of semiconductor integrated circuit devices each include input and output terminals for said data transmission and input and output terminals for said data feedback.

3. The data transmission system according to claim 2, wherein said plurality of semiconductor integrated circuit devices each decode said multi-valued current data inputted to said input terminal for said data transmission.

4. The data transmission system according to claim 2, wherein said plurality of semiconductor integrated circuit devices each decode said multi-valued current data inputted to said input terminal for said data feedback.

5. A data transmission system comprising:
   a clock source;
   a plurality of semiconductor integrated circuit devices,
   a controller which controls said plurality of semiconductor integrated circuit devices,
   a clock signal pass connected to said clock source, said controller and said plurality of semiconductor integrated circuit devices,
   a daisy chain data pass connected to said controller and said plurality of semiconductor integrated circuit devices; and
   a daisy chain data strobe signal pass connected to said controller and said plurality of semiconductor integrated circuit devices, wherein
      said clock source, said plurality of semiconductor integrated circuit devices and said controller transmit and receive therebetween a clock signal via said clock signal pass,
      said plurality of semiconductor integrated circuit devices and said controller transmit and receive therebetween multi-valued current data via said daisy chain data pass, and
      said plurality of semiconductor integrated circuit devices and said controller transmit and receive therebetween a data strobe signal in the form of a binary voltage signal via said data strobe signal pass.

6. The data transmission system according to claim 5, wherein
   said controller includes output terminals for data transmission and data strobe signal transmission and input terminals for data feedback and data strobe signal feedback, and
   said plurality of semiconductor integrated circuit devices each include input and output terminals for said data transmission and said data strobe signal transmission and input and output terminals for said data feedback and said data strobe signal feedback.

7. The data transmission system according to claim 6, wherein said plurality of semiconductor integrated circuit devices each decode said data multi-valued current data inputted to said input terminal for said data transmission.

8. The data transmission system according to claim 6, wherein said plurality of semiconductor integrated circuit devices each decode said multi-valued current data inputted to said input terminal for said data feedback.

9. A data transmission system comprising:
   a clock source;
   a plurality of semiconductor integrated circuit devices;
   a controller which controls said plurality of semiconductor integrated circuit devices;
   a clock signal pass connected to said clock source, said controller and said plurality of semiconductor integrated circuit devices;
   a two-way data pass connected to said controller and said plurality of semiconductor integrated circuit devices; and
   a daisy chain data strobe signal pass connected to said controller and said plurality of semiconductor integrated circuit devices, wherein
      said clock source, said plurality of semiconductor integrated circuit devices and said controller transmit and receive therebetween a clock signal via said clock signal pass,
      said plurality of semiconductor integrated circuit devices and said controller transmit and receive therebetween multi-valued current data via said two-way data pass, and
      said plurality of semiconductor integrated circuit devices and said controller transmit and receive therebetween a data strobe signal in the form of a binary voltage signal via said data strobe signal pass.

10. The data transmission system according to claim 9, wherein
said controller includes output terminals for data strobe signal transmission and input terminals for data strobe signal feedback, and
said plurality of semiconductor integrated circuit devices each include input and output terminals for said data strobe signal transmission and input and output terminals for said data strobe signal feedback.

11. A data transmission system comprising:
a plurality of semiconductor integrated circuit devices;
a controller which controls said plurality of semiconductor integrated circuit devices;
a daisy chain pass connected to said controller and said plurality of semiconductor integrated circuit devices, said daisy chain pass including a transmission portion and a feedback portion, wherein
said controller includes an output terminal coupled to said transmission portion of said daisy chain pass and an input terminal coupled to said feedback portion of said daisy chain pass, and
said plurality of semiconductor integrated circuit devices each include input and output terminals coupled to said transmission portion of said daisy chain pass and input and output terminals coupled to said feedback portion of said daisy chain pass.

12. The data transmission system according to claim 11, wherein said plurality of semiconductor integrated circuit devices and said controller transmit and receive therebetween data via said daisy chain pass.

13. The data transmission system according to claim 12, wherein said plurality of semiconductor integrated circuit devices each decode said data inputted to said input terminal coupled to said transmission portion of said daisy chain pass.

14. The data transmission system according to claim 12, wherein said plurality of semiconductor integrated circuit devices each decode said data inputted to said input terminal coupled to said feedback portion of said daisy chain pass.

15. The data transmission system according to claim 12, wherein said data include multi-valued current data.

* * * * *